United States Patent
Fouliard et al.

(10) Patent No.: US 11,718,917 B2
(45) Date of Patent: Aug. 8, 2023

(54) PHOSPHOR THERMOMETRY DEVICE FOR SYNCHRONIZED ACQUISITION OF LUMINESCENCE LIFETIME DECAY AND INTENSITY ON THERMAL BARRIER COATINGS

(71) Applicant: UNIVERSITY OF CENTRAL FLORIDA RESEARCH FOUNDATION, INC., Orlando, FL (US)

(72) Inventors: Quentin Fouliard, Winter Park, FL (US); Ranajay Ghosh, Oviedo, FL (US); Seetha Raghavan, Oviedo, FL (US)

(73) Assignee: University of Central Florida Research Foundation, Inc., Orlando, FL (US)

(*) Notice: Subject to any disclaimer, the term of this patent is extended or adjusted under 35 U.S.C. 154(b) by 212 days.

(21) Appl. No.: 17/034,098

(22) Filed: Sep. 28, 2020

(65) Prior Publication Data
US 2023/0175139 A1  Jun. 8, 2023

Related U.S. Application Data

(60) Provisional application No. 62/944,390, filed on Dec. 6, 2019, provisional application No. 62/940,963, filed on Nov. 27, 2019.

(51) Int. Cl.
 *C23C 28/04* (2006.01)
 *C04B 41/90* (2006.01)
 (Continued)

(52) U.S. Cl.
 CPC .......... *C23C 28/042* (2013.01); *C04B 41/90* (2013.01); *C23C 4/02* (2013.01); *C23C 4/11* (2016.01);
 (Continued)

(58) Field of Classification Search
 USPC ................................................ 374/161, 120
 See application file for complete search history.

(56) References Cited

U.S. PATENT DOCUMENTS

4,708,494 A * 11/1987 Kleinerman .............. G01J 1/58
                                                         374/161
4,729,668 A *  3/1988 Angel ................ G01K 11/3213
                                                         374/161
(Continued)

FOREIGN PATENT DOCUMENTS

EP         1818424 A1     8/2007

OTHER PUBLICATIONS

Allison et al., "Remote Thermometry With Thermographic Phosphors: Instrumentation and Applications," Review of Scientific Instruments; vol. 68; No. 7; Jul. 1997; pp. 2615-2650.
(Continued)

*Primary Examiner* — Mirellys Jagan
(74) *Attorney, Agent, or Firm* — Allen, Dyer, Doppelt + Gilchrist, P.A.

(57) ABSTRACT

A phosphor thermometry device includes a laser that generates a laser pulse onto a thermal barrier coating (TBC) applied onto a substrate. A metallic bond coat layer is on the substrate. A ceramic top coat layer is on the bond coat layer and includes an undoped layer and a doped sensing layer having co-doped first and second rare-earth luminescent dopants that emit respective first and second different emission wavelengths upon excitation by the laser pulse. A detector receives reflected, convoluted luminescence signals from the TBC. First and second photomultiplier devices detect respective first and second different emission wavelengths of the convoluted luminescence signals. A controller receives and processes signals generated from respective first and second photomultiplier devices and determines luminescence lifetime decay and intensity variations for each of the respective first and second rare-earth luminescent dopants for temperature monitoring of the TBC.

20 Claims, 46 Drawing Sheets

(51) Int. Cl.

| | |
|---|---|
| *C23C 28/00* | (2006.01) |
| *F01D 5/28* | (2006.01) |
| *C23C 4/02* | (2006.01) |
| *G01K 11/20* | (2006.01) |
| *C23C 4/11* | (2016.01) |
| *C23C 14/08* | (2006.01) |
| *C23C 30/00* | (2006.01) |
| *G01K 13/00* | (2021.01) |

(52) U.S. Cl.
CPC ........ *C23C 14/083* (2013.01); *C23C 28/3455* (2013.01); *C23C 30/00* (2013.01); *F01D 5/288* (2013.01); *G01K 11/20* (2013.01); *G01K 13/00* (2013.01); *F05D 2300/611* (2013.01)

(56) References Cited

U.S. PATENT DOCUMENTS

| | | | |
|---|---|---|---|
| 6,072,568 | A | 6/2000 | Paton et al. |
| 6,123,455 | A * | 9/2000 | Beshears ............... G01K 11/20 374/161 |
| 6,943,357 | B2 | 9/2005 | Srivastava et al. |
| 8,039,117 | B2 | 10/2011 | Kulkarni et al. |
| 8,043,717 | B2 | 10/2011 | Kulkarni et al. |
| 8,173,266 | B2 | 5/2012 | Choy et al. |
| 9,045,830 | B2 | 6/2015 | Feist et al. |
| 9,212,947 | B2 | 12/2015 | Feist et al. |
| 2003/0128737 | A1* | 7/2003 | McGrath ............ G01K 11/3213 374/161 |
| 2005/0238893 | A1 | 10/2005 | Quadakkers et al. |
| 2006/0159939 | A1* | 7/2006 | Lampenscherf ....... G01K 11/20 428/472 |
| 2008/0136324 | A1 | 6/2008 | Bast et al. |
| 2009/0075101 | A1 | 3/2009 | Kulkarni et al. |
| 2009/0226326 | A1 | 9/2009 | Choy et al. |
| 2010/0086790 | A1 | 4/2010 | Schumann et al. |
| 2018/0274988 | A1* | 9/2018 | Sabri ...................... G01K 11/20 |
| 2021/0180191 | A1* | 6/2021 | Fouliard ............. C23C 28/3455 |

OTHER PUBLICATIONS

Bacos et al., "Performance and Degradation Mechanisms of Thermal Barrier Coatings for Turbine Blades: A Review of Onera Activities," The Onera Journal, Aerospace Lab; Issue 3; Nov. 2011; pp. 1-11.
Bekale et al., "Impurity Diffusion of Cerium and Gadolinium in Single- and Polycrystalline Yttria-Stabilized Zirconia," Philosophical Magazine & Philosophical Magazine Letters; Sep. 21, 2007; 88(01); pp. 1-19; (31 pages).
Brubach et al., "On Surface Temperature Measurements with Thermographic Phosphors: A Review," Progress in Energy and Combustion Science; 39(1):37-60; Feb. 2013; Abstract Only.
Chambers et al., "Doped Oxides for High-Temperature Luminescence and Lifetime Thermometry," Annual Review of Materials Research; May 27, 2009; 39:325-359.
Chambers et al., "Terbium as an Alternative for Luminescence Sensing of Temperature of Thermal Barrier Coating Materials," Surface and Coatings Technology; vol. 202; Issues 4-7; Dec. 2007; pp. 688-692; Abstract Only.
Clarke et al., "Thermal-Barrier Coatings for More Efficient Gas-Turbine Engines," MRS Bulletin; vol. 37; Issue 10; Oct. 2012; pp. 891-898.
Darolia, "Thermal Barrier Coatings Technology: Critical Review, Progress Update, Remaining Challenges and Prospects," International Materials Review; vol. 58; No. 6, 2013; pp. 315-348.
Eckert et al., "Sol-Gel Deposition of Multiply Doped Thermographic Phosphor Coatings Al2O3:(Cr3+,M3+) (M=Dy, Tm) for Wide Range Surface Temperature Measurement Application," Progress in Organic Coatings; vol. 68; Issues 1-2; May 2010; pp. 126-129; Abstract Only.
Feist et al., "Thermographic Phosphor Thermometry for Film Cooling Studies in Gas Turbine Combustors," Proceedings of the Institution of Mechanical Engineers; vol. 217; Part A: J. Power and Energy; 2003; pp. 193-200.
Fouliard et al., "Configurations for Temperature Sensing of Thermal Barrier Coatings," 1st International Conference on Phosphor Thermometry; Glasgow, UK; Jul. 25-27, 2018; 4 pages.
Fouliard et al., "Modeling Luminescence Behavior for Phosphor Thermometry Applied to Doped Thermal Barrier Coating Configurations," Applied Optics; vol. 58, No. 13; May 1, 2019; pp. D68-D75.
Galetz, "Coatings for Superalloys," InTech; Chapter 12; 2015; pp. 277-298.
Haldar et al., "Synchrotron XRD Measurements of Thermal Barrier Coating Configurations with Rare Earth Elements for Phosphor Thermometry," Proceedings of ASME Turbo Expo 2019: Turbomachinery Technical Conference and Exposition; Jun. 17-21, 2019; pp. 1-7.
Hansel, "Phosphor Thermometry Using Rare-Earth Doped Materials," Dissertation Proposal Submitted to the Faculty of the Graduate School of Vanderbilt University; Dec. 2010; 70 pages.
He et al., "ChemInform Abstract: Polarization Dependence of the Cr3+ R-Line Fluorescence from Sapphire and Its Application to Crystal Orientation and Piezospectroscopic Measurement," Journal of the American Ceramic Society; 80(1):69-78; Jul. 2008; Abstract Only.
Heeg et al., "Precision and Accuracy of Luminescence Lifetime-Based Phosphor Thermometry: A Case Study of Eu(III):YSZ," American Institute of Physics Conference Proceedings; vol. 1552, 885 (2013); Sep. 10, 2013; 7 pages.
Hertle et al., "Influence of Codoping on the Luminescence Properties of YAG:Dy for High Temperature Phosphor Thermometry," Journal of Luminescence; 182; Feb. 2017; pp. 200-207; 28 pages.
Hertle et al., "Temperature-Dependent Luminescence Characteristics of Dy3+ Doped in Various Crystalline Hosts," Journal of Luminescence; vol. 204; Dec. 2018; pp. 64-74; Abstract Only.
Ishiwada et al., "Evaluation of Dy-Doped Phosphors (YAG:Dy, Al2O3:Dy, and Y2SiO05:Dy) as Thermographic Phosphors," Journal of Luminescence; vol. 196; Apr. 2018; pp. 492-497; Abstract Only.
Khalid et al., "Phosphor Thermometry in Gas Turbines: Consideration Factors," Proc. IMechE; vol. 224; Part G: Journal of Aerospace Engineering; Nov. 18, 2009; pp. 745-755.
Khalid et al., "Thermographic Phosphors for High Temperature Measurements: Principles, Current State of the Art and Recent Applications," Sensors; vol. 8; Sep. 15, 2008; pp. 5673-5744.
Kotowicz et al., "The Methodology of the Gas Turbine Efficiency Calculation," Archives of Thermodynamics; vol. 37. No. 4; Jan. 1, 2016; pp. 19-35(17); Abstract Only.
Lima et al., "Microstructural Characterization and Room-Temperature Erosion Behavior of As-Deposited SPS, EB-PVD and APS YSZ-Based TBCs," Journal of Thermal Spray Technology; vol. 28; 2019; pp. 223-232; Abstract Only.
Liu et al., "Microstructural Evolution and Growth Kinetics of Thermally Grown Oxides in Plasma Sprayed Thermal Barrier Coatings," Progress in Natural Science: Materials International; 26 (2016); pp. 103-111.
Liu et al., "Microstructural Evolution at Interfaces of Thermal Barrier Coatings During Isothermal Oxidation," Journal of the European Ceramic Society; 36 (2016); pp. 1765-1774.
Matejicek et al., "In Situ Measurement of Residual Stresses and Elastic Moduli in Thermal Sprayed Coatings: Part 1: Apparatus and Analysis," Acta Materialia; vol. 51; Issue 3; Feb. 7, 2003; pp. 863-872; Abstract Only.
Siegel et al., "Temperature Distributions in Semitransparent Coatings—A Special Two-Flux Solution," Journal of Thermophysics and Heat Transfer; vol. 10; No. 1; Jan.-Mar. 1996; Abstract Only.
Sobhanverdi et al., "Porosity and Microstructural Features of Plasma Spray Yttria Stabilized Zirconia Thermal Barrier Coatings," Ceramics International; vol. 41; Issue 10; Part B; Dec. 2015; pp. 14517-14528; Abstract Only.
Steenbakker et al., "Sensor Thermal Barrier Coatings: Remote In Situ Condition Monitoring of EB-PVD Coatings at Elevated Tem-

(56) References Cited

OTHER PUBLICATIONS peratures," Journal of Engineering for Gas Turbines and Power; vol. 131; Jul. 2009; p. 041301-1 through p. 041301-9.
Tanaka et al., "Identification of Delamination Through TGO Stresses Due to Indentation Testing of an EB-PVD TBC," Journal of Materials Research; vol. 24; Issue 12; Dec. 2009; pp. 3533-3542; Abstract Only.
Thapa et al., "Raman Scattering in Single-Crystal Sapphire at Elevated Temperatures," Applied Optics; 56(31); Nov. 1, 2017; pp. 8598-8606.
Trolinger et al., "Optical Control and Diagnostics Sensors for Gas Turbine Machinery," Proceedings of SPIE; vol. 8482; Nov. 29, 2012; p. 84820F-1 through p. 84820F-8.
Wang et al., "Influence of "Island-Like" Oxides in the Bond-Coat on the Stress and Failure Patterns of the Thermal-Barrier Coatings Fabricated by Atmospheric Plasma Spraying During Long-Term High Temperature Oxidation," Journal of Thermal Spray Technology; vol. 23, Issue 3; pp. 431-446; Abstract Only.
Wolfe et al., "Tailored Microstructure of EB-PVD 8YSZ Thermal Barrier Coatings with Low Thermal Conductivity and High Thermal Reflectivity for Turbine Applications," Surface & Coatings Technology; 190 (2005); pp. 132-149.
Wu et al., "Degradation Mechanisms of $ZrO_2$-8 wt% $Y_2O_3$/Ni—22Cr—10Al—1Y Thermal Barrier Coatings," Journal of the American Ceramic Society; 72(2); Mar. 2005; pp. 212-218; Abstract Only.
Xu et al., "Evolution of Rolls-Royce Air-Cooled Turbine Blades and Feature Analysis," Procedia Engineering; 99 (2015); pp. 1482-1491.

\* cited by examiner $$\phi = e^{-t/\tau(x)}$$

$$\frac{dY_{lum}(x,t)}{dx} = A_{lum}Y_{lum}(x,t) + \phi QY_{laser}(x)$$

$$R = 1 - \frac{1}{n^2} \cdot (1 - \rho_0(n))$$

$$\rho_0(n) = \frac{1}{2} + \frac{(3n+1) \cdot (n-1)}{6 \cdot (n+1)^2} + \frac{n^2 \cdot (n^2-1)^2}{(n^2+1)^3} \cdot \ln\left(\frac{n-1}{n+1}\right)$$

$$- \frac{2n^3 \cdot (n^2+2n-1)}{(n^2+1) \cdot (n^4-1)} + \frac{8n^4 \cdot (n^4+1)}{(n^2+1) \cdot (n^4-1)^2} \cdot \ln(n)$$

| COMPOSITIONS | |
|---|---|
| YSZ | 8% AT. $Y_2O_3$, 92% AT. $Zr_2O_3$ |
| NiCoCrAlYDy | 97% AT. NiCoCrAlY, 3% AT. Dy |
| | REQUIREMENTS ON THE DOPED BOND COAT |
| $D_{50}$ | ≈ 30 μm (FOR THE SPRAY GUN TO BE FED PROPERLY) |
| MIN. QUANTITY | 25 g |

COMPOSITION TO BE SYNTHESIZED →

$$A_{z,\lambda} = \begin{pmatrix} -(K_{z,\lambda}+S_{z,\lambda}) & S_{z,\lambda} \\ -S_{z,\lambda} & K_{z,\lambda}+S_{z,\lambda} \end{pmatrix}$$

FIG. 34C $$Q_z = \frac{1}{2} \begin{pmatrix} q_z K_{z,\ell} & q_z K_{z,\ell} \\ -q_z K_{z,\ell} & -q_z K_{z,\ell} \end{pmatrix}$$

FIG. 34D $$\frac{dY_\ell(x)}{dx} = \begin{pmatrix} A_{t,\ell} & 0 & 0 \\ 0 & A_{m,\ell} & 0 \\ 0 & 0 & A_{b,\ell} \end{pmatrix} \cdot Y_\ell(x)$$

$$\frac{dY_\mathscr{L}(x)}{dx} = \begin{pmatrix} A_{t,\mathscr{L}} & 0 & 0 \\ 0 & A_{m,\mathscr{L}} & 0 \\ 0 & 0 & A_{b,\mathscr{L}} \end{pmatrix} \cdot Y_\mathscr{L}(x) + \begin{pmatrix} Q_t & 0 & 0 \\ 0 & Q_m & 0 \\ 0 & 0 & Q_b \end{pmatrix} \cdot Y_\ell(x)$$

FIG. 34E

DIFFUSE EXTERNAL REFLECTIVITY $$\rho_0(n) = \frac{1}{2} + \frac{(3n+1) \cdot (n-1)}{6 \cdot (n+1)^2} + \frac{n^2 \cdot (n^2-1)^2}{(n^2+1)^3} \cdot \ln\left(\frac{n-1}{n+1}\right)$$

$$- \frac{2n^3 \cdot (n^2+2n-1)}{(n^2+1) \cdot (n^4-1)} + \frac{8n^4 \cdot (n^4+1)}{(n^2+1) \cdot (n^4-1)^2} \cdot \ln(n)$$

MAX DIFFUSE INTERNAL REFLECTIVITY $$\rho_{i,max}(n) = \left(1 - \frac{1}{n^2}\right) + \frac{\rho_0(n)}{n^2}$$

FIG. 34F

FRUSTRATED ANGLE-AVERAGED REFLECTIVITY $$\bar{R}_f(d) = \frac{\int_0^{2\pi} \int_{\theta_c}^{\frac{\pi}{2}} \frac{\alpha \cdot \sinh^2(\beta \cdot d)}{1 + \alpha \cdot \sinh^2(\beta \cdot d)} \cos\theta \cdot \sin\theta \, d\theta \, d\varphi}{\int_0^{2\pi} \int_{\theta_c}^{\frac{\pi}{2}} \cos\theta \cdot \sin\theta \, d\theta \, d\varphi}$$

FIG. 34G $$\alpha_\perp = \frac{(n^2-1)^2}{4n^2 \cdot \cos^2\theta \cdot (n^2\sin^2\theta - 1)}$$

$$\alpha_\| = \alpha_\perp \cdot (\sin^2\theta \cdot (n^2+1) - 1)$$

$$\beta = \frac{2\pi}{\lambda_0}\sqrt{n^2 \cdot \sin^2\theta - 1}$$

FIG. 34H $$\bar{R}_{f,unp} = \frac{\bar{R}_{f,\perp} + \bar{R}_{f,\|}}{2}$$

FIG. 34I $$\rho_j(d) = \bar{R}_{f,unp}(d) \cdot \left(1 - \frac{1}{n^2}\right) + \frac{\rho_0(n)}{n^2}$$

FIG. 34J

PHOSPHOR THERMOMETRY DEVICE FOR SYNCHRONIZED ACQUISITION OF LUMINESCENCE LIFETIME DECAY AND INTENSITY ON THERMAL BARRIER COATINGS

GOVERNMENT SPONSORSHIP

This invention was made with Government support under Agency Contract Award Number DE-FE0031282 awarded by the U.S. Department of Energy, National Energy Technology Laboratory, University Turbine Systems Research (UTSR). The Government has certain rights in this invention.

PRIORITY APPLICATION(S)

This application is based upon provisional application Ser. No. 62/944,390 filed Dec. 6, 2019; and based upon provisional application Ser. No. 62/940,963 filed Nov. 27, 2019; the disclosures which are hereby incorporated by reference in their entirety.

FIELD OF THE INVENTION

This invention relates to Thermal Barrier Coatings, and more particularly, to Thermal Barrier Coatings that enable luminescence sensing and high temperature measurements of a substrate, such as a turbine component.

BACKGROUND OF THE INVENTION

Thermal barrier coatings (TBCs) are used to protect substrates, such as turbine components from extreme environments and allow the associated turbine systems to operate often at temperatures beyond the melting point of the underlying substrate, for example, a superalloy turbine blade. These coatings may be formed as multilayers, and include in an example, the metal substrate, a metallic bond coat, a Thermally Grown Oxide (TGO) and a ceramic topcoat, such as formed from Yttria-Stabilized Zirconia (YSZ). Some of these coatings are used in combination with active cooling systems, which allow for temperature drops through the ceramic top coat, in the order of 1° C./μm. Accurate measurement of coating temperatures in these environments ensures good performance and functionality of the turbine system and helps predict the lifetime expectancy of the turbine blades and related turbine components.

The range of uncertainty in temperature measurements should be reduced to a few degrees at service temperatures because failure mechanisms are thermally driven. This is particularly important due to the extreme sensitivity at the interface between the top coat and a bond coat and any intervening layers, such as the thermally grown oxide. Currently, more viable techniques for non-contact, in-situ temperature measurements on thermal barrier coatings are: a) infrared thermometry, where precision is limited by the presence and variations in the emissions from the operation of the turbine engines, and b) phosphor thermometry. Other existing in-situ temperature measurement techniques for high temperature evaluation have inherent uncertainties and possibly poor safety margins. Improving the accuracy of temperature measurements on the materials in operating conditions is important for more reliable lifetime expectancy predictions of high temperature substrates such as turbine blades.

Direct temperature measurement at the thermally grown oxide, for example, remains impractical and prediction models are used to help estimate the health of the coatings. In addition, the production of multilayer thermal barrier coatings is both expensive and detrimental to the mechanical integrity of the thermal barrier coatings. Current temperature measurement systems do not permit direct temperature measurements on the thermally grown oxide layer. Instead, they enable indirect temperature approximations using a sensor coating placed in the top coat, which may add manufacturing costs, impart potential modifications to the thermal properties of the top coat, and create multilayer interfaces that can negatively affect the integrity of the thermal barrier coatings.

Phosphor thermometry has potential for improved temperature measurement capabilities, and has been effective to enable remote temperature sensing. This measurement technique uses phosphors, which luminescence is due to rare-earth or transition metal ions that have been illuminated by an ultraviolet lamp or laser source. Improved thermal barrier coatings that extend the range of temperature sensing for extreme operating conditions are desirable.

SUMMARY OF THE INVENTION

This summary is provided to introduce a selection of concepts that are further described below in the Detailed Description. This summary is not intended to identify key or essential features of the claimed subject matter, nor is it intended to be used as an aid in limiting the scope of the claimed subject matter.

A phosphor thermometry device may include a laser that generates a laser pulse onto a thermal barrier coating (TBC) applied onto a substrate. The thermal barrier coating may include a metallic bond coat layer on the substrate, and a ceramic top coat layer on the bond coat layer that may include an undoped layer and a doped sensing layer having co-doped first and second rare-earth luminescent dopants that emit respective first and second different emission wavelengths upon excitation by the laser pulse. A detector may receive reflected, convoluted luminescence signals from the TBC as generated from laser excitation of the first and second rare-earth luminescent dopants in the doped sensing layer. The detector may include first and second photomultiplier devices configured to detect respective first and second different emission wavelengths of the convoluted luminescence signals. A controller may be connected to the detector and configured to receive and process signals generated from respective first and second photomultiplier devices and determine luminescence lifetime decay and intensity variations for each of the respective first and second rare-earth luminescent dopants and correlate to a temperature value for temperature monitoring of the TBC.

In an example, a first dichroic filter may be configured to transmit the laser pulse onto the TBC and reflect the convoluted luminescence signals from the TBC to the detector. The first dichroic filter may comprise a cyan dichroic filter. A second dichroic filter may be positioned to receive the reflected, convoluted luminescence signals from the first dichroic filter and split the convoluted luminescence signals into two spectral bands corresponding to the respective emission wavelengths of the respective first and second rare-earth luminescent dopants. The second dichroic filter may comprise a magenta dichroic filter.

In yet another example, the doped sensing layer may be the top layer of the TBC over the undoped layer and comprises an Erbium-Europium, co-doped, Yttria-stabilized Zirconia (YSZ). The Erbium concentration in the YSZ may be about 1.25 to 1.75 weight percent, and the Europium concentration in the YSZ may be about 2.5 to 3.5 weight percent. The doped sensing layer may be about 70 to 90 micrometers and the undoped layer of the top coat layer may be about 230 to 270 micrometers. The photomultiplier device may be configured to detect Erbium spectral lines at about 545 nm and 562 nm and the second photomultiplier device may be configured to detect Europium spectral lines at about 590 nm and 606 nm.

In yet another example, a phosphor thermometry device for temperature monitoring of turbine components may include a laser that generates a laser pulse onto a thermal barrier coating (TBC) applied onto a superalloy turbine component substrate. The thermal barrier coating may include a metallic bond coat layer on the superalloy turbine component substrate, and a ceramic top coat layer on the bond coat layer that includes an undoped layer and a doped sensing layer having co-doped first and second rare-earth luminescent dopants that emit respective first and second different emission wavelengths upon excitation by the laser pulse. A first dichroic filter may be configured to transmit the laser pulse onto the TBC and reflect convoluted luminescence signals from the TBC generated from laser excitation of the first and second rare-earth luminescent dopants in the doped sensing layer. A second dichroic filter may be positioned to receive the reflected, convoluted luminescence signals from the first dichroic filter and split the convoluted luminescence signals into two spectral bands corresponding to the respective emission wavelengths of the respective first and second rare-earth luminescent dopant. A detector may receive reflected, convoluted luminescence signals from the second dichroic filter. The detector may include first and second photomultiplier devices configured to detect respective first and second different emission wavelengths of the convoluted luminescence signals from the second dichroic filter. A controller may be connected to the detector and configured to receive and process signals generated from respective first and second photomultiplier devices and determine luminescence lifetime decay and intensity variations for each of the respective first and second rare-earth luminescent dopants and correlate to a temperature value for temperature monitoring of the turbine component.

A method aspect of operating a phosphor thermometry device for monitoring temperature of thermal barrier coatings (TBC) may include generating from a laser a laser pulse onto a TBC applied onto a substrate. The thermal barrier coating may include a metallic bond coat layer on the substrate and a ceramic top coat layer on the bond coat layer that includes an undoped layer and a doped sensing layer having co-doped first and second rare-earth luminescent dopants that emit respective first and second different emission wavelengths upon excitation by the laser pulse. The method includes receiving at a detector reflected, convoluted luminescence signals from the TBC as generated from laser excitation of the first and second rare-earth luminescent dopants in the doped sensing layer. The detector may include first and second photomultiplier devices configured to detect respective first and second different emission wavelengths of the convoluted luminescence signals. The method further includes receiving at a controller connected to the detector signals generated from the respective first and second photomultiplier devices and processing the signals to determine luminescence lifetime decay and intensity variations for each of the respective first and second rare-earth luminescent dopants and correlate to a temperature value for temperature monitoring of the TBC.

BRIEF DESCRIPTION OF THE DRAWINGS

Other objects, features and advantages of the present invention will become apparent from the Detailed Description of the invention which follows, when considered in light of the accompanying drawings in which:

FIG. 10 is a schematic diagram of temperature sensing the thermally grown oxide via phosphor thermometry probing in accordance with a non-limiting example.

FIG. 16 is a table showing an example of compositions of the thermal barrier coating using the air plasma spray system of FIG. 15.

FIG. 21 is a table showing examples of fabricated EB-PVD samples.

FIG. 34C shows a matrix used to help determine optical properties in a specific layer Z.

FIG. 34D shows a matrix used to help define the amount of luminescence generated in a specific layer Z.

FIG. 34E shows matrices and equations used to help solve for the intensity of laser and luminescence lights, as a function of coating depth, respectively.

FIG. 34F are equations used to help define the diffuse external reflectivity at the interface between the top coat and the air gap or bond coat and the integrated average of the Fresnel equation to obtain diffuse internal reflectivity.

FIG. 34G is an equation to help solve the frustrated angle-average reflectivity for radiation with angle of incidence greater than the critical incident angle.

FIG. 34H are equations to help determine values in perpendicular polarization and parallel polarization.

FIG. 34I is an equation to help solve the frustrated angle-average reflectivity for unpolarized radiation.

FIG. 34J is an equation to help solve for the error gap width dependent diffuse internal reflectivity for an examination of early stages of delamination.

DETAILED DESCRIPTION

Figure 1C:
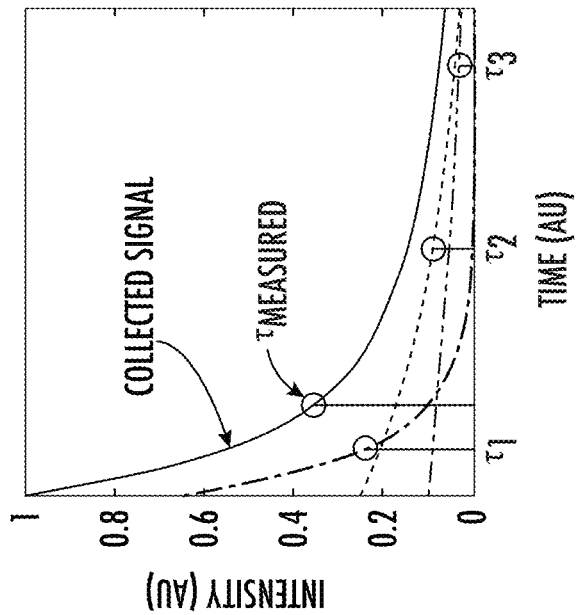
FIG. 1A is a schematic sectional diagram of a thermal barrier coating showing the gradient of temperature and the emerging luminescence as a convoluted signal coming from all locations in the doped layer.
FIG. 1B is a graph showing the collected signal for the emerging luminescence shown in the diagram of FIG. 1A.

Different embodiments will now be described more fully hereinafter with reference to the accompanying drawings, in which preferred embodiments are shown. Many different forms can be set forth and described embodiments should not be construed as limited to the embodiments set forth herein. Rather, these embodiments are provided so that this disclosure will be thorough and complete, and will fully convey the scope to those skilled in the art.

In accordance with a non-limiting example, an improved rare-earth doped thermal barrier coating bond coat configuration has been developed and is effective to enable luminescence sensing, for example, by ultraviolet light illumination at the TGO (thermally grown oxide). The rare-earth doped thermal barrier coating bond coat configuration allows for better control of thermal parameters in components, such as turbine engines, to allow the engines to operate more efficiently with increased safety. This improved configuration allows for direct measurement at the thermally grown oxide layer that forms in the thermal barrier coating. This process for luminescence sensing and the developed rare-earth doped thermal barrier coating bond coat configuration allows direct measurement at the top coat and the bond coat interface, e.g., at the TGO layer, which is the location of interest for lifetime monitoring of thermal barrier coatings. This sensing layer may form through high temperature oxidation. In a non-limiting example, there is no requirement to modify the industrial deposition procedure when forming the thermal barrier coating on a substrate, such as a turbine blade. The process and configuration also conserves the integrity of the thermal barrier coating. No additional mechanical interfaces are required and no modification of the industrial top coat of the thermal barrier coating is necessary.

The improved process and rare-earth doped thermal barrier coating bond coat configuration, in accordance with a non-limiting example, may be used for thermal barrier coating real-time temperature measurements, thermal barrier coating lifetime predictions, and thermal barrier coating delamination detection. In an example, a modified Kubelka-Munk model as explained in greater detail below is applied to determine luminescence decay behavior in the doped TBC configurations. The process and rare-earth doped thermal barrier coating bond coat configuration may be used with phosphor thermometry measurement techniques on an operating gas turbine engine via an optical port. The process and rare-earth doped thermal barrier coating bond coat configuration may work even where the luminescence signal is weak and where there are uncertainties on the rare-earth diffusion rates and the uncertainty in the bond coats and bond coat adhesion properties. It is also possible to quantify thermal barrier coating delamination through luminescence modeling using the modified Kubelka-Munk model.

In an example, a component, such as a substrate for a turbine component, may include a turbine substrate, such as a turbine blade, and a thermal barrier coating on the turbine substrate. The thermal barrier coating may include a bond coat layer, such as a metallic bond coat, on the substrate. In an example, the bond coat layer includes rare-earth luminescent ions as a dopant, for example, and a Ytrria-Stabilized Zirconia (YSZ) barrier top coat over the bond coat. A Thermally Grown Oxide (TGO) layer is formed at the interface of the bond coat material and YSZ barrier top coat. The addition of the rare-earth luminescent ions, i.e., a rare-earth luminescent dopant, enables luminescence sensing of the TGO layer. In an example, the rare-earth luminescent dopant is selected from the group consisting of samarium, erbium, dysprosium and europium. Other dopants may be used and it may be possible to use chromium, magnesium and similar materials. It is possible to use various transition metals.

Thermal barrier coatings are often applied to a substrate, such as turbine components, to protect these turbine components, such as turbine blades operating at high temperatures. Thermal barrier coatings often are used in combination with active cooling systems that allow for temperature drops via the ceramic top coat. State-of-the-art thermal barrier coatings are not being used to their greatest potential because of the uncertainties with measuring high temperatures, where the safety margins may be as high as 200° C. The ideal Brayton cycle efficiency is $1-T^c/T^t$, which corresponds to the temperature ratio across the compressor from the exit to the turbine inlet. A 1% efficiency improvement may save $20 million in fuel over a combined-cycle plant life, and a 130° C. increase may lead to a 4% increase in engine efficiency. Failure mechanisms may be driven by temperature conditions in the depth of the thermal barrier coating. By having more accurate temperature monitoring of the thermal barrier coatings, it is possible to increase the efficiency of the turbine and combined engine cycle. The rare-earth doped thermal barrier coating bond coat configuration overcomes these failure mechanisms that are thermally activated during engine operation and the uncertainty in temperature measurements that may reduce lifetime operation and uncertainty.

Other techniques have been tried, but are not as successful. Thermocouples are inexpensive and have a wide temperature range and have been proposed, but have drawbacks of intrusive probe designs, disrupted flow patterns, chemical instability, low accuracy, and incompatibility on rotating surfaces. Infrared thermometry has a wide temperature range using non-contact techniques at a fast response time, but requires optical access and is emission sensitive.

Phosphor thermometry, on the other hand, is a non-contact technique that has high sensitivity at high temperatures, a fast response time, usable on rotating parts, and low sensitivity to the turbine environment, such as aging and contamination. For example, the time dependent intensity may be measured following an excitation pulse to determine a temperature-dependent decay time, where dopants are rare-earth elements. Embedding the doped layer in a thermal barrier coating enables a temperature measurement.

In accordance with a non-limiting example, a luminance decay behavior in rare-earth doped thermal barrier coating bond coat configurations is measured by using a modified Kubelka-Munk model. The classical Kubelka-Munk model provides a only luminescence intensity where the modeling decay is important to understand the effect of the thermal barrier coating configurations.

Figure 1A:
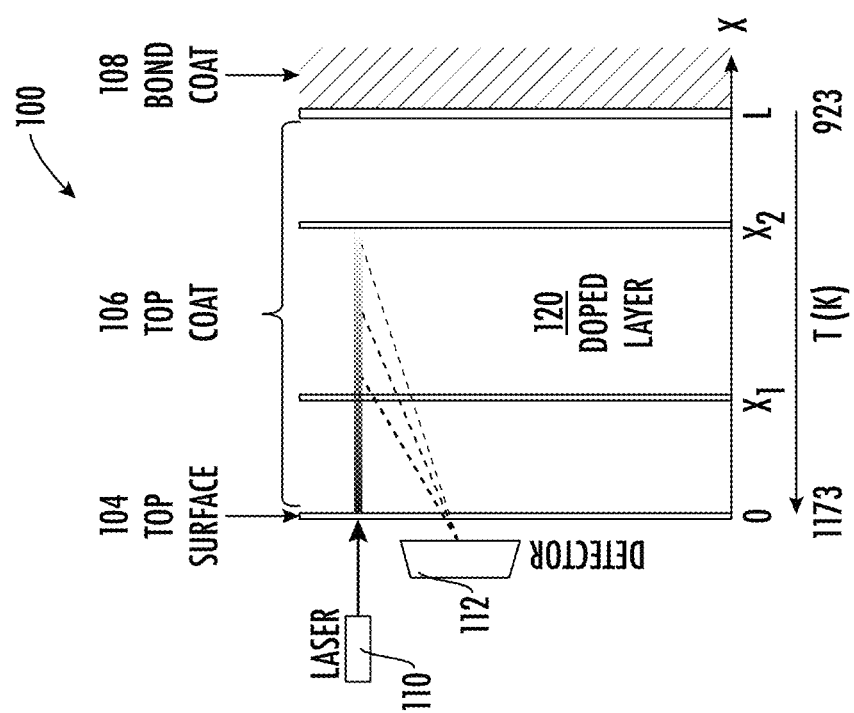

Referring now to the schematic of the rare-earth doped thermal barrier coating configuration in FIG. 1A, the thermal barrier coating is shown generally at 100, and includes the top surface 104, top coat 106, and bond coat 108 over which the top coat is placed in this example. A laser 110 and detector 112 are also illustrated. The gradient of the temperature exists in real operating conditions and the emerging luminescence via the laser 110 is a convoluted signal coming from all the locations in the doped layer and showing the doped layer 120 in the top coat 106. The laser 110 emits the signal, and the emerging luminescence is a convoluted signal to the detector 112 as shown by the spread signal. The graph shown in FIG. 1B illustrates the time on the horizontal scale and shows the intensity on the vertical scale with the time relative to the collected signal and measured parameters and the measured time relative to different time periods. The modified Kubelka-Munk model as explained in greater detail below predicts a decay behavior of luminescence. Reference is made to FIG. 1C illustrating the mathematical sequence.

Figure 2:
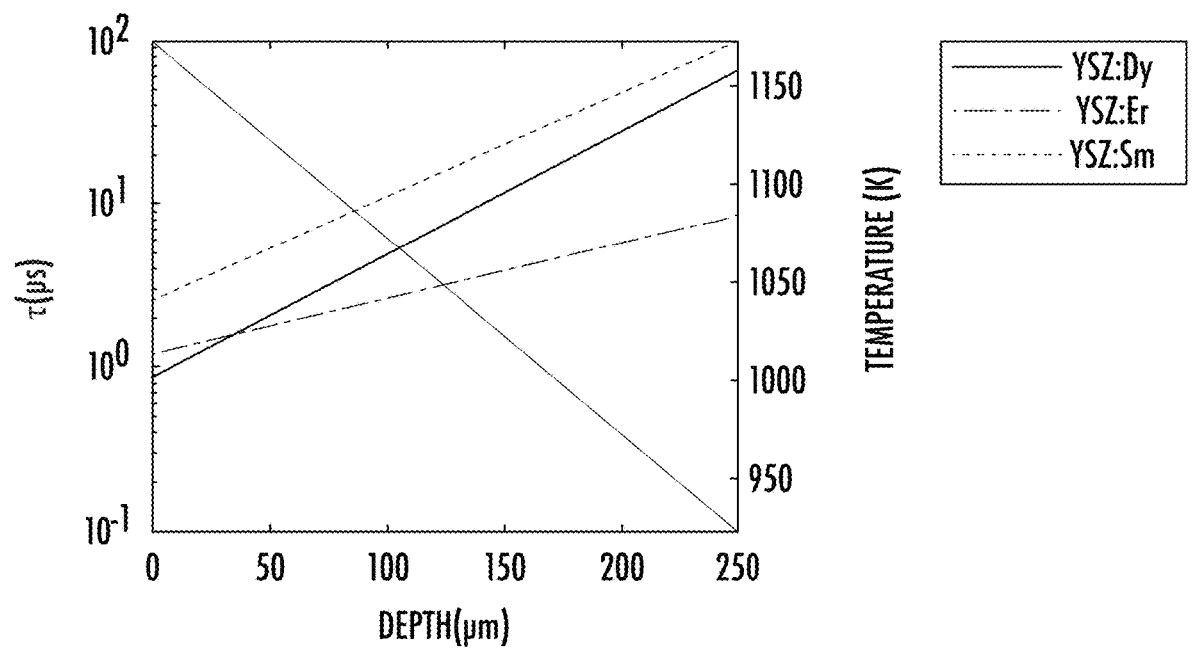
FIG. 2 is a graph illustrating the depth at which phosphor thermometry may make temperature measurements in a thermal barrier coating.

Referring now to the graph of FIG. 2, it is evident that the gradient of temperature may be calculated using thermal conductivities of materials where the function may be determined from the temperature distribution across the coating. The differences for YSZ:Dy, i.e., added dysprosium, or added europium (YSZ:Er) or added samarium (YSZ:Sm) are shown with the different lines.

Figure 3:
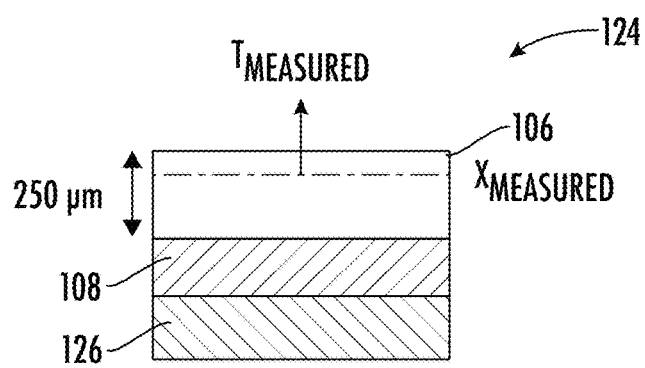
FIG. 3 is a sectional block view of a thermal barrier coating showing the doped top coat on a bond coat and substrate and showing diagrammatically temperature measurement levels in accordance with a non-limiting example.

FIG. 3 in turn illustrates a rare-earth doped thermal barrier coating bond coat configuration 124 on a substrate 126, such as a turbine blade, and showing the doped top coat 106, bond coat 108 and substrate. The modified Kubelka-Munk model predicts the equivalent position, indicating at which depth the phosphor thermometry system may make its measurements as shown by the dashed line indicated as X measured. The doped top coat 106 is shown in this example as about 250 micrometers (μm) and the measured temperature (T measured) is shown relative to the measured distance, such as 50 micrometers. Thus, a temperature is measured or determined relative to depth.

The decay constant for the collectible luminescence has a value between the decay constants of luminescence from the edges. The decay constant of the collectible luminescence may then be determined by a fit. The decay constant also infers the temperature of a particular position that dominates the signal. This position may be determined from retracing the temperature dependence of the decay constant, which may be fitted for any configuration that is associated with a particular position of the top coating 106. In an example, the decay constant had been found to match with that of the luminescence generated at 37 micrometers in an example, and in the case of a thermal barrier coating 100 with a doped layer of thickness 50 micrometers and positioned at 50 micrometers, the decay constant may be the same as the luminescence from the position depth of 69 micrometers.

The modified Kubelka-Munk model allows for collecting intensity comparisons between different configurations having the same dopant. The modified model may predict the expected decay behavior from any phosphor doped configuration and predict the equivalent position of the temperature measurement. This modified model may be used for collecting accurate temperature measurements in real operating conditions, such as for a coated turbine blade in a gas turbine, at high-temperature using phosphor thermometry. The results of this modified model may be used for evaluating different geometrical configurations of thermal barrier coatings with phosphor thermometry and screen different phosphors to aid in selecting dopants. The results of the modified model may help reduce the costs of experiments that are otherwise required for evaluating multiple doped layer configurations and use of different materials, such as different dopants.

Figure 4:
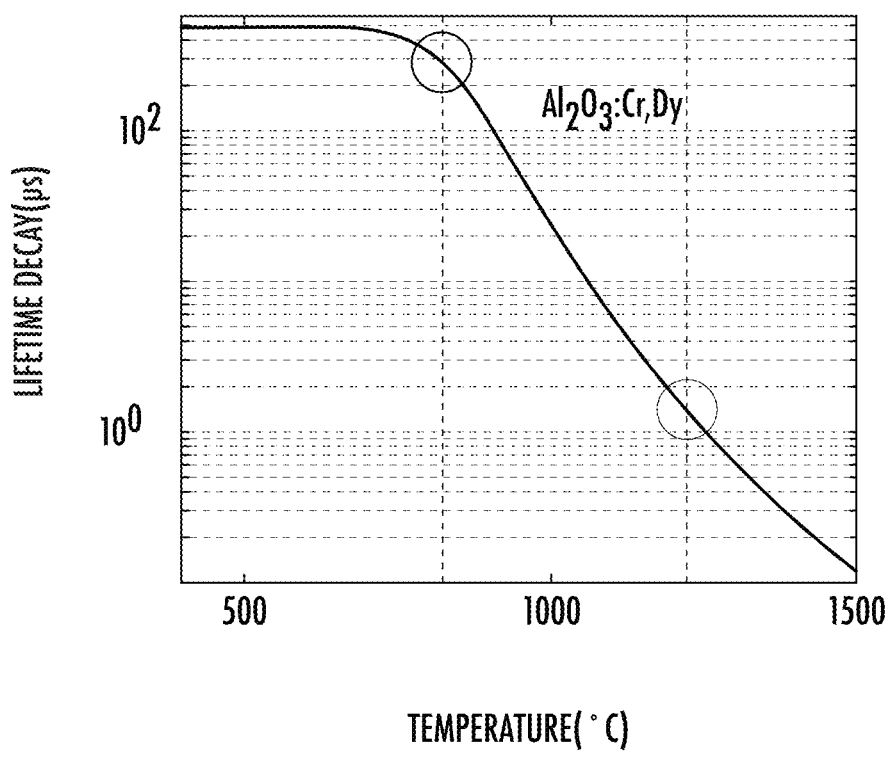
FIG. 4 is a graph showing the temperature sensitive region in the operating temperature range of a gas turbine and lifetime decay.

In accordance with a non-limiting example, a thermally grown oxide (TGO) in the thermal barrier coating is part of an innovative bond coat configuration where the thermally grown oxide has temperature sensing capabilities. Temperature may be measured at this location where failure mechanisms occur such as in gas turbines. The temperature may be measured non-intrusively into a depth of the thermal barrier coating. In an example, the logarithmic growth may be limited by low oxygen diffusivity through the thermally grown oxide. The graph shown in FIG. 4 illustrates a temperature sensitive region in the operating, temperature range of a gas turbine engine as shown between the dashed lines and as defined between the circled portions. Lifetime decay is shown on the vertical axis and temperature on the horizontal axis and showing alumina as $Al_2O_3$ and chromium and dysprosium dopants as the material. In operational use, the temperature drives the oxide growth in the thermal barrier coating on a turbine blade, for example, and is a major factor in coating failure.

Figure 5:
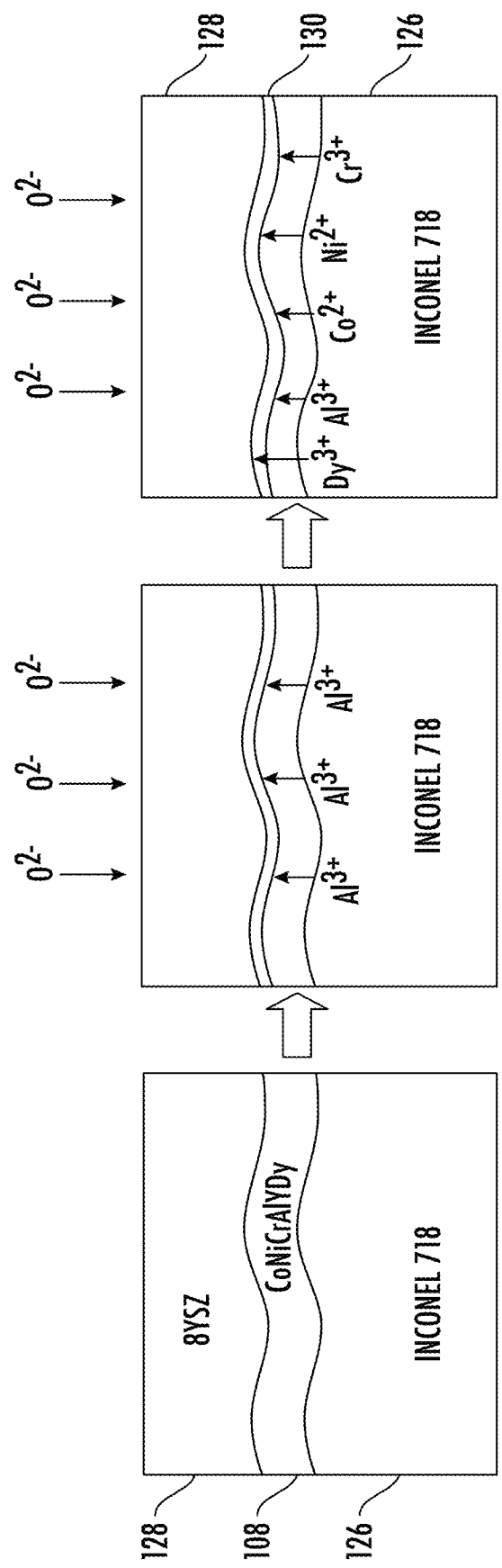
FIG. 5 is a schematic flow diagram showing stages of oxidation for an example thermal barrier coating and the thermally grown oxide and dysprosium impurities.

In accordance with a non-limiting example, rare-earth luminescent ions, e.g., rare-earth dopants, may be added to the bond coat 108 (FIG. 5) of the thermal barrier coating to enable luminescent sensing at the thermally grown oxide. Reference is made to the article: Liu, Xiaoju, et al., "Microstructural Evolution and Growth Kintetics of Thermally Grown Oxides in Plasma Sprayed Thermal Barrier Coatings," *Progress in Natural Science, Materials International*, 26.1 (2016) 103-111, where an explanation is given for oxidation stages in duplex thermal barrier coatings, but without rare-earth dopants. On contrast to Liu et al., the addition of these dopants allows an accurate measurement of coating temperatures in extreme environments to ensure and maintain good performance, functionality of the turbine system, and allow prediction estimates of the lifetime left of the turbine blades. A rare-earth doped thermal barrier coating bond coat for thermally grown oxide sensing is formed. An example of the thermally grown oxide, which may include Dy (Dysprosium) impurities is shown in the schematic diagram of FIG. 5, illustrating different stages of oxidation in a multilayer thermal barrier coating and includes an undoped top layer 128, such as formed from YSZ and on the bond coat 108, which is on the substrate 126 such as Inconel 718, corresponding to an austenitic nickel-chromium alloy that is often used, for example, in turbine components such as turbine blades and exhaust components that take high heat. The oxide growth occurs from elements of the metallic bond coat 108 and oxygen from the surface. The CoNiCrAlY superalloy is used in the example at the bond coating 108 such as applied by air plasma spray. The Inconel 718 alloy 126 has been known to form a thick, stable, passivating oxide layer when heated. Adding Dy (Dysprosium) is usually not accomplished using its oxide form ($Dy_2O_3$) because the oxide form may not migrate properly into the thermally grown oxide illustrated at 130 to form the thermally grown oxide that includes in this example the rare-earth dopant Dy. The oxide form may be detrimental to the bond coat. The middle drawing sequence in FIG. 5 shows the $Al^{3+}$ initially at the interface for migration, and the sequence on the right shows the $Dy^{3+}$, $Al^{3+}$, $CO^{2+}$, $Ni^{2+}$ and $Cr^{3+}$ at the interface for migration. Other rare-earth ions could be used.

Figure 6:
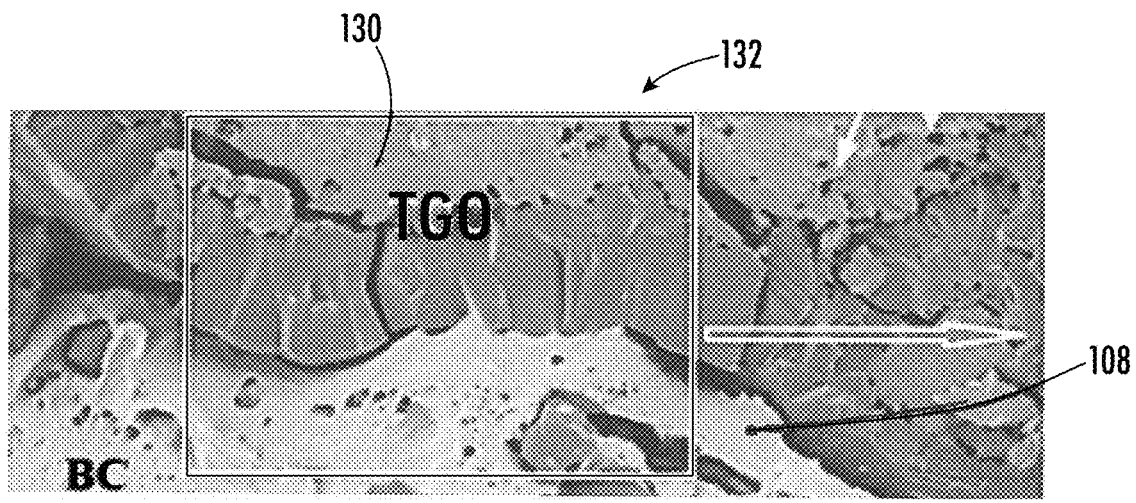
FIG. 6 is a scanning electron microscopy (SEM) image of an oxidized thermal barrier coating at 1100° C. for 200 hours.
Figure 7:
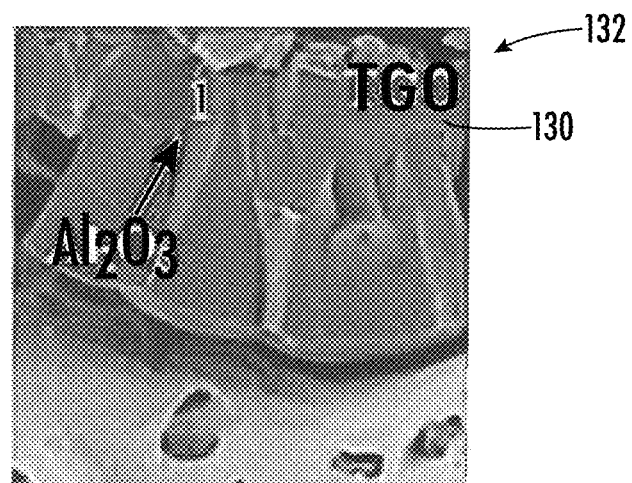
FIG. 7 is an enlarged view of a portion of the SEM image of FIG. 6.

Referring now to FIGS. 6 and 7, there are shown scanning electron microscopy (SEM) images 132 of a fractured cross-section of the oxidized thermal barrier coatings at 1100° C. for 200 hours at a low rate according to Liu et al. This example has the $Al^{3+}$ ions and other ions from the bond coat 108 migrating to the thermally grown oxide 130. The $Cr^{3+}$ may be responsible for the emission of R-lines in the $Al_2O_3$. Energy-dispersive x-ray spectroscopy (EDS) may be used for analysis. An EDS (energy-dispersive x-ray spectroscopy) compositional analysis of weight percent (wt. %) of three points in the fractured cross-section of the oxidized thermal barrier coating and thermally grown oxide 130 after 200 hours at 1100° C. includes no cobalt, but according to Liu et al., at point 1 shown in the enlarged section of FIG. 7, includes nickel at about 1.87 weight percent, chromium at about 0.74 weight percent, aluminum at about 58.58 weight percent, and oxygen at about 38.81 weight percent.

However, the added dysprosium in accordance with a non-limiting example adds traces in this non-limiting analysis to the area of point 1. This configuration as described with the added rare-earth element in this example such as the dysprosium is advantageous because measurements may occur at the YSZ ceramic top coat and bond coat interface. No additional mechanical interface is required and there is no requirement to modify an industrial YSZ thermal barrier.

In an example, the metallic bond coat layer includes about 96-98% of NiCoCrAlY and about 2-4% of a rare-earth element or ion, such as dysprosium. In another example, the TGO layer includes about 1.7 to 2.0 wt. % of chromium, about 52.7 to 64.4 wt. % of aluminum, about 35.0 to 42.7 wt. % of a rare-earth element selected from the group consisting of samarium, erbium, europium, and dysprosium. These elements may be in ion form and other materials may be used, including praseodymium and terbium. Other transition elements may be used. These base values above may vary as much as up to 5%, 10%, 15%, or 20%, and other incremental variations and all values in between these values. The bond coat may be about 50 to 200 micrometers. The ceramic top coat layer may be about 50 to 300 micrometers. The example dysprosium may be no more than about 0.1 wt. % but can vary by amounts as little as 1% to as much as 20% of that 0.1 wt. % and values in between for the TGO.

Figure 8:
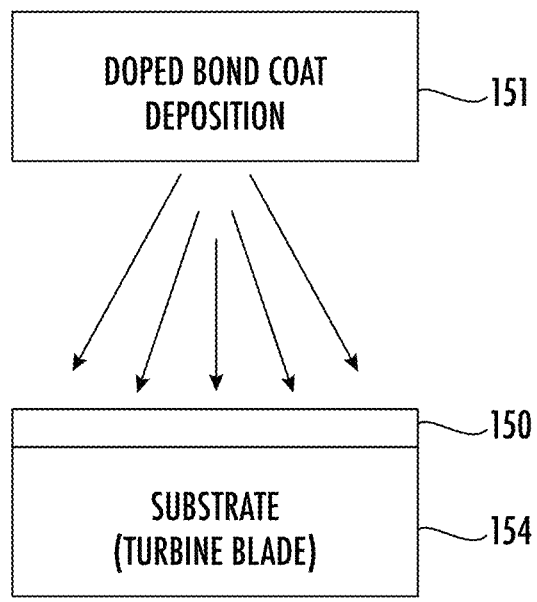
FIG. 8 is a schematic diagram of a first step for forming a sensing layer at the YSZ/bond coat interface and showing deposition of the doped bond coat in accordance with a non-limiting example.
Figure 9:
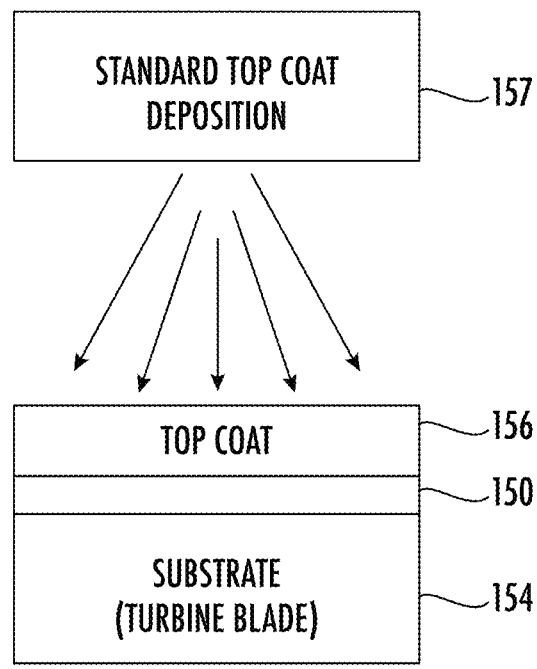
FIG. 9 is a schematic diagram showing the standard top coat deposition after depositing the bond coat in FIG. 8.
Figure 10:
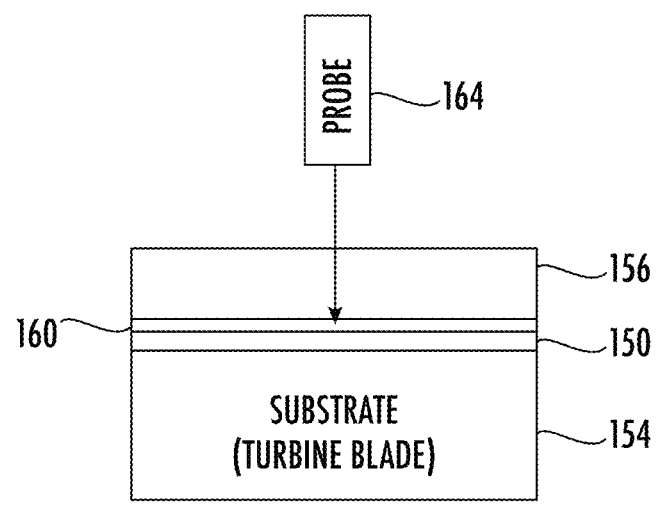
FIG. 10 shows a modified Kubelka-Munk model to predict decayed behavior of luminescence in accordance with a non-limiting example.

Referring now to FIGS. 8-10, there are illustrated a sequence of steps for forming a sensing coating or layer as a temperature sensing thermally grown oxide that allows temperature measurement at the YSZ/bond coat interface. In FIG. 8, the doped bond coat 150 is deposited on the substrate 154, such as a turbine blade, and may include as a non-limiting example NiCoCrAlYDy, and forms the rare-earth doped bond coat. In FIG. 9, the industrial YSZ coating 156 is deposited as the top coat. The doped bond coat deposition process 151 could be plasma air spray or other deposition techniques. At the next step as a non-limiting example, the thermally grown oxide 160 containing the $AL_2O_3$:CR,Dy is shown in FIG. 10 to form the sensing layer as a temperature sensing thermally grown oxide, and illustrates the regular in-service condition with possible sintering and measuring temperature using the phosphor thermometry probe 164 as part of a thermometry sensing system.

Figure 11:
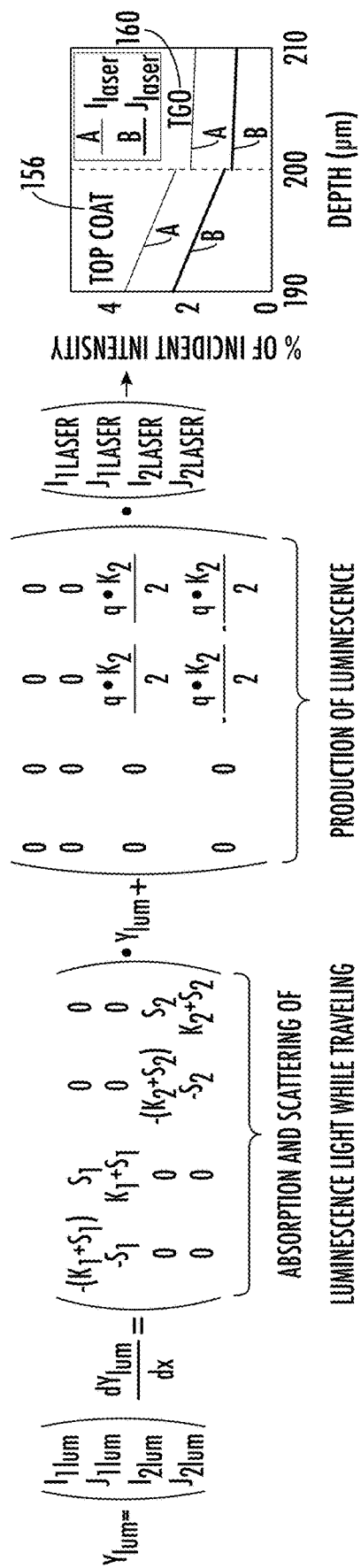
FIG. 11 is an example of the modified Kubelka-Munk model extension for two layers having distinct optical properties with the absorption and scattering of luminescence light emerging from the rare-earth doped thermally grown oxide.
Figure 12:
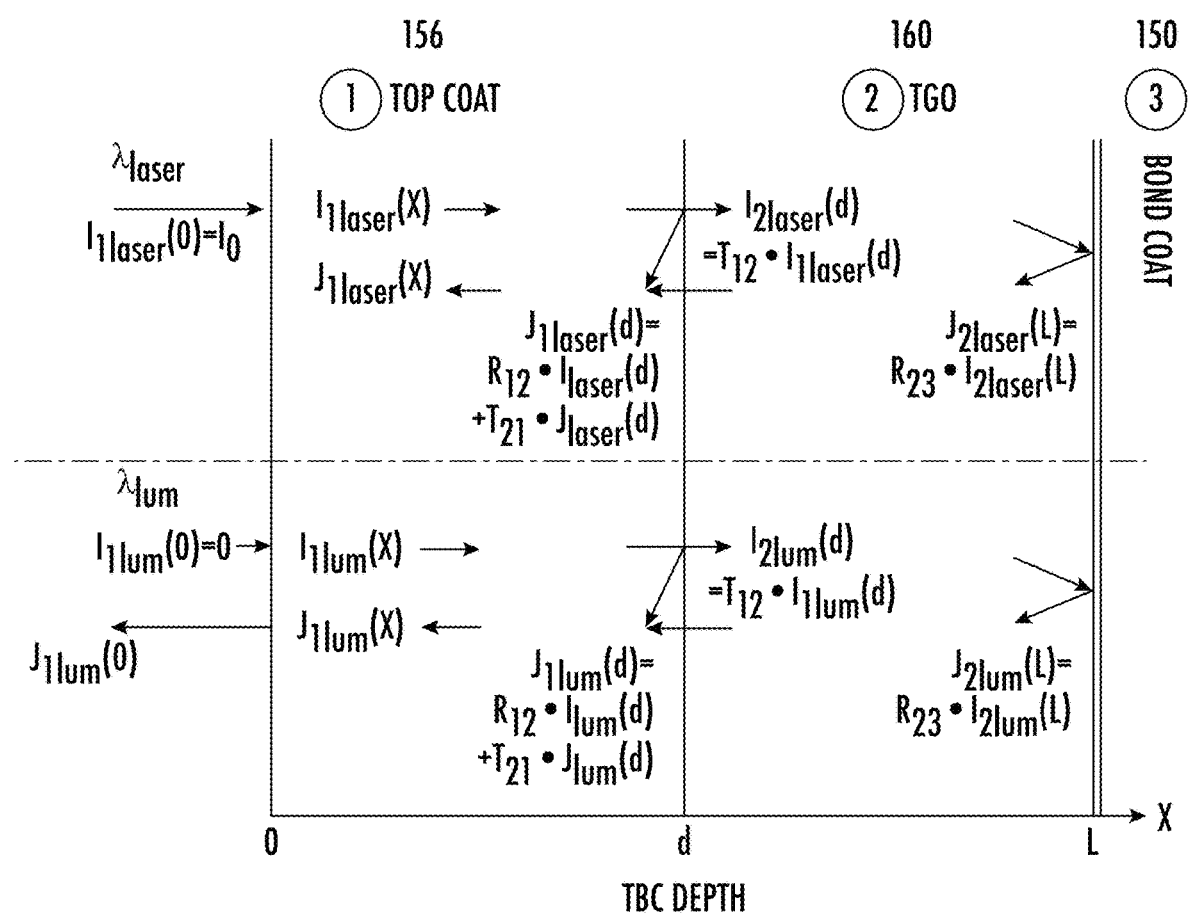
FIG. 12 is a graphical model of the modified Kubelka-Munk model extension showing the light reflection and transmission at the interfaces.

The modified Kubelka-Munk model of luminescence that emerges out of this rare-earth doped thermally grown oxide 160 as shown in FIG. 10, is illustrated in the modified Kubelka-Munk model shown in the model expansion and matrix of FIG. 11, and in the thermal barrier coating layer schematic of FIG. 12. The Kubelka-Munk model extension is operative with a sample having two layers of distinct optical properties, but multiple layers may be employed. The model expansion in FIG. 11 shows a first expanded matrix for the absorption and scattering of luminescence light while traveling and coupled with a second matrix for the production of luminescence. The resulting model expansion culminates in the graph at the right side showing the percent of incident intensity for $I_{laser}$ and $J_{laser}$ on the vertical axis and depth in micrometers relative to the top coat 156 and thermally grown oxide (TGO) 160.

Figures 13, 14:
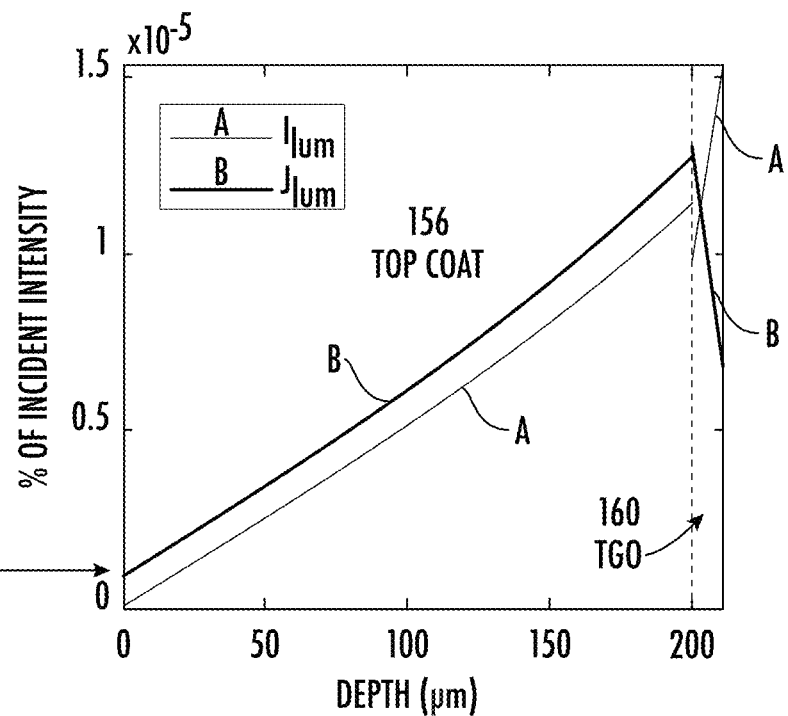
FIG. 13 shows integrated Fresnal equations for the modified Kubelka-Munk model extension of FIGS. 11 and 12.
FIG. 14 is a graph showing the measurable luminescence relative to the percent of incident light intensity and depth of the thermally grown oxide relative to the top coat in accordance with a non-limiting example.

The physical parameters in the schematic cross-section model of FIG. 12 shows the top coat 156, thermally grown oxide 160, and a bond coat 150 with the laser signal and luminescence. The thermal barrier coating depth is illustrated on the horizontal axis. The reflection and transmission at the interfaces shown in the model of FIG. 12 were estimated using integrated averages of Fresnel's relations (FIG. 13). The measurable luminescence 167 is illustrated in the graph of FIG. 14 with percentage of incident intensity shown on the vertical axis and depth in micrometers for the thermally grown oxide 160 relative to the top coat 156 on the horizontal axis and showing the rise in the percent incident intensity for $I_{lum}$ and $J_{lum}$ in the top coat 156 and change at the thermally grown oxide 160 showing the increase in the $I_{lum}$ and decrease in the $J_{lum}$.

Different deposition methods may be used to form the thermal barrier coatings as described, including an air plasma spray (APS) device (FIG. 15) and electron beam physical vapor deposition (EB-PVD) device (FIG. 19) as explained in greater detail below.

Figure 15:
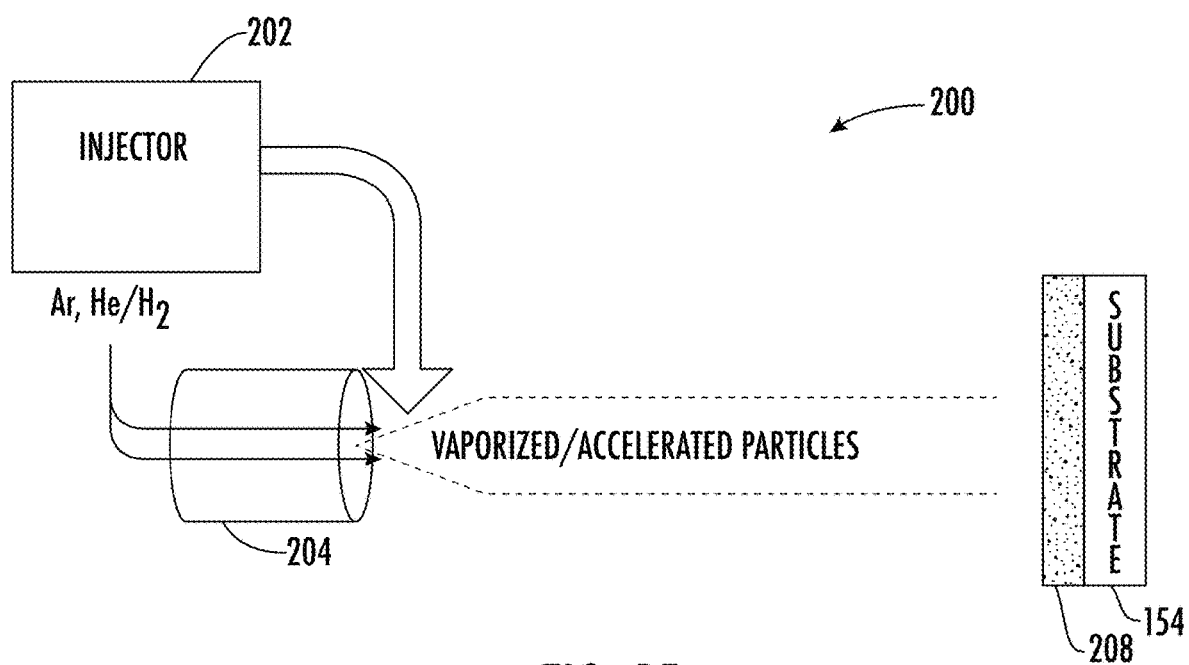
FIG. 15 is a schematic diagram of an air plasma spray system that may be used to form the thermal barrier coating in accordance with a non-limiting example.

Referring now to FIG. 15, there is illustrated a schematic diagram of a powder injector system as an air plasma spray device at 200, for example, for air plasma spray (APS) and having an injector 202 that injects powder at a particle size $D_{50}$ in this example of about 1-100 micrometers and a torch 204 that applies Argon (Ar) and helium and hydrogen ($He/H_2$) combination to vaporize and accelerate particles onto the substrate 154 such as a turbine blade, and showing the APS splats 208. The plasma temperature may be about $10^4$ K and the system may operate with a plasma flow velocity of about $10^3$ meters per second (m/s), and the values may range as much as +10%.

One aspect of this described air plasma spray device 200 is the possible formation of interlamellar pores and unmelted particles on the substrate 154, which may form voids and include oxide inclusion. Any high oxidation rate may damage luminescent properties, and thus, this process may be controlled to establish a desired thickness and minimize the imparted roughness of deposited layers. There is also no ideal powder particle/shape for deposition.

Figure 17:
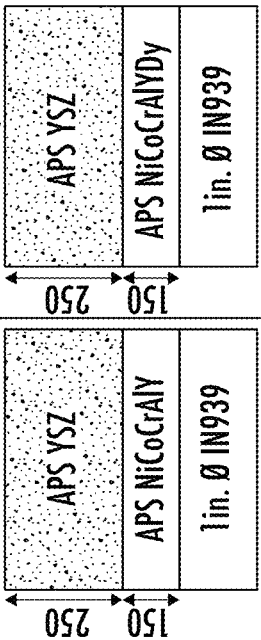
FIG. 17 is a table showing examples of the fabricated air plasma sprayed doped thermal barrier coating configurations.
Figure 18:
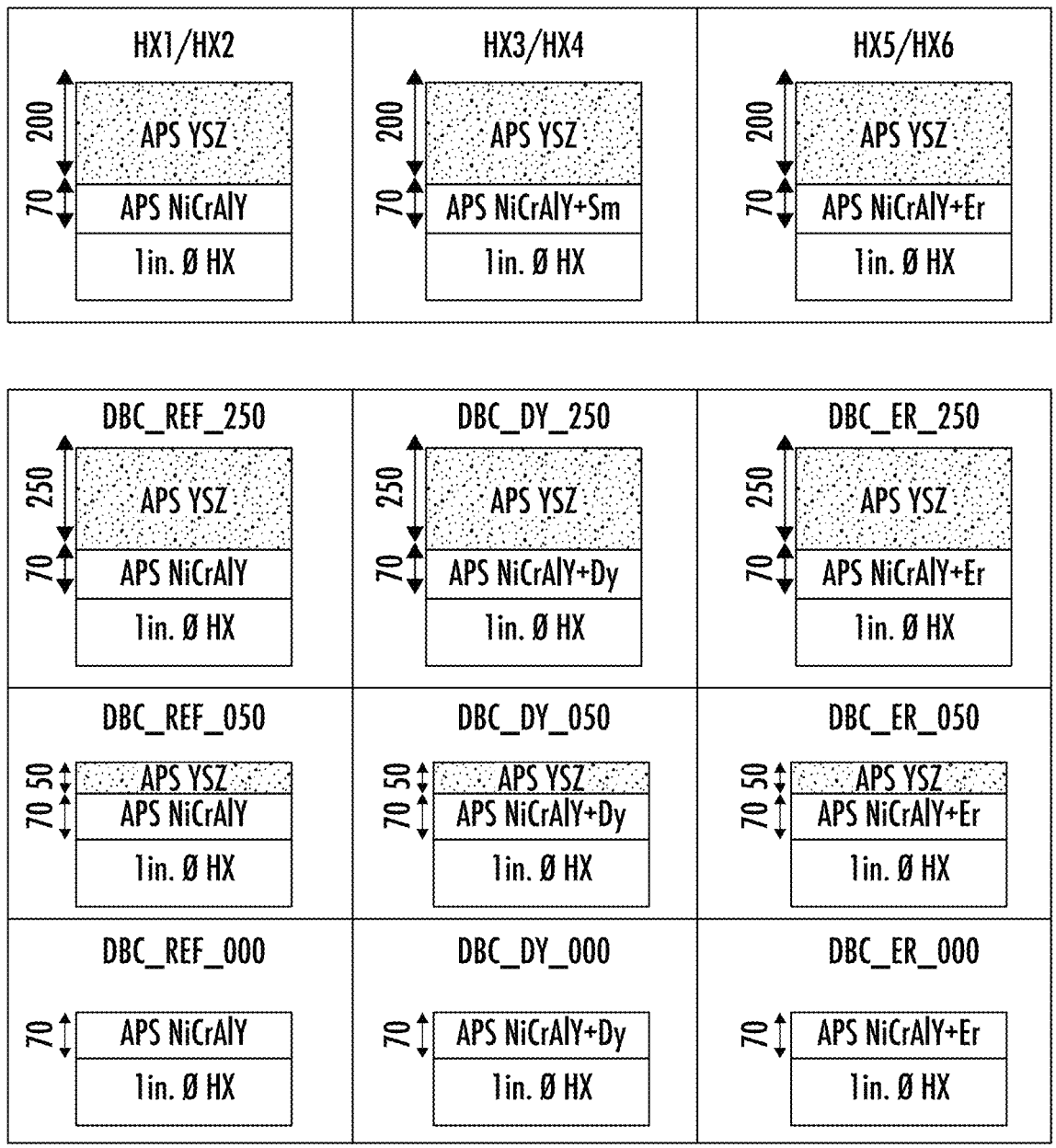
FIG. 18 is another table showing other examples of air plasma sprayed doped thermal barrier coating configurations.

Referring now to the table 210 in FIG. 16, there is shown an example composition to be synthesized as NiCoCrAlYDy and different compositional parameters at the YSZ layer for 8% $Y_2O_3$ and 92% $Zr_2O_3$ and the composition to be synthesized in this example as 97% NiCoCrAlY and 3% Dy. These values may vary from 5%, 10%, 15% or 20% as upper and lower values and all values in between these values. The requirements on the doped bond coat, may be about 30 micrometers ($D_{50}$) particle size for the spray to be fed properly and a minimum quantity of about 25 grams. The tables of FIGS. 17 and 18 show examples of the fabricated APS doped bond coat configurations, as non-limiting examples, with the table values in FIG. 17 corresponding most closely with the table values of FIG. 16. Different specimens are shown and example coupon dimensions. Reference samples use the same spray parameters.

Figure 19:
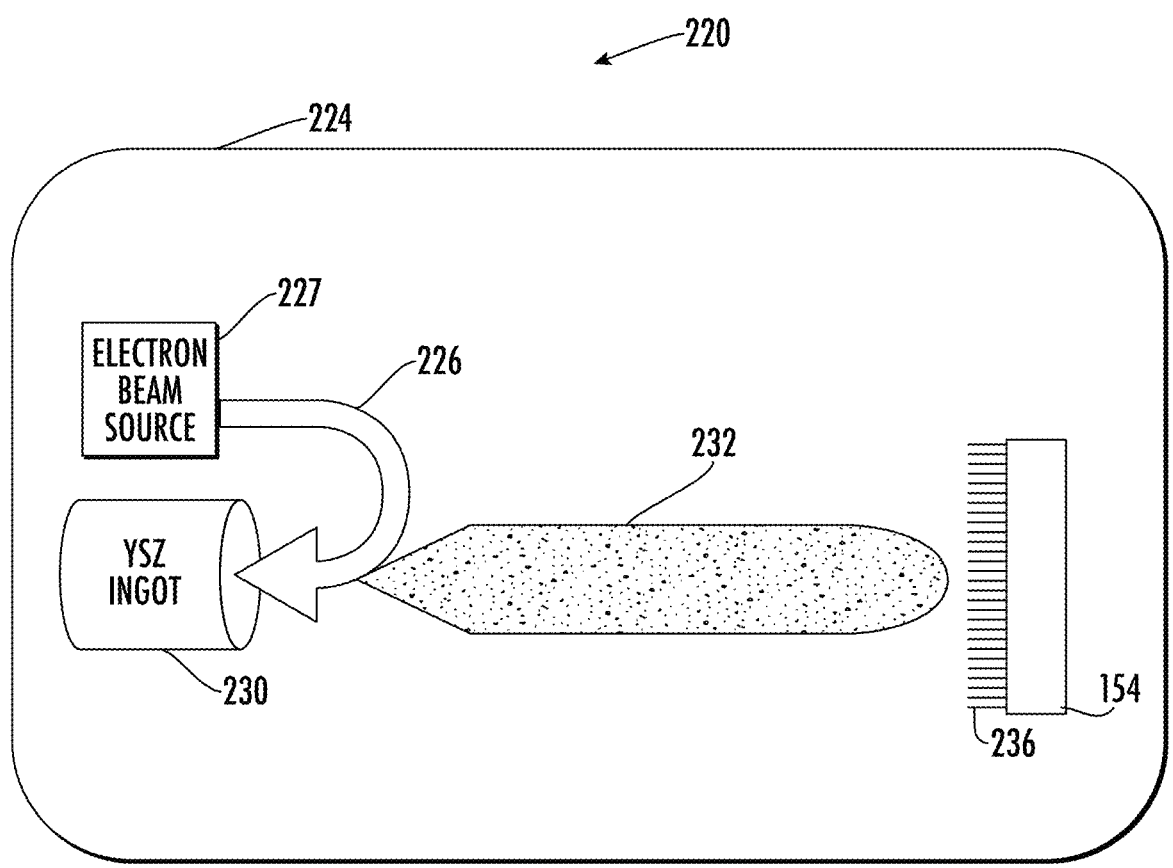
FIG. 19 is a schematic diagram showing an example of electron beam physical vapor deposition (EB-PVD) that may be used in accordance with a non-limiting example.

Referring now to FIG. 19, there is shown an example Electron Beam Physical Vapor Deposition (EB-PVD) device as a system at 220 and showing schematically the EB-PVD vacuum chamber 224 and an electron beam 226 injected into the YSZ ingot 230 from electron beam source 227 and forming an evaporation plume 232, which allows the columnar growth 236 on the preheated substrate 154, such as a turbine blade. The chemical bonding helps form the smooth bond coat surface with reduced oxidation under vacuum conditions, and imparts better control over the deposition rate and the resulting chemistry. The EB-PVD vacuum chamber 224 may be operable at about $10^{-6}$ $O_2$ atmospheres, and the substrate 154 preheated ($T_S$) to about 1000° C. The deposition rate may vary, but in one example, is about 10 μm/min (micrometers per minute).

Figure 20:
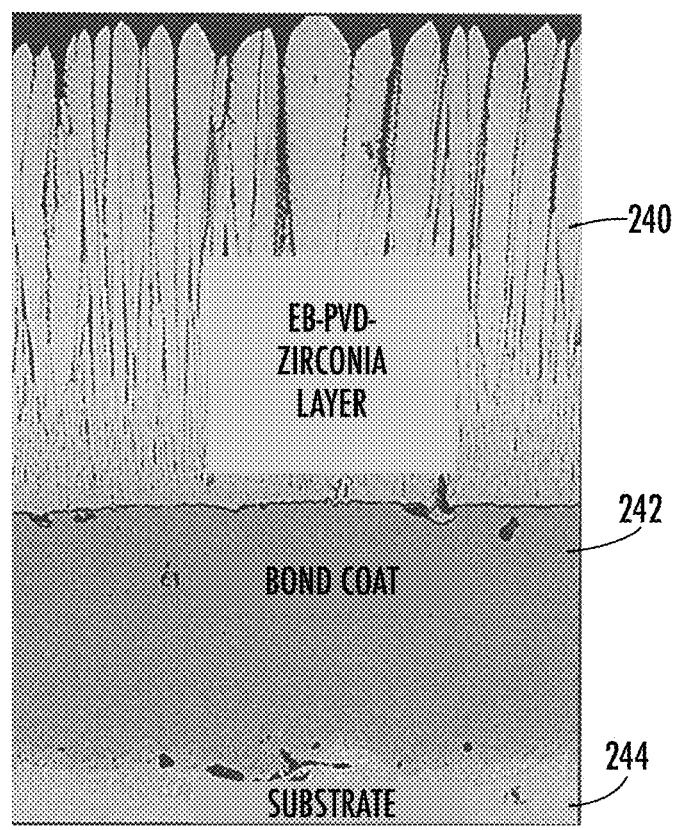
FIG. 20 is an SEM image showing the EB-PVD zirconia layer and bond coat on the substrate such as a turbine blade.

An example SEM image of a typical thermal barrier coating 238 produced by an example EB-PVD system is shown in FIG. 20 and shows an EB-PVD zirconia layer 240 and bond coat 242 on the substrate 244. Reference is made to Galetz, Mathias C., "Coatings for Superalloys," *Superalloys*, InTech, 2015, 277-298. This article explains generally the example layers.

Figure 21:
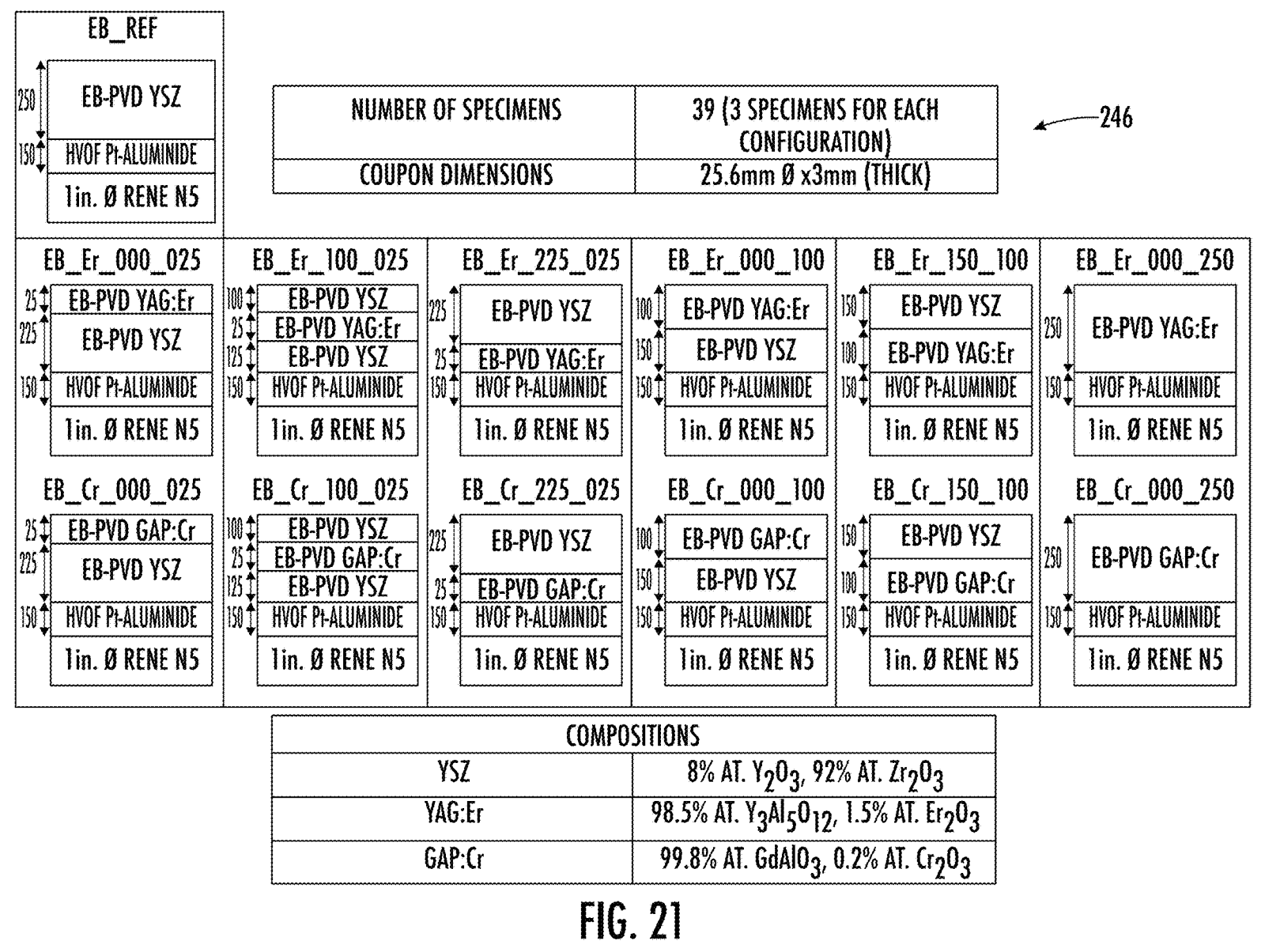

Referring to FIG. 21, there is shown a table at 246 for EB-PVD samples and the compositional analysis of the YSZ and YAG:Er and GAP:Cr. The table 246 illustrates the different specimens and the sensing layer as the EB-PVD YAG:Er or EB-PVD GAP:Cr and the sensing layer located on top of the top coat, below the top coat or within, or the whole bond coat.

The rare-earth doped bond coat configuration as described is effective to enable luminescence sensing at the thermally grown oxide. This configuration also allows for better control of thermal parameters, for example, in turbine engines, to operate them more efficiently with increased safety. This configuration allows for direct measurement at the thermally grown oxide layer that forms naturally in the thermal barrier coating. The top coat and the bond coat interface at the TGO layer, which is the location of interest for lifetime monitoring of thermal barrier coatings, may be monitored because the sensing layer may form naturally through high temperature oxidation. There is no requirement to modify the industrial deposition procedure and the integrity of the thermal barrier coating is conserved. No additional mechanical interfaces are required and no modification of the industrial top coat thermal barrier coating is required.

In the example of a gas turbine, the thermal barrier coating is formed on the turbine substrate and includes the bond coat, which includes a rare-earth luminescent dopant, and a Ytrria-Stabilized Zirconia (YSZ) barrier top coat over the bond coat. The Thermally Grown Oxide (TGO) layer at the interface of the bond coat and YSZ barrier top coat enables luminescence sensing of that TGO layer. In an example, the rare-earth luminescent dopant may be selected from the group consisting of samarium, erbium, dysprosium, and europium, but other rare-earth elements may be used and other dopant ions and materials, including transition metals.

Phosphor Thermometry Device for Synchronized Acquisition of Luminescence Lifetime Decay and Intensity on Thermal Barrier Coatings It is possible to include two or more dopants or ions and simultaneously collect multiple emission peaks, such as upon excitation by a laser pulse. A phosphor thermometry temperature measuring system as a device is shown generally at 250, in accordance with a non-limiting example (FIG. 22) and collects two emission peaks simultaneously, in this example of an Erbium and Europium co-doped Yttria-Stabilized Zirconia Thermal Barrier Coating (TBC), enabling extended temperature range and high precision of in-situ temperature assessments. The device 250 captures the luminescence lifetime decays and the intensity variations of both dopants, thus allowing testing with high sensitivity and extended temperature range capabilities for accurate measurements, up to the operating temperatures of turbine engines. In an example, the system 250 is portable and performs effective temperature monitoring on turbine engine materials and advanced innovative sensing coatings. The system 250 for testing generally includes a support 254 such as a cart for portability, a photomultiplier device such as a PMT (photomultiplier tube) power supply 258, laser power supply 260, oscilloscope 264, laser 268, IR camera 272, and first and second photomultiplier devices, in this example, photomultiplier tubes 274a, 274b (PMT1 and PMT2). A controller 280 is operative with these components and controls their operation and functions.

This system 250 extends the capabilities of phosphor thermometry by partitioning the luminescence signal and specific reflection of selected electromagnetic spectrum bands for the synchronous acquisition of luminescence decay from different electronic transitions. The system 250 may perform real-time high-temperature measurements on luminescent thermal barrier coatings (TBC) and extend the range of measured temperatures used in extreme environments, such that the system 250 may be configured for in situ operation and adapted for real life operation of gas turbine engines, for example.

The system 250 is capable of selectively partitioning the electromagnetic spectrum from an emitted luminescence signal and reflecting the separated luminescence peaks into the respective first and second photomultiplier devices as the photomultiplier tubes 274a, 274b in this example for individual luminescence decay acquisition. The system 250 collects distinct decay characteristics from multiple electronic transitions occurring in the same point of the probed material and provides data for more precise temperature measurements in extreme environments. In an example, the system 250 may use dichroic filters as explained later relative to the schematic diagram of FIG. 25, to split and reflect the luminescence signal into the first and second photomultiplier tubes 274a, 274b, which convert the received photons to a signal that is traced on the oscilloscope 264. The resulting decays may be computed via a program at the controller 280 that converts the decays to temperatures.

This system 250 enables higher and more precise temperature measurements and extends the temperature range over which those measurements may occur. Experimental results indicate the range of temperature may be extended from 25-900° C. to a greater range of 25-1100° C. with enhanced precision, using, for example, a YSZ:Er,Eu phosphor. The additional cost resulting from the addition of at least one photomultiplier tube, such as a second photomultiplier tube (PMT2) 274b in this example, and associated optics is small when compared with the cost of the entire system 250. This system 250 may be used as a substitute for current phosphor thermometry instruments or other devices, and it may replace alternative measurement techniques that use, for example, infrared or thermocouple technology, which may carry higher error levels in extreme environments.

In operation, during the measurement process, a single laser pulse emitted from the laser 268, for example about a 10 ns pulse, may suffice to obtain multiple decays that can be correlated to the temperature at one point. The controller 280 may be configured to process the data gathered at the oscilloscope 264 and retrace the temperature from luminescence.

The phosphor thermometry system 250 in this non-limiting example collects synchronized data of the luminescence decay and processes that data to obtain an intensity ratio as measured from the two independent emission peaks, such as emanating from an Erbium-Europium co-doped, Yttria-Stabilized Zirconia air plasma spray thermal barrier coating. Although experiments were accomplished on thermal barrier coatings applied by air plasma spray, other application techniques may be used, such as the EB-PVD system 220 described above. The system 250 may collect the luminescence emerging out of the doped layer up to 1100° C. with 50° C. incremental steps as an example, while the surface temperature may be concurrently measured. Higher resistances at the input of the oscilloscope 264 may amplify the signal-to-noise ratio and allow the system 250 to collect lifetime decays with a sufficient bandwidth up to 850° C. At higher temperatures, a limited response time may be compensated by the acquisition of a ratio of intensity between Erbium and Europium emission peaks, which may vary due to the faster quenching of Europium. As a result, the range of temperatures that may be accurately measured using rare-earth doped YSZ configurations are extended up to gas turbine engine operating temperatures.

The simultaneous acquisition of phosphor thermometry data may permit more precise measurements with extended temperature ranges using a high-sensitivity decay process, combined with a high detectability intensity ratio. The synchronized acquisition capabilities of this phosphor thermometry system 250 provides efficient in-situ temperature measurement options for turbine components that operate at high temperatures.

As noted before, the thermal barrier coatings protect the gas turbine components operating at high temperatures. These thermal barrier coatings are generally used in combination with active cooling systems that allow for temperature drops through the ceramic top coat, in the order of 1° C. $\mu m^{-1}$. Accurate measurement of the coating temperatures in such extreme environments ensures and maintains good gas turbine performance, ensures functionality of the system, and helps to predict the lifetime of the turbine blades. The temperature measurement uncertainty is preferably reduced to a few degrees at service temperatures because failure mechanisms are thermally driven, which may be important due to the extreme sensitivity of the growth rate of the thermally grown oxide to the temperature at the interface between a top coat and the bond coat. Thus, a sensor layer or coating for high temperature measurements is formed and integrated into thermal barrier coatings using the use of rare-earth doped yttria-stabilized zirconia to offer sensing capabilities.

Europium-doped YSZ (YSZ:$Eu^{3+}$) has excellent temperature sensitivity past its quenching temperature of about 500° C., and a visible luminescence and a longer room temperature decay time. Similarly, erbium-doped YSZ (YSZ:$Er^{3+}$) has a strong visible luminescence intensity, a shorter room temperature decay time, and a temperature sensitivity between room temperature and the elevated turbine operating temperatures. With a usable absorption band at about 532 nm and distinct emission wavelengths, both dopants are used together in this example in a co-doped configuration that combines their properties for accurate assessment of turbine blades and other components.

The system 250 as developed and explained with reference to FIG. 22 permits the luminescence produced by YSZ:$Er^{3+}$ and YSZ:$Eu^{3+}$ to be isolated and simultaneously collected. The data is doubled for precision, combining sensitivities of the dopants and extending the temperature range at which the system 250 may measure in situ the temperature on rare-earth doped YSZ thermal barrier coatings. Both the decay and intensity ratio processing techniques may be used to take advantage of the synchronized collection of two dopants. The tested sample in this example contained the sensing layer with its codoped europium and erbium at its top surface as shown in the configuration in FIG. 23, and the phosphor thermometry measurement was compared with infrared thermometry, and the configuration allowed for a stronger luminescence intensity from the sample.

Description of the Fabrication Process. Samples were fabricated using an SGT-100 (Praxair) spray gun at the air plasma spray (APS) facility of the Florida Institute of Technology. The materials and parameters used for the deposition of the layered configuration are given in Table 1 shown below. The thermal barrier coating configuration is shown at 300 in FIG. 23 and includes the metallic bond coat layer 304, and a ceramic top coat layer 306 on the bond coat. The ceramic top coat layer 306 includes an undoped layer 308, and doped sensing layer as the upper or top coat 312 for the sensing layer, and all positioned on and over the substrate 316, for example, a one-inch of CM247 alloy. Example dimensions are in micrometers, and in this sample, the doped upper layer as the doped sensing layer 312 was about 80 micrometers, the undoped layer 308 was about 250 micrometers, and the bond coat 150 was about 150 micrometers.

These dimensions may vary. For example, the doped sensing layer 312 may be about 70 to 90 micrometers and the undoped layer 308 may be about 230 to about 270 micrometers. In an example, the doped sensing layer 312 forms the top layer of the TBC over the undoped layer 308 and may be formed as an erbium-europium co-doped Yttria-Stabilized Zirconia (YSZ). The erbium concentration in the YSZ may be about 1.25 to 1.75 wt. %, and in an example, 1.5 wt. %. The europium concentration in the YSZ may be about 2.5 to 3.5 wt. %, and in an example, about 3.0 wt. %. The first photomultiplier device 274a may be configured to detect erbium spectral lines at about 545 nm and 562 nm. The second photomultiplier device may be configured to detect europium spectral lines at about 590 nm and 606 nm. All these values can vary by as much as 5%, 10%, 15% or 20% above and below the stated values and ranges and values in between those values.

TABLE 1

Materials and Parameters for the Air Plasma Spray Deposition

| Layer | Bond Coat | Undoped Top Coat | Doped Top Coat |
| --- | --- | --- | --- |
| Material (mixing percentages, given in wt. %) | NiCrAlY | YSZ | 66% YSZ + 17% YSZ-Er (1.5% Er) + 17% YSZ:Eu (3% Eu) |

TABLE 1-continued

Materials and Parameters for the Air Plasma Spray Deposition

| Layer | Bond Coat | Undoped Top Coat | Doped Top Coat |
|---|---|---|---|
| Thickness (μm) | 150 | 250 | 80 |
| Spray Distance (cm) | 10 | 7.5 | 7.5 |
| Current (A) | 802 | 902 | 902 |
| Voltage (V) | 43.3 | 43.7 | 43.7 |
| Argon (SLM) | 49.1 | 25.5 | 25.5 |
| Helium (SLM) | 20.3 | 20.8 | 20.8 |
| Feeding Wheel Speed (rpm) | 1.17 | 3.29 | 0.48 |

In an example, the substrate as a coupon and used for experimentation was formed as a 25.4 mm diameter and 3 mm thickness CM247 disk. The sample was grit blasted prior to depositing the bond coat layer 304. A stud was welded on the back of the substrate 316 to mount the sample on a deposition stage. NiCrAlY bond coat powder (NI-164/ NI-211, Praxair), 7-8 wt. % YSZ undoped top coat powder (ZRO-271, Praxair) and erbium- and europium-doped YSZ top coat powders, as produced by a solid state reaction from Phosphor Technology Ltd., were used for the deposition of the respective layers 304, as shown in the air plasma sprayed thermal barrier coating configuration 300 of FIG. 23, which includes the luminescent YSZ:Er,Eu layer 312. In this configuration 300 of FIG. 23, the dimensions are in micrometers (μm), and include the APS deposited YSZ:Er,Eu layer 312; APS deposited YSZ layer 308; APS deposited NiCrAlY bond coat 304; and the CM247 substrate layer 316, corresponding to a polycrystalline nickel superalloy often used for gas turbine blades.

An erbium concentration of 1.5 wt. % in the YSZ was chosen for optimal luminescence intensity. The europium concentration of 3 wt. % was chosen for high luminescence intensity and that amount limited dopant intrusiveness to prevent phase change. The amounts can vary by about up to 5%, 10%, 15% or 20%, and all values in between, and can range from 0.5 to 2.5 wt. % erbium to 2.0 to 4.0 wt. % europium in yet another example. The pre-processing doped YSZ powders initially had a smaller particle size ($D_{50}$<1 μm) and irregular particle shapes, and for that reason, the powders were mixed together with the undoped YSZ powder to ensure the flowability of the mixture and a good deposition rate for the uppermost layer. The particle size can vary. A feeding wheel as part of the deposition process had its speed decreased to obtain a constant deposition rate with reduced clogging. It was determined that a mixing ratio of about 1:2 for the doped powder and the undoped powder was optimal to obtain a good deposition rate, while maintaining sufficient doped material for luminescence intensity. The fabricated thermal barrier coating 300 was examined using scanning electron microscopy on its microstructure with secondary electrons and an accelerating voltage of 15 kV. The uninterrupted and successive deposition of undoped and doped YSZ layers ensured the uniformity of the overall top coat with no visible interface. The sample was annealed for 2 hours at 800° C. to remove possible luminescence quenching compounds.

Spectral Characterization of the Sample. The emission spectrum of the YSZ:Er,Eu sample was measured with a collection time of 1 ms using a fiber collection spectrometer (Pixis 100, Princeton Instruments) under a 15 mW 532 nm laser excitation. The probe had a focal length of 7.5 mm, a depth of field of 2.2 mm, a numerical aperture of 0.27, and a spot size of 200 μm. The Er-lines at 545 nm and 562 nm and the Eu-lines at 590 nm and 606 nm were observed. The co-doping may have introduced some level of reabsorption of the erbium lines due to the presence of europium that possessed an absorption band that excited the $^5D_1$ level and extended from 520 to 550 nm. This could ultimately result in a smaller intensity ratio between erbium and europium. In this experiment, the peak of erbium at 545 nm ($^4S_{3/2} \rightarrow {^4I_{15/2}}$) and the peak of europium at 590 nm ($^5D_0 \rightarrow {^7F_1}$) was chosen for luminescence intensity and decay measurements.

Figure 24:
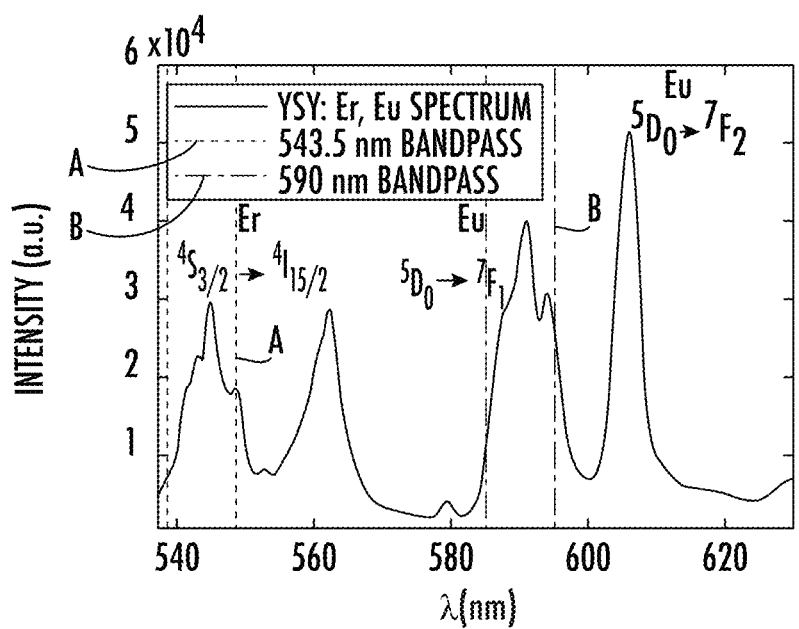
FIG. 24 is a graph showing the emission spectrum of YSZ:Er,Eu under 532 nm laser excitation and the range of wavelengths collected for the luminescence measurements.

The graph in FIG. 24 shows the emission spectrum of the YSZ:Er,Eu sample under 532 nm laser excitation, highlighting the two regions that were collected by the phosphor thermometry detectors and showing the 543.5 nm bandpass between the lines labeled "A," and the 590 nm bandpass between the lines labeled "B." The full width at half maximum of the bandpasses was represented to indicate the range of wavelengths collected for the luminescence measurements.

General Specifications of the Phosphor Thermometry Device. The phosphor thermometry device as shown in the block diagram of FIG. 22 is adaptable to many temperature sensor materials that have at least two emission peaks that can be isolated by dichroic filters. The device may be portable and mounted on a stable cart 254 (FIG. 22). The height may be adjustable by either lifting the top surface of the cart or individually lifting the example first and second photomultiplier tubes (PMTs) 274a, 274b, which are mounted on precision lab lift jacks 275 and fixed on a main optical breadboard 276 that is connected to the controller 280 in a non-limiting example.

Figure 22:
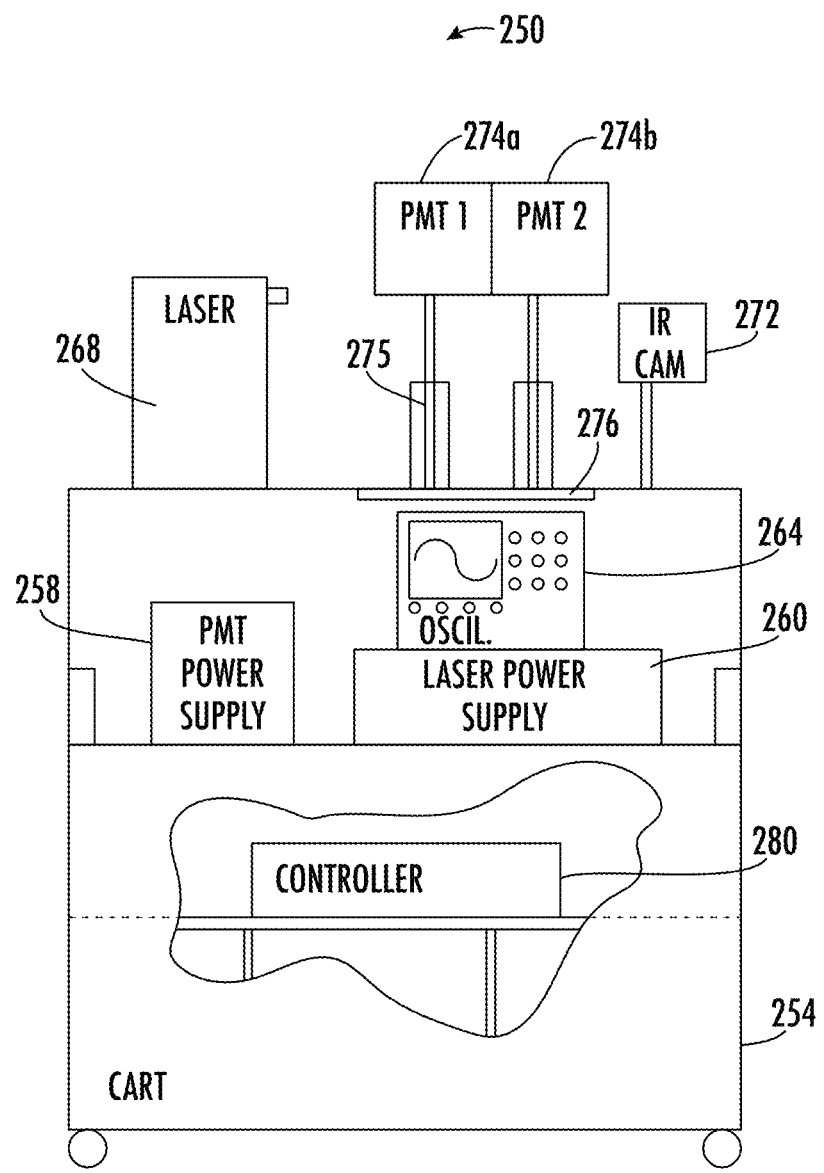
FIG. 22 is a block diagram of an example phosphor thermometry system for thermally grown oxide luminescence sensing in accordance with a non-limiting example.
Figure 23:
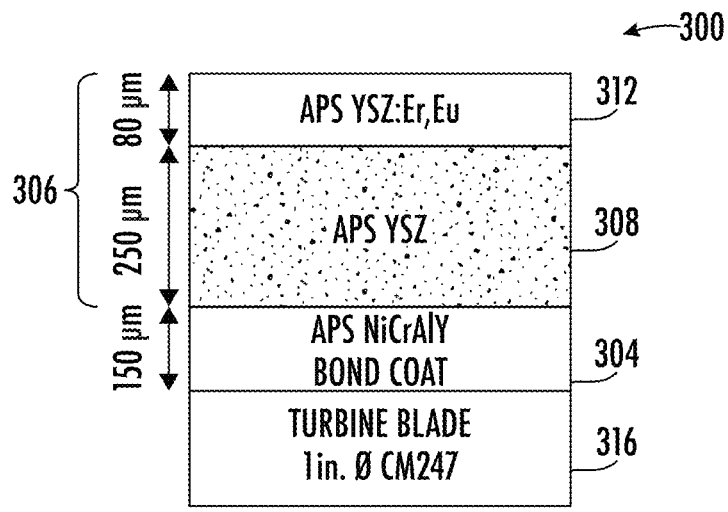
FIG. 23 is a schematic diagram showing deposited layers for a thermal barrier coating configuration that includes a luminescence layer of YSZ:Er,Eu.
Figure 25:
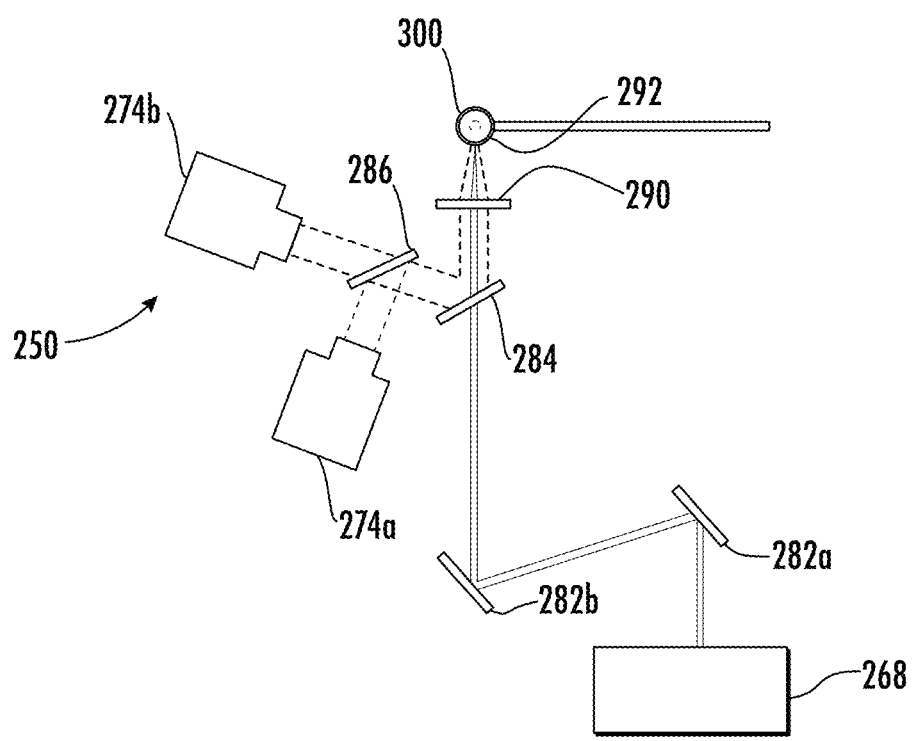
FIG. 25 is a schematic diagram of an example phosphor thermometry device that allows synchronized monitoring of luminescence in accordance with a non-limiting example.

A schematic block diagram of portions of the phosphor thermometry system 250 described in FIG. 22 is shown schematically in FIG. 25 and permits synchronized monitoring of luminescence from YSZ:Er,Eu. Similar reference numerals as used with reference to FIG. 22 are used in this description of the block diagram of FIG. 25. The system 250 is equipped with the YAG:Nd pulsed laser (CNI) 268 that provides 10 ns of laser output at a frequency of 10 Hz. The radiation emitted by the laser 268 may be a fundamental mode at 1064 nm, and in an example, includes a pulse energy of about 2 mJ. The light travels through a frequency-doubling potassium titanyl phosphate (KTP) crystal, for example, to generate 532 nm pulses on the order of 0.5-1 mJ. The 1064 nm and 532 nm beams are collinearly traveling through a lithium triborate (LBO) crystal to generate pulses at the sum frequency of 355 nm, with pulse energies up to 0.5 mJ. The first and second photomultiplier tubes 274a, 274b may be formed as two Hamamatsu R3896 tubes powered by the PMT power supply 258 (FIG. 22) as a single precision direct current power supply providing 15 volts and a maximum current of 90 mA for each detector. The maximum internal resistance of a gain control module of each PMT 274a, 274b was measured to be around 80 kΩ).

For this experiment, the 532 nm excitation was chosen and the 355 nm was stopped with a beam blocker. First and second 532 nm laser mirrors 282a, 282b adjusted the direction of the beam to the sample corresponding to the thermal barrier coating configuration 300 described relative to that sample shown in FIG. 23. After the laser beam was correctly aligned in the axis of the sample, a cyan dichroic filter 284 (FD1C-Thorlabs) was placed in the path of the beam so the angle of incidence (AOI) was 30°. This value was chosen because it lowers the reflection of the laser light on the cyan dichroic filter 284 and allows for a higher excitation intensity onto the sample 300. A magenta dichroic filter 286 (FD1M-Thorlabs) was then placed at an angle of incidence of 45° from the axis of reflection of the cyan dichroic filter 284. This allowed the convoluted luminescence of the co-doped sample 300 that was reflected on the cyan dichroic filter 284 to be split further into two spectral bands.

The shorter wavelengths containing the erbium emissions were reflected on the magenta dichroic filter 286 and directed to the first photomultiplier device as PMT1 (photomultiplier tube number 1) 274a located in the axis of reflection of the magenta dichroic filter. The longer wavelengths containing the europium emissions were transmitted through the magenta dichroic filter 286 to the second photomultiplier device as PMT2 (photomultiplier tube number 2) 274b, located in the axis of reflection of the cyan dichroic filter 284. The distance from the cyan dichroic filter 284 to the sample 300 was about 30 cm and the distance between the two dichroic filters 284, 286 was about 8 cm. For the collection of the decays, the two PMTs 274a, 274b were used simultaneously. On PMT1 274a, connected to channel 1 of the oscilloscope 264 (FIG. 22), a 543.5 nm (10 nm FWHM-Thorlabs) bandpass filter was placed in the viewing port of that detector. Because the wavelengths of the erbium emission at 545 nm and the excitation at 532 nm were close to each other, some laser leakage occurred due to laser reflections passing though the bandpass filter, which had a transmission and optical density of about 532 nm at 0.19% and 2.73, respectively.

Because the laser intensity was very high in comparison with the luminescence intensity, to better protect the first photomultiplier tube 274a and avoid the undesired collection of laser light, a longpass filter having an optical density of five (5.0) on the 190-532 nm range was added. On the second photomultiplier tube (PMT2) 274b, connected to channel 2 of the oscilloscope 264, a 590 nm (10 nm FWHM-Thorlabs) bandpass filter was mounted in the viewing port. To avoid direct exposure to intense laser reflections, prevented by the collection of external light, and to capture light traveling through the optical components of the system 250, a laser barrier panel was placed in front of the system. A viewing hole was extruded to insert an iris, opened to its maximum aperture (25 mm) and a 125 mm convex lens shown at 290, which converges the slightly divergent laser beam onto the sample 300. This arrangement resulted in a spot size of about 4 mm on the surface of the sample, placed at the focal distance of the convex lens 290, and allowed for the collimation of the luminescence light traveling to the detectors.

Figure 26:
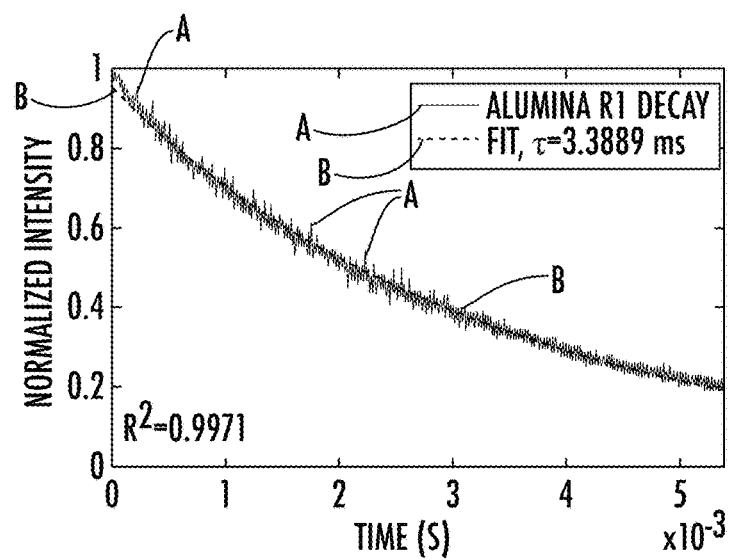
FIG. 26 as a graph showing the room temperature decay of the R1-line of alumina.

Initial Test. The system 300 was tested using a known R-line (ruby) emitted from an alumina block under a 532 nm excitation pulse. This experiment was performed at room temperature using a 694.3 nm bandpass filter (10 nm FWHM-Thorlabs) for the specific collection of the R1-line decay. The cyan dichroic filter 284 was used to transmit the laser beam to the sample 300 and to reflect the luminescence signal to the detector, which in this example is illustrated generally at 275, correspond to the PMT's. The resulting decay was fitted using a single exponential model and is shown in the graph of FIG. 26, illustrating the room temperature decay of the R1-line of alumina and showing the normalized intensity on the vertical axis and the time in seconds on the horizontal axis and the fit where T was equal to about 3.3889 ms.

Figure 27:
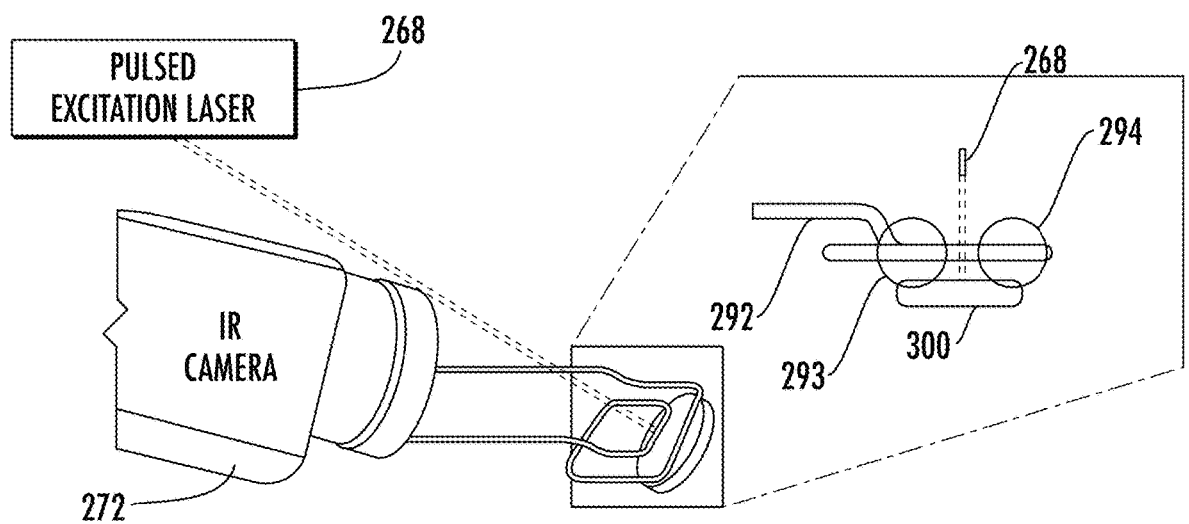
FIG. 27 is a schematic diagram of an induction heating system and a long-wave infrared camera for sensing thermal barrier coatings using the devices of FIGS. 25 and 25A in accordance with a non-limiting example.

High Temperature Setup. In this example, high temperature was achieved using an induction heater coil 292 (RDO HU2000), which produced the high frequency, pulsating magnetic fields to induce internal and circulating eddy currents in the sample material 300 causing resistive heating within the material. A frequency of about 272 kHz and a lift-off distance of 5 mm was used between the induction coil 292 and the surface of the sample 300, as shown in the schematic drawing of FIG. 27, illustrating a high temperature set-up using the induction principle and temperature control and a long-wave infrared camera 272 (FIG. 27). An enlarged view of the pulsed excitation laser onto the sample 300 shows the induction heating coil 292 and schematically the circulating eddy currents 293 and the magnetic field 294 and their location relative to the sample 300 having the thermal barrier coating. The resistive heating Q generated by the internal eddy currents is described by equation:

$$Q = \frac{1}{\sigma} \cdot |J_s|^2$$

where σ is equal to electrical conductivity and $J_s$ is the eddy current density generated by the magnetic field. In order to maintain the sample surface parallel to the induction heating coil 292 and normal to the horizontal path of the laser beam, a circular segment of the disk was cut-off so the sample can rest on refractory blocks. Temperature increments of 50° C. were achieved up to 1100° C. by increasing the power of the induction heating system. Phosphor thermometry data was collected at each temperature step. Induction heating was chosen for this experiment because it did not produce background thermal radiation that facilitated luminescence measurements.

Control of the Temperature Using Infrared Thermometry. The temperature was measured using a TIM450 (Micro-Epsilon) longwave infrared camera (7-13 μm) 272 operating at about 30 Hz and placed at 20 cm from the sample 300, which corresponded to the focal distance of the camera. The collection area was reduced to match the phosphor thermometry laser spot size. The camera 272 used a program referred to as "TIM Connect" thermography software to track the thermal radiation emitted from the sample. The emissivity was set to €=0.95 for all readings as this value corresponded to the emissivity of YSZ in the long-wave infrared range and did not vary noticeably with temperature.

Figure 25A:
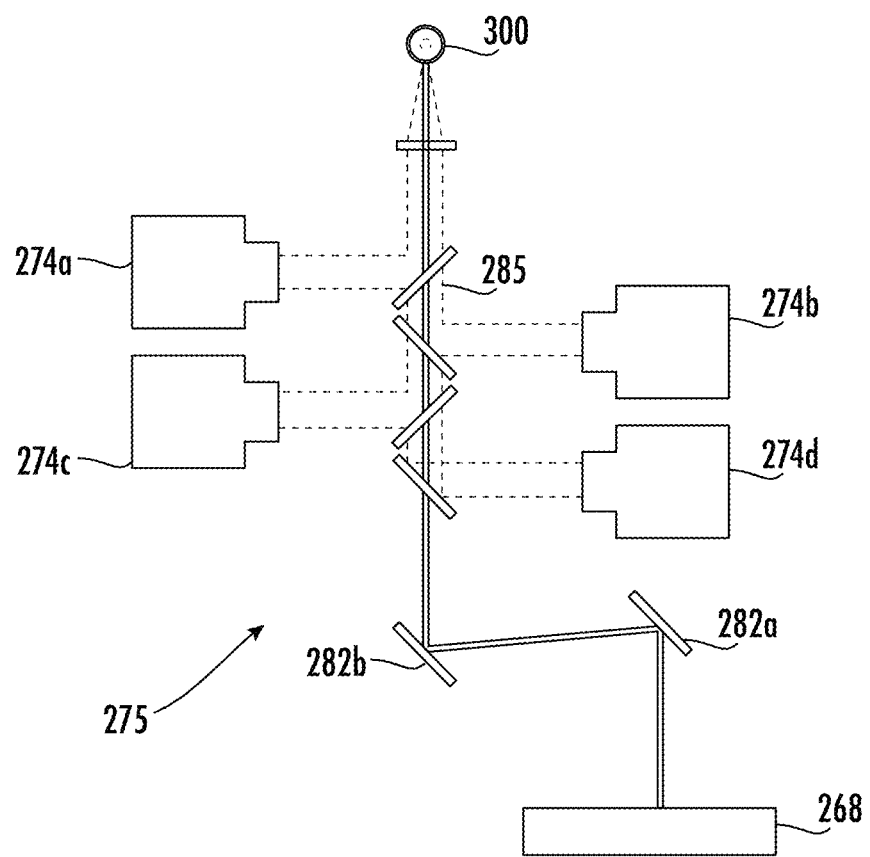
FIG. 25A is another example of a phosphor thermometry device that includes four photomultiplier tubes.

The description has proceeded with reference to the system 250 illustrated in FIGS. 22 and 25 that includes first and second photomultiplier tubes 274a, 274b. However, third and fourth photomultiplier tubes 274c, 274d may be incorporated into the system 250 as shown in the example system of FIG. 25A and include the bandpass filters at each photomultiplier tube 274a-d and additional dichroic filters 285.

Acquisition of Luminescence Decays. The luminescence decays of the erbium emission at 545 nm and the europium emission at 590 nm were captured simultaneously, using both first and second photomultiplier tubes (PMT1 and PMT2) 274a, 274b respectively. The Siglent SDS 1204X-E oscilloscope 264 converted the electric signal to data matrices. In front of the viewing port of PMT1 274a, the incoming light included a spectral band, which ranged in wavelength between 532 nm and 560 nm. It contained the luminescence emitted by erbium and the laser reflections. This light followed the optical path originating at the sample 300 surface, which was reflected on the cyan dichroic filter 284 with $R_{cyan,545\ nm} \approx 95\%$, and reflected on the magenta dichroic filter 286 with $R_{magenta,545\ nm} \approx 92\%$. The spectral band was narrowed to select the peak of erbium at 545 nm, using both a 543.5 nm bandpass filter and a laser cut-off longpass filter. In front of PMT2 274b, the incoming signal contained a spectral band with a wavelength range between about 560 nm and 720 nm. It contained the europium luminescence that emerged out of the sample surface and was reflected on the cyan dichroic filter 284 with $R_{cyan,590\ nm} \approx 100\%$, and transmitted through the magenta dichroic filter 286 with $T_{magenta,590\ nm} \approx 91\%$.

The specific luminescence emission peak of europium at 590 nm was selected by placing the 590 nm bandpass filter described before in the viewing port of PMT2 274b. To obtain a greater amplitude of the signal that facilitated the detection of the luminescence decay and increased the signal-to-noise ratio (SNR), fixed resistance loads were connected to RG58 coaxial cables that linked the PMT detectors 274a, 274b to the oscilloscope 264. Resistances of 50 kΩ and 5 kΩ were applied to the acquisition channels associated with PMT1 274a for erbium and PMT2 274b for europium, respectively.

Figure 28:
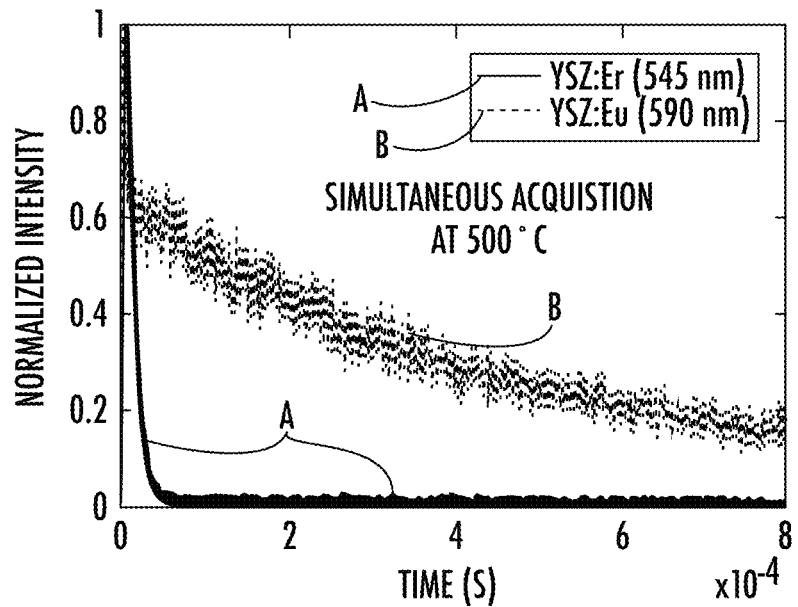
FIG. 28 is a graph showing the synchronized collection of erbium and europium decays at 500° C.

The graph shown in FIG. 28 shows an example of the simultaneous decay acquisition, captured at 500° C. and showing the long decay of europium (≈632 μs) compared to erbium (≈13 μs), and the higher noise of the europium decay due to the lower resistance value chosen for the acquisition. In this experiment, the amplitude of the signal was favored over the time response to enable the use of luminescence intensities up to the higher temperatures. By selecting these higher feedthrough resistances, the minimum lifetime decay that may be accurately measured was found to be about 6 μs for channel 1 and about 1.5 μs for channel 2.

Figure 29A:
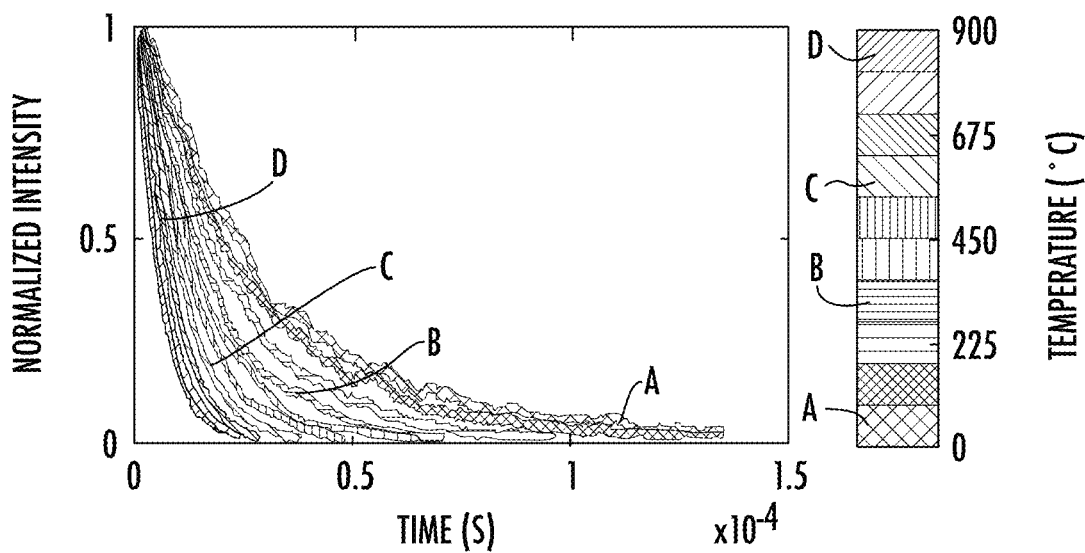
FIG. 29A is a graph showing an example of the luminescence decays of erbium with respect to temperature at 545 nm.
Figure 29B:
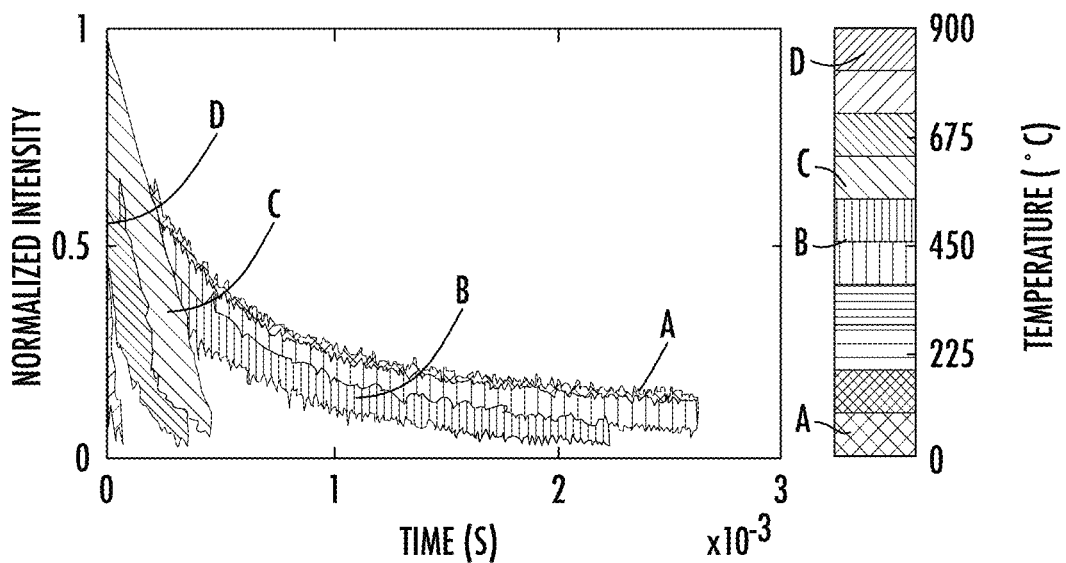
FIG. 29B is a graph showing an example of the luminescence decay of europium with respect to temperature at 590 nm.

After the completion of the experiment, the collected data was processed using MATLAB code that synchronized all decays so that t=0 corresponded to the start of the decay at all temperatures, as presented in the graphs of FIGS. 29A and 29B, showing the luminescence decays of an erbium emission at 545 nm (FIG. 29A) and europium emission at 590 nm (FIG. 29B). The MATLAB code used a single exponential model to fit the data of both decays. Even though the europium decay was shown to have a triple-exponential decay behavior, the single exponential model had been widely used because it offered a more robust fit for the temperature measurement using this phosphor.

Measurement of Luminescence Intensities. The use of first and second PMTs 274a, 274b and the high signal-to-noise ratio allowed for the comparison of the intensities at t=0, when the laser excitation pulse ended and where the luminescence intensity reaching the detectors was maximal. The first and second PMTs 274a, 274b received a reduced region of the spectrum that was passed by the bandpass filters and converted the photons to an electrical amplitude, measured in volts. The quantum efficiency of first and second PMTs 274a, 274b was expected to be slightly higher at 545 nm (≈20%) than at 590 nm (≈18%). For this experiment, the feedthrough resistance of channel 1, which collected the luminescence of erbium, was set to a higher value than the resistance of channel 2, as it allowed amplitudes exceeding one volt for both dopants. At room temperature, the integrated intensity of the luminescence of europium between 585 nm and 595 nm was found to be about 55% higher than the integrated intensity of erbium between 538.5 nm and 548.5 nm in the spectral ranges of the bandpasses. This was primarily due to the particular quantum yield of erbium and europium in YSZ, with the specific concentration and distribution parameters that were obtained for this sample.

The collected intensities were processed by the MATLAB code to subtract the growing thermal radiation background from the measurements, and average the intensity received by the PMTs 274a, 274b when laser excitation is off and no luminescence remains. This takes place typically before a new excitation pulse, which corresponds on the oscilloscope 264 window to the trace preceding the rise-time and decay. The ratio between the normalized intensities of the two dopants may be used for high temperature measurements, assuming that the spectral shift due to temperature is negligible in comparison with the spectral bandpass of the filters used for the collection of light. The integrated intensity measured by each of the two PMTs 274a, 274b is, in consequence, assumed to remain proportional to the peak intensity of each radiative transition.

Figure 30:
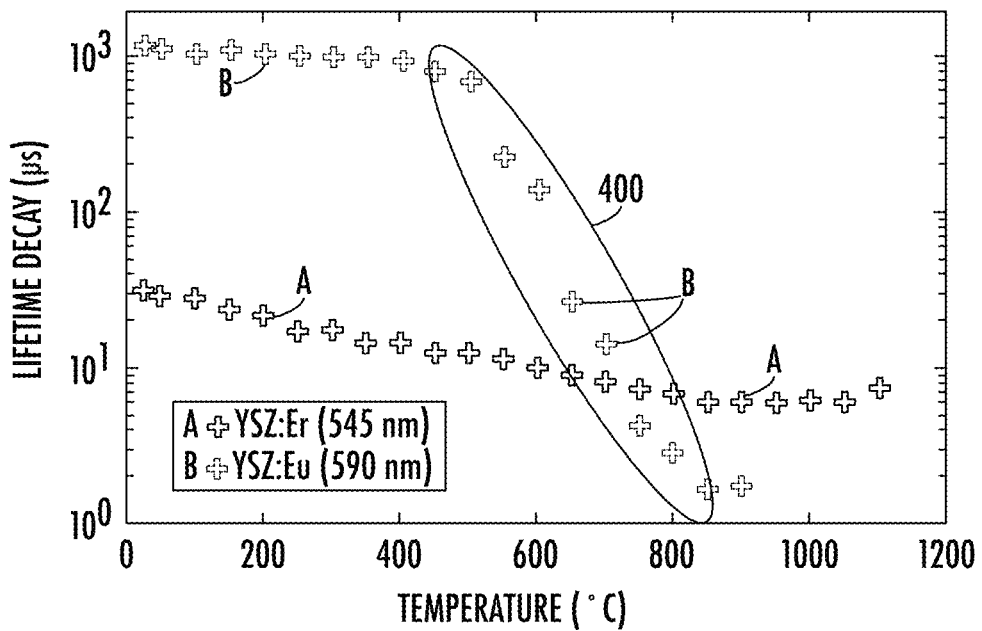
FIG. 30 is a graph showing the lifetime decay response of air plasma sprayed co-doped YSZ:Er,Eu and showing the high temperature sensitivity region.

Temporal Analysis. The independent luminescence decays were fitted at each 50° C. step and the graphs of the results are shown in FIG. 30, showing the lifetime decay response of the air plasma sprayed co-doped YSZ:Er,Eu. The error bars represented the standard deviation of three independent measurements that were performed with an identical setup, on three different locations onto the sample. It is evident that the decay of erbium at 545 nm is sensitive to temperature over the entire range of temperature from room temperature to 850° C. with a lifetime decay time at room temperature of about 31 μs. The decay of europium had a very high sensitivity in the range of temperatures in between the quenching temperature of the phosphor in YSZ (≈500° C.) and 850° C., with a lifetime decay time of approximately 1.2 ms at room temperature. The high temperature sensitivity region of the europium is shown by the enclosed region at 400.

The advantages of the co-doped configuration and simultaneous data acquisition of the decays was the extension of the temperature range on which the decay technique was applicable as the individual dopants have different maximum sensitivity temperature ranges. Past 850° C., the europium decay indicated a lifetime that stagnated around 1.5 μs, which corresponded to the detection limit of the system 250 on this channel as related to the resistance used for collection of the signal.

This inaccurate lifetime decay was generated by the limited response of the system 250 at high temperature. Reducing the resistance feedthrough on the channel may have reduced the response time, but it implied a significant degradation of the signal-to-noise ratio. A compromise between the signal-to-noise ratio and time-resolution may be selected for resulting high temperature phosphor thermometry. The sensitivity of the decay of europium appears to be high between 500° C. and 850° C., which corresponded to the luminescence quenching of the dopant into YSZ, due to the higher probability of a vibrational de-excitation past the quenching temperature. However, the sensitivity of the decay of europium outside this highly sensitive temperature range was close to zero. The combination of europium with erbium, facilitated by the temperature measuring system 250, allows for the extension of the range of temperature that can be measured using the decay technique due to the lifetime decay of Erbium, which may be differentiated for any temperature between room temperature and the turbine system operating temperatures in a non-limiting example.

Intensity Considerations. The luminescence intensity variation was measured and the ratio between the intensities of the erbium emission at 545 nm and the europium emission at 590 nm was measured, which were normalized with respect to their distinct room temperature intensity. This data was obtained to provide additional information for the temperature measurement using the phosphor thermometry system 250. The luminescence intensity was obtained by measuring the maximum of the amplitude of the luminescence decay, which was proportional to the amount of photons reaching each PMT 274a, 274b at the moment where the laser excitation pulse produced the strongest luminescence. As the temperature increased, it was determined that the luminescence intensity of both dopants initially increased, due to the thermal filling of the energy levels, and then decreased due to thermal quenching.

Figure 31:
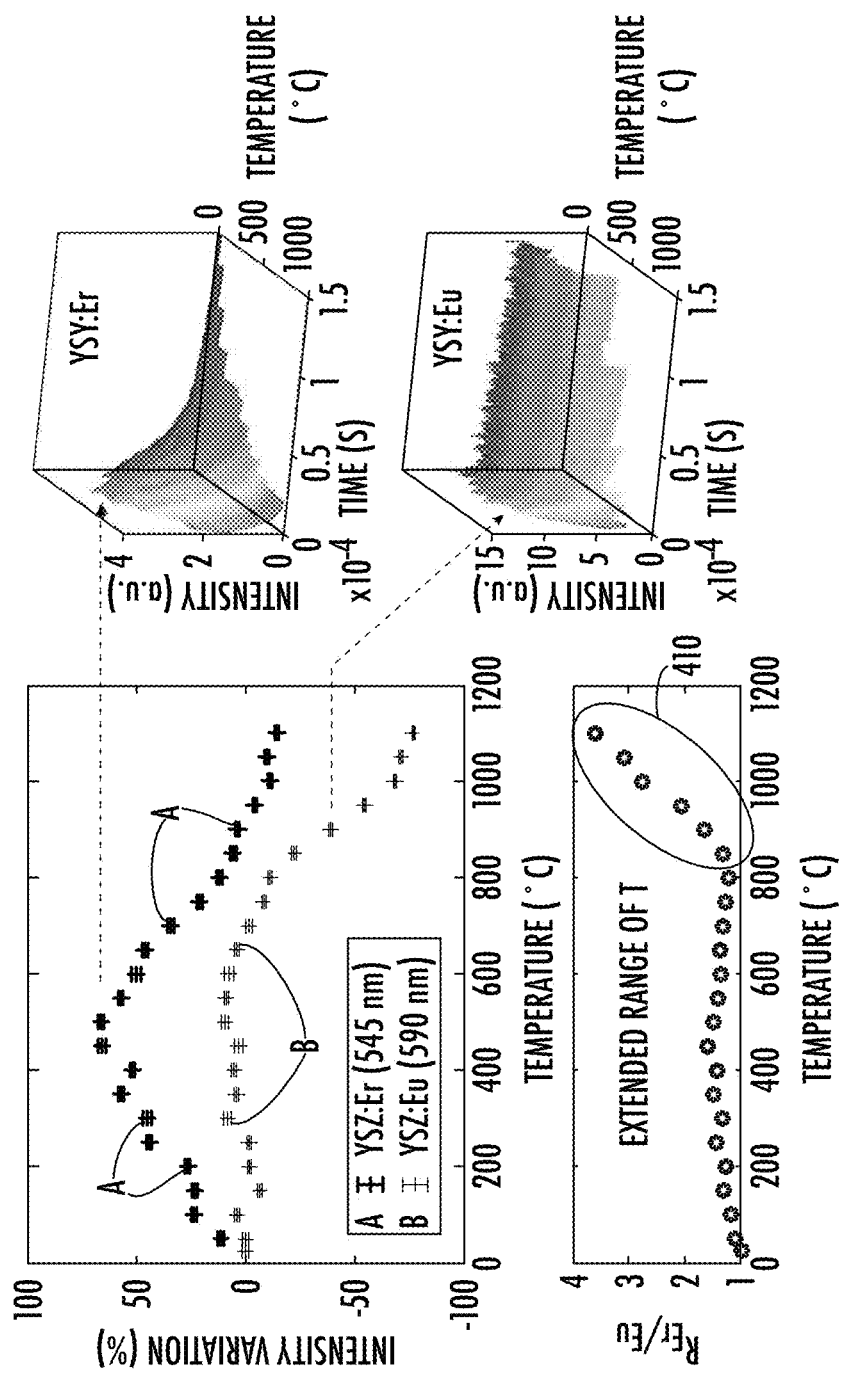
FIG. 31 is a composite graph showing the luminescence intensity variation with respect to temperature for erbium and europium dopants.

The growing thermal radiation, which spectral radiance can be predicted using Planck's law, provided a contribution to the overall intensity of which one part is the luminescence. The percent variation of the luminescence intensity for each dopant, with respect to the room temperature intensity, is shown in the composite graphs of FIG. 31, showing the percent luminescence intensity variation with respect to room temperature intensity for each dopant and the corresponding ratio and sensitive between 850° C. and 1100° C., and thus, usable for high temperature measurements. The error bars indicate the standard deviation of three independent measurements that were performed with an identical set-up, on three different locations onto the sample. It was also found that the ratio of the normalized intensity variation of erbium to europium, $R_{Er/Eu}$, had a sensitive range of temperature, usable from 850° C. up to at least 1100° C., as presented in the lower plot and showing the extended temperature range as defined by the enclosed portion at 410. The error bars indicate the propagation of error from the ratio of the intensity variation between erbium and europium. This is a result of the fast quenching of europium luminescence on this range compared to the luminescence of erbium, which remained strong, as shown in the three-dimensional plots to the right of the graphs. Although the lifetime decay of europium could not be accurately determined past 850° C. due to the limitation on the temporal resolution of the device, the high signal-to-noise ratio allowed for valid intensity measurements at higher temperatures.

Measurement Error Considerations. To evaluate the precision in the system 250 and obtain a representative response of the system with the YSZ:Er,Eu sample 300, three independent measurements were performed. The phosphor thermometry system 250 set-up remained unchanged while the sample and the induction coil 292 were translated normally to the laser to collect the luminescence signal from three different locations. The intrinsic temperature measurement uncertainty was implied by the use of infrared thermometry, whose accuracy is ±2% at high temperature. The material was brought to the desired temperature values for data collection using infrared thermometry as the reference to determine the power input of induction heating.

Another limiting factor when targeting a temperature for measurement was due to the gradient of temperature in the doped layer, created by the heat flux from the top surface to the bond coat 304 in the thermal barrier coating, but which direction was inverted due to use of the induction coil 292 that preferentially heated the metallic substrate and dissipated heat by convection at the free surfaces of the material. Furthermore, material characteristics varied with the position probed on the sample. For example, the random distribution of porosity affected both thermal and optical properties of the material and the irregularity of the doped layer thickness contributed to possible variations in the luminescence of the sample. A possible uneven distribution of dopant into the material may possibly intensify ion-ion interaction or the consecutive thermal cycling that results in intensity and lifetime decay variation when probing different locations onto the doped layer.

Uncertainty on the exponential fit may also be significant, in particular with europium, which typically exhibits a triple-exponential decay behavior. The precision of the measurements at 800° C. was found to be ±8° C. and ±3° C. using erbium and europium decays, respectively. In addition, a lab-scale prototype necessitated automated acquisition for calibration to reduce experimental errors.

The phosphor thermometry system 250 is operable for the synchronized data collection of the luminescence decay and intensity ratio measured from two independent emission peaks, coming from an erbium-europium, co-doped yttria-stabilized zirconia air plasma spray (APS) thermal barrier coating. The luminescence emerging out of the doped layer 312 (FIG. 23) was collected up to 1100° C. with 50° C. steps, while the surface temperature was concurrently measured using the longwave infrared camera 272. The high resistances at the input of the oscilloscope 264, chosen to amplify the signal-to-noise ratio, allowed the collection of lifetime decays with a sufficient bandwidth up to 850° C.

At higher temperatures, the limited response time was compensated by the acquisition of the ratio of intensity between erbium and europium emission peaks, which varied significantly due to the faster quenching of europium. As a consequence, the range of temperature that could be accurately measured using the rare-earth doped YSZ configurations was extended up to turbine engine operating temperatures. The simultaneous acquisition of phosphor thermometry data allowed more precise measurements on extended temperature ranges using the high sensitivity decay process combined with the high detectability intensity ratio process. Exploiting the synchronized acquisition capabilities of this novel phosphor thermometry system 250 provided efficient in-situ temperature measurement options for turbine components.

Figure 31A:
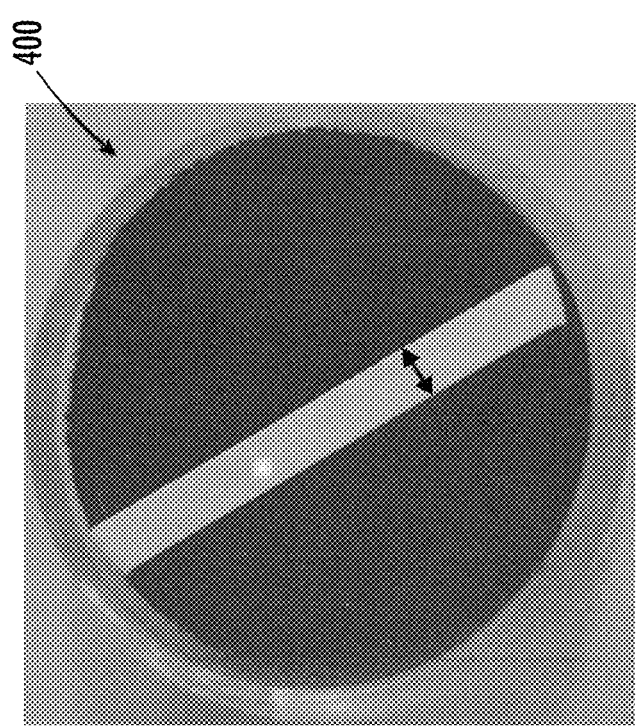
FIG. 31A is a sample showing convoluted luminescence of europium in accordance with a non-limiting example.
Figure 31B:
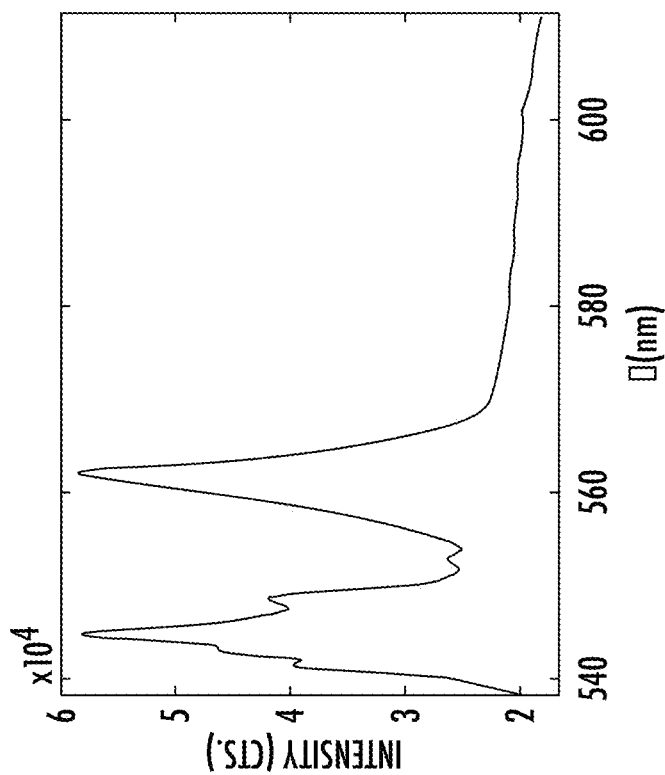
FIG. 31B is a graph showing the europium luminescence spectrum and highlighting two main peaks that can be separated and collected simultaneously such as using the devices of FIGS. 25 and 25A in accordance with a non-limiting example.

As shown in FIGS. 31A and 31B, it is possible to use a common phosphor for synchronous decay acquisition, such as an erbium doped thermal barrier coating. As shown in FIG. 31A, the coupon 400 has an erbium convoluted luminescence with a convolution spacing as illustrated of about 2.5 mm. The graph in FIG. 31B illustrates the erbium luminescence spectrum and highlights the two main peaks that can be separated and collected simultaneously to obtain the higher precision results than using a single peak.

Synchrotron XRD Measurements

Further development had been accomplished for verifying the coupons with the Inconel 738 substrate 316 and thermal barrier coatings as the NiCoCrAlY bond coat 304 (FIG. 23), and a YSZ top coat and a layer of YSZ and YSZ:Eu mixture in three configurations using the air plasma spray (APS) process. Two multilayered thermal barrier coating configurations were produced with the first having the doped layer at the top of the undoped YSZ, and the second at the top of the bond coat 304. Both configurations were fabricated along with the regular thermal barrier coating configuration as a reference.

Synchrotron XRD measurements were taken at room temperature and under a single flight thermal load up to 1100° C. The spatial distribution of residual strain in the YSZ layer of top coats of all the TBC configurations was quantified from the XRD data. The effect of the introduction of the doped layer in the top coat of the TBC was evaluated. Introducing the doped layer at the top of the bond coat did not strongly affect the strain distribution, but the doped layer at the top surface slightly altered the strain distribution in the YSZ layer. The strains at the surface of the TBCs were released upon heating. In all the configurations, tensile in-plane residual strain was measured due to the tensile quenching effect. The residual strain distributions in the as-deposited TBCs indicated that the introduction of the doped layer did not affect the overall mechanical integrity of the coating.

Quantifying Thermal Barrier Coating Delamination Using Luminescence Modeling Tracking damage and monitoring the integrity of thermal barrier coatings over their lifetime prevents engine failure for gas turbines, reduces maintenance costs and increases turbine system efficiency. It is possible to apply infrared thermography to reveal delamination progression on a thermal barrier coating using the modified Kubelka-Munk model. It has been determined that luminescence-based imaging is an efficient delamination detection technique when doping the ceramic top coat with luminescent rare-earth ions using the modified Kubelka-Munk model. This process allows for high-contrast and high-resolution delamination mapping to better monitor the integrity of engine components that are exposed to extreme environments. Delamination monitoring is achieved through the tracking of luminescence intensity, to highlight areas of enhanced reflectance, corresponding to damaged locations. It is possible to quantify luminescence contrast and detect early stages of delamination and crack propagation using a shorter wavelength than those used in other infrared techniques. The model evaluates delamination progression on luminescent multilayer thermal barrier coatings.

Significant and unpredictable delamination on thermal barrier coatings may be caused by foreign object damage. For that reason, it is desirable to accurately predict the advancement of delamination on multilayer thermal barrier coating configurations. In accordance with the non-limiting example, a 2×2-flux modified Kubelka-Munk model may be used to estimate the luminescence intensity variations that are caused by local delaminations on these multilayer sensing coatings. The change in diffuse internal reflectivity due to the formation of an air gap at the interface between the top coat and the bond coat may be used to characterize the delamination areas. To validate the results of the model experimentally, an artificial delamination was created by Rockwell indentation on two distinct sensing layer configurations, experiments conducted, and results validated.

Figure 32A:
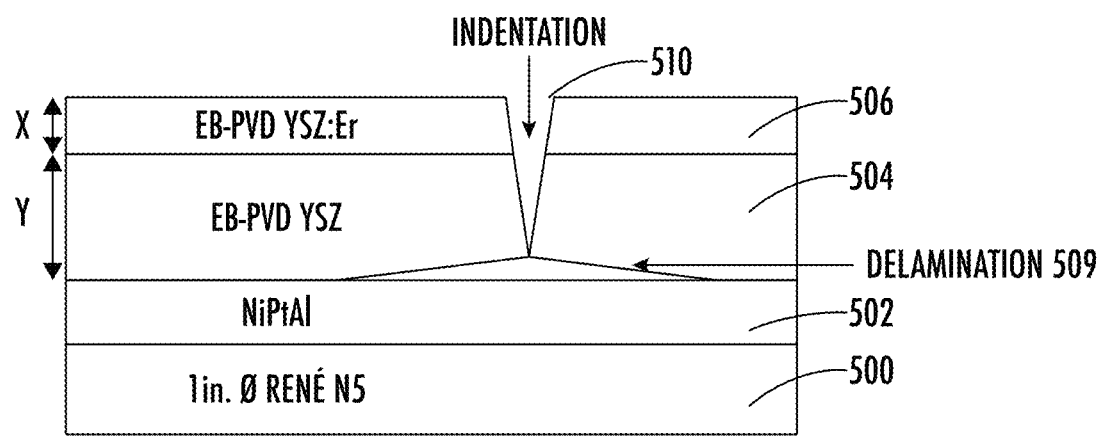
FIG. 32A is a sectional schematic view of the thermal barrier coating with the doped layer at the top surface and showing a delamination.
Figure 32B:
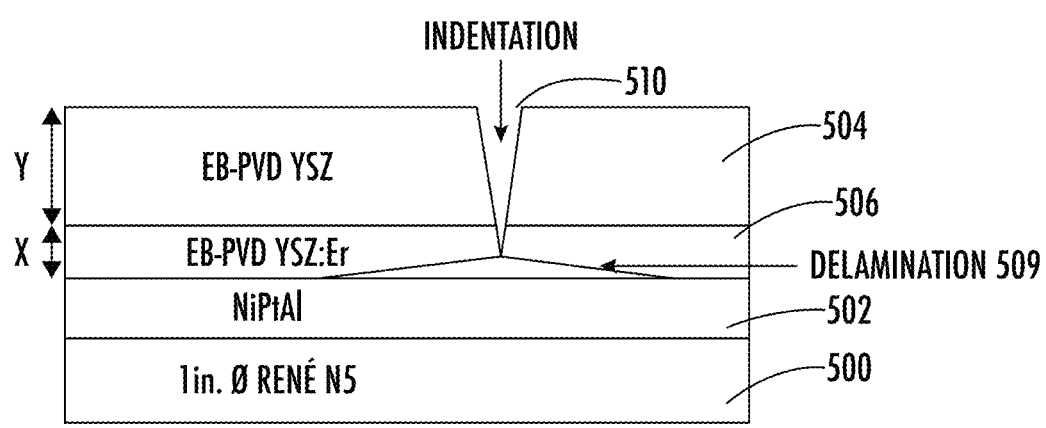
FIG. 32B is a second example of the thermal barrier coating similar to that of FIG. 32A but showing the doped layer at the bottom of the top coat and showing a delamination.

Coating Manufacturing. The model outcomes were supported by concurrently fabricating two luminescent thermal barrier coating sample configurations that embedded a YSZ:$Er^{3+}$ layer as shown in FIGS. 32A and 32B. Both configurations show a substrate 500 formed from one inch Rene N5 material as a nickel-based superalloy. A NiPtAl bond layer 502 is applied over the substrate 500 and an undoped YSZ layer 504 as a top coat is applied on the bond layer (FIG. 32A). Both configurations of FIGS. 32A and 32B include a doped YSZ:Er layer 506. The doped layer 506 is at the top surface (FIG. 32A) of the top coat 504, but the doped layer 506 may be at the bottom of the top coat 504 (FIG. 32B). The samples were formed from the Rene N5 superalloy substrate 500, the NiPtAl bond coat 502, a standard 125 μm, 8 wt % yttria-stabilized zirconia (YSZ) Electron-Beam Physical Vapor Deposition (EB-PVD) thermal barrier coating 504, and the additional 12.5 μm undoped EB-PVD layer for subsurface delamination sensing having 0.8 mol % erbium-doped YSZ 506. The total amount of rare-earth stabilizer was kept constant at 8 wt % to ensure the prominence of the metastable tetragonal phase of zirconia. For the first sample shown in FIG. 32A, the doped layer 506 was deposited over the undoped top coat layer 504 as illustrated.

Placing this sensing layer 506 as the doped layer as the top of the thermal barrier coating 504 increased the intensity of the luminescence that can be collected by a detector, which facilitated data acquisition. This configuration in FIG. 32A also avoided direct interaction between the bond coat 502 and the sensing layer 506, therefore avoiding large uncertainties on interface properties in comparison with industry standard bonding properties. The sensing layer as the doped top layer 506 is placed at the top, and thus, becomes the upper surface of the thermal barrier coating and may also be used to indicate erosion because that sensing layer is directly exposed to extreme engine environments.

For the second sample shown in FIG. 32B, the doped layer 506 was placed at the lower side of the undoped coating 504 and interfaced with the bond coat 502. This coating configuration provided a better luminescence intensity contrast for delamination assessment because the signal originated from the region that was impacted the most by the change in reflectance below the undoped coating 504. Because the as-deposited EB-PVD coatings were oxygen deficient, both samples were annealed at 1000° C. for 3 hours in air. This helped hold the crystallinity and remove compounds containing the hydroxy group that could quench luminescence.

In this example, the doped layer 506 is about 12.5 micrometers (X), but can vary from 10.0 to 15.0 micrometers, and in another example, vary by 5%, 10%, 15% or 20% from the 12.5 micrometer dimension and any values in between. The undoped layer 504 is shown as 125 micrometers thick (Y), but can vary from 110 micrometers to as high as 150 micrometers, and in another example, may vary by 5%, 10%, 15% or 20% from the 125 micrometer dimension and any value in between those values.

Figure 35A:
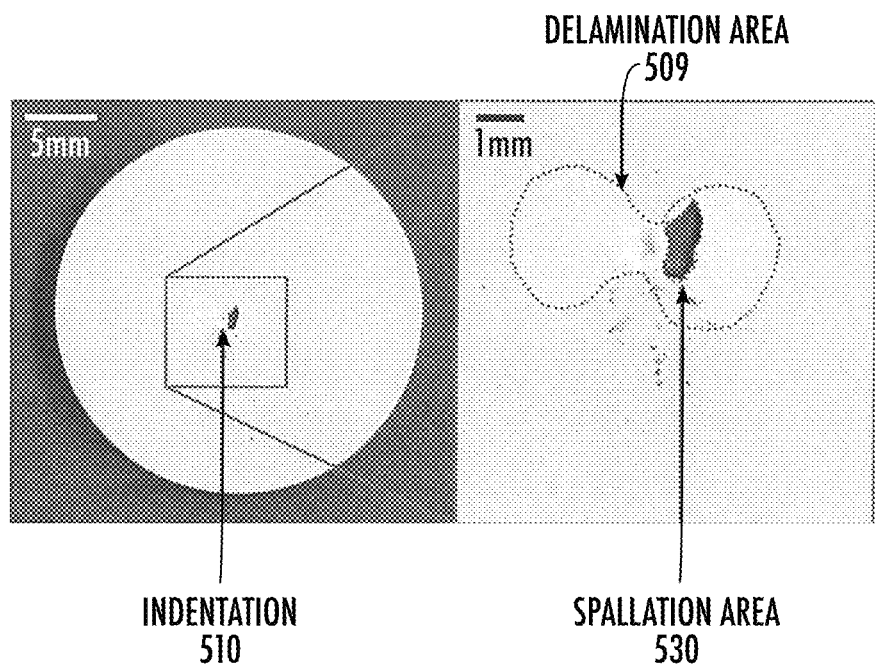
FIG. 35A is a photograph of a thermal barrier coating with Rockwell indentation-induced delamination or spallation areas and corresponding luminescence intensity maps of the europium line at 562 nm with the doped layer at the top surface.

An artificial delamination 509 was created by Rockwell indentation 510 on both first and second samples. For the first sample (FIG. 32A), a 2.45 kN load was applied normal to the surface and resulted in an observable spallation of the coating at the indentation spot, and delamination of the surrounding area of about 12 mm². This spherical indentation load resulted in a central impression spreading to a butterfly, wing-like area resulting from anisotropic inelastic deformation of the substrate (FIG. 35A). For the second sample (FIG. 32B), a 1.96 kN load was applied and resulted in a lower lateral extent of delamination of the surrounding area of about 7 mm². Both delamination areas as generated by Rockwell indentation were intended to replicate foreign object damage and produced a visible contrast to the naked eye, suggesting a coating that buckled with a micron-sized delamination width.

Figure 33:
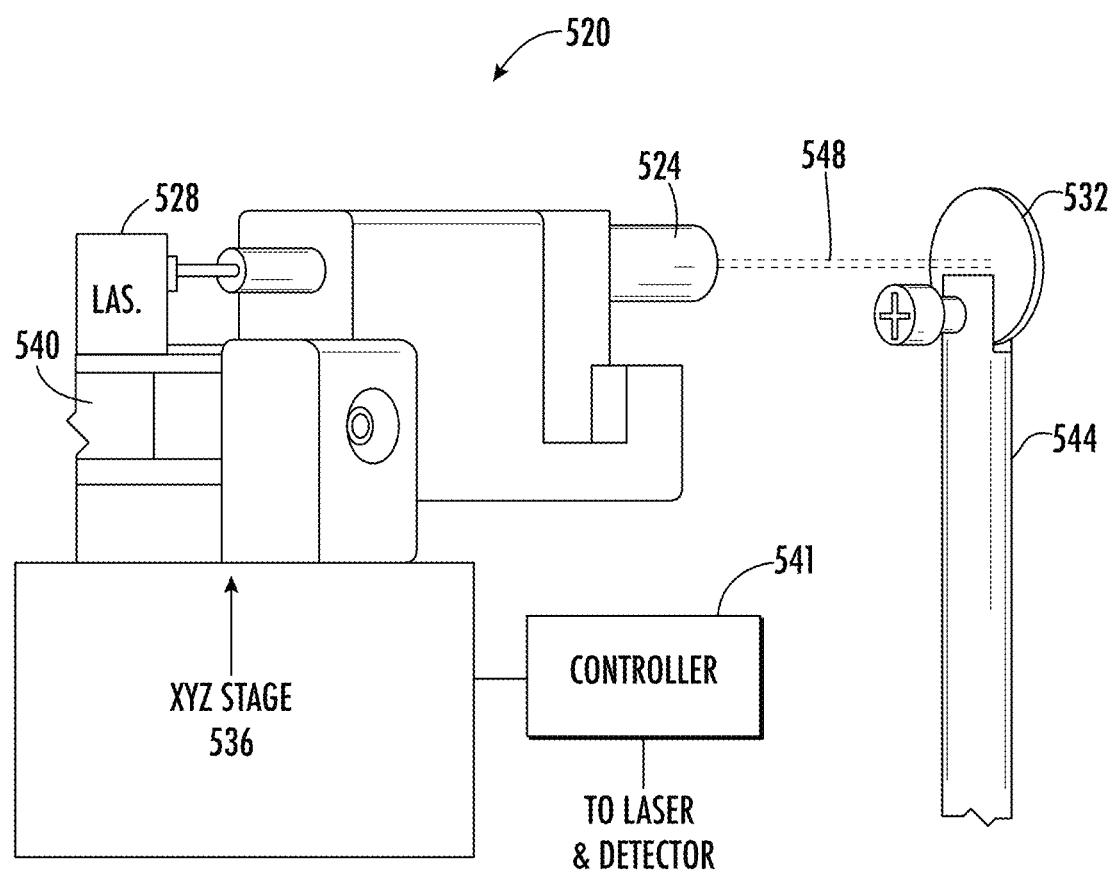
FIG. 33 is a block diagram of an example delamination monitoring system using luminescence contrast.

Photoluminescence Measurements. Spectral acquisition was accomplished using a photoluminescence piezospectroscopy system 520 as shown in the schematic diagram of FIG. 33 for the system. The system 520 included a fiber collection spectrometer 524 (Pixis 100, Princeton Instruments), as a collection probe or detector, operating under a 15 mW, 532 nm laser excitation from laser 528. The collection probe 524 had a focal length of 7.5 mm, a depth of field of 2.2 mm, a numerical aperture of 0.27, and a spot size of 200 μm. The probe 524 was capable of fast scanning over the surface of the sample 532 using an XYZ stage 536 with the collection probe 524 and the laser support 540 mounted on the XYZ stage. A controller 541 is operative with the XYZ stage 536, laser 528, and detector as the spectrometer 524 for coordinating their operational functions and collecting and processing data. This system 520 was used also for damage identification via piezospectroscopic stress evaluation, using the R-line emission of α-$Al_2O_3$ to obtain spectral characteristics, intensity ratio, stress quantification, and other data by comparing rare-earth emission spectra over the probed area.

This system 520 characterized thermal barrier coating stress using luminescence from the thermally grown oxide (TGO). It is possible to incorporate a rare-earth ion such as from the bond coat as explained before. The wavelength range was adjusted to 540-580 nm to collect the Er-lines and the system 520 was calibrated using a mercury lamp. The thermal barrier coating samples as configured in FIGS. 32A and 32B were mounted on a vertical support 544 and aligned normally to the laser beam 548. The spectral intensity was recorded over the surface of the samples at spatial step increments of 200 μm. The emission peak at 562 nm, corresponding to the transition $^4S_{3/2} \rightarrow ^4I_{15/2}$ of erbium, was fitted using a pseudo-Voigt model and a linear baseline removal. For larger area measurements, it was possible to image directly and use a bandpass filter for faster data collection time.

Model Formulations. The modified Kubelka-Munk model as explained above was used as the radiative transport model for high scattering media and numerical estimation of light intensity distribution. This model evaluated laser excitation and luminescence emission intensities and quantified delamination-induced luminescence contrast in thermal barrier coatings. For a given incident laser excitation intensity on the top surface of the thermal barrier coating, the luminescence intensity emerging out at the top surface and emitted from the sensing layer was calculated based on the diffuse internal reflectivity in the coating and the absorption and the scattering properties, taken at the specific excitation and emission wavelengths.

Figures 34A, 34B:
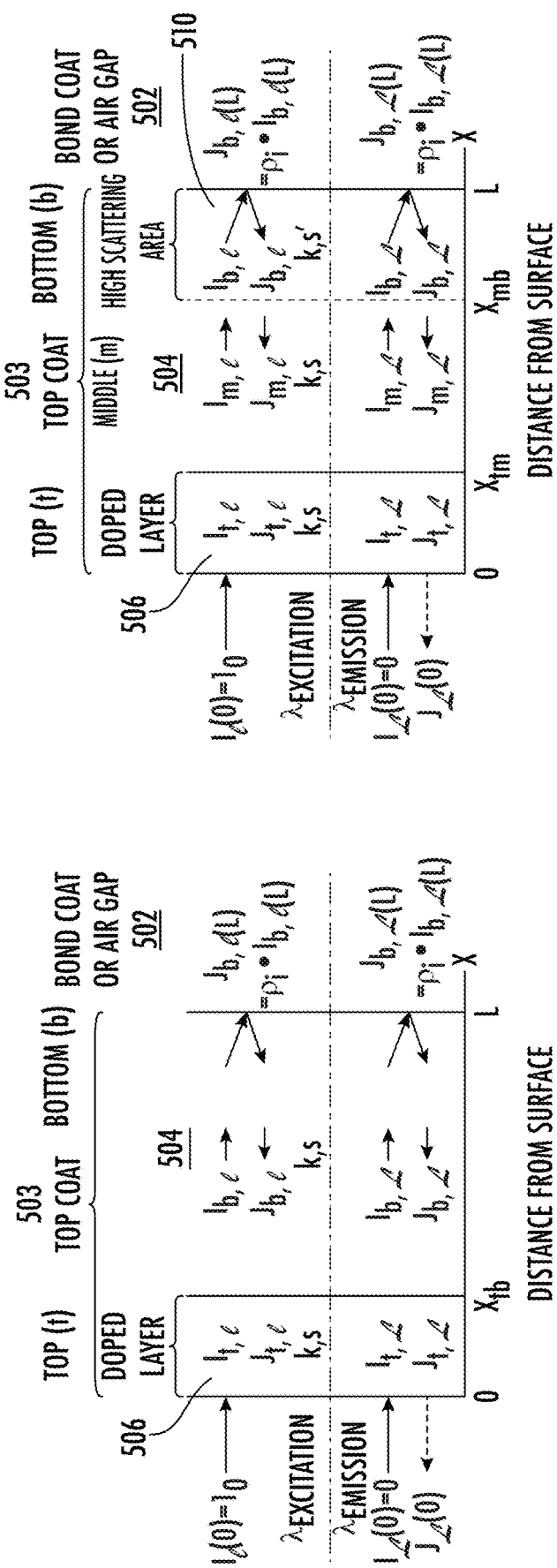
FIG. 34A is a diagram showing a first modified Kubelka-Munk modeling approach and boundary conditions to model laser and luminescence intensities in thermal barrier coatings.
FIG. 34B is a diagram showing a second modified Kubelka-Munk modeling approach to solve for laser and luminescence intensities and accounting for a high scattering zone close to the bond coat in thermal barrier coatings.

In accordance with a non-limiting example, two model cases were evaluated as shown in FIGS. 34A and 34B. The first model (FIG. 34A) considered the thermal barrier top coat 503 containing two layers, i.e., the sensing layer as the doped layer 506 and the regular undoped layer 504 as the undoped YSZ and having the configuration similar to that shown in FIG. 32A. The bond coat 502 was adjacent the undoped layer 504, but could be an air gap in this example. The sensing layer 506, which contained low levels of dopant, was assumed to include the same optical properties as standard undoped EB-PVD YSZ, such as corresponding to the undoped layer 504. The ceramic top coat 503 formed by the YSZ was assumed to be isotropic. This first model provided an initial approximation, but some low dopant concentration and agglomeration may have resulted in a substantial modification of absorption and scattering properties. These numerical estimations using the isotropic assumption were expected to accord with real conditions and in relatively homogeneous microstructures, such as plasma spray coatings.

For EB-PVD coatings, the assumption on uniform scattering and absorption coefficients through the thermal barrier coating thickness was addressed due to the waveguide-like scattering produced by the widening columnar microstructure that formed from small equiaxed grains at the base of the top coat 503, where scattering was expected to be much stronger than near the coating surface. Therefore, the second model as shown in FIG. 34B focused on creating more accurate quantitative predictions, and incorporating three layers in the top coat 503 that included a high scattering area 510 adjacent the bond coat 502 to account for the well-defined two-zone anisotropic microstructure of EB-PVD coatings and for the luminescent layer.

A representation of the Kubelka-Munk model shown in FIG. 34A included boundary conditions and definitions and included the doped layer 506 as the top surface of the thermal barrier coating, and more particularly, over the undoped EB-PVD YSZ layer 504. In this model, light traveled along the x-axis, corresponding to the normal to the surface of the thermal barrier coating, in two opposite directions. The light vector component directed towards the bond coat 502 was denoted by I and the light vector component directed back to the top surface of the thermal barrier coating was denoted by J as shown in both FIGS. 34A and 34B. The 2×2-flux model differentiated both excitation and emission wavelengths to solve for the laser and luminescence intensities separately. Similarly, generalized absorption and scattering coefficients had been established, k and s, respectively, and defined for a specific wavelength (labeled A).

It should be understood that many of the high-level mathematics used in the model are summarized below in general terms since the details are not necessary for understanding and also representative equations and matrices set forth in FIGS. 34C to 34J. Those skilled in the art will readily appreciate that high level mathematics are not necessary for understanding the modeling applied to the processing for determining delamination in these examples. The column vector $Y_\lambda(x)=[I_{t,\lambda}(x)\ J_{t,\lambda}(x)\ I_{b,\lambda}(x)\ J_{b,\lambda}(x)]^T$ defined radiation intensities and a matrix was established to determine optical properties in a specific layer z (top layer z=t or bottom layer z=b) (FIG. 34C). The intensity of laser light as a function of the depth in the coating was then calculated. The luminescence was assumed to occur exclusively due to the excitation of the sensing layer as the doped layer by the laser, which was given by $I_l$ or $J_l$. A matrix was formulated that defined the amount of luminescence generated in the specific layer z (FIG. 34D).

The matrix included components $q_z$ as the quantum efficiency of the layer z. If the layer was luminescent, $q_z$=0.5, and if not, then $q_z$=0. As an example, for the first sample (FIG. 32A and referred to in the model of FIG. 34A as a two-layer model), $q_t$=0.5 and $q_b$=0. It was then possible to solve for the distribution of the luminescence intensities in the coatings.

The second model study (FIG. 34B) included a high scattering area 510 to form a three-layer model, which expanded the complexity of the model by considering three layers in the thermal barrier coating top coat 503, as represented by the model shown in FIG. 34B. At the lower side of the undoped coat 504 and adjacent the bond coat 502 (or an air gap), the shaded zone corresponded to the high scattering area 510, which represented the EB-PVD microstructure. A column vector $Y_\lambda(x)=[I_{t,\lambda}(x)\ J_{t,\lambda}(x)\ I_{m,\lambda}(x)\ J_{m,\lambda}(x)\ I_{b,\lambda}(x)\ J_{b,\lambda}(x)]^T$ defined the radiation intensities. The intensity of both the laser and luminescence light as a function of coating depth was solved, respectively (FIG. 34E).

There were certain model parameters. Generalized coefficients k and s that accounted for the bidirectional path of light were calculated from the absorption and scattering coefficients, respectively k and s, given in Table 2, and such that K=2k and S=2s, corresponding to isotropic backscattering with no forward scattering. The high scattering area was characterized by a stronger diffusion of light, which can be simulated using s'>s and where k remained unchanged inside the entire thermal barrier coating top coat 503 defined by the doped layer 506, undoped layer 504, and high scattering area 510. The thickness of the high scattering zone was fixed to 10 μm, based on reported values of microstructure.

TABLE 2

Scattering and Absorption of As-Deposited EB-PVD YSZ

| λ (nm) | Scattering coefficient s [s'] (m$^{-1}$) | Absorption coefficient k (m$^{-1}$) |
| --- | --- | --- |
| 532 | 12,965 [46,015] | 407 |
| 562 | 12,107 [39,336] | 319 |

The boundary conditions are defined such that, at the top surface, the percent intensity of the incident laser light was set to $I_f(x=0)=I_0=100\%$, and there was no external luminescence input at the surface, so that I $(x=0)=0\%$. Depending on the interface type considered at the bottom or lower section of the top coat 503, either with an air gap, in the case of a delamination, or with the bond coat 502, for an intact coating, the reflectivity $\rho_i$ was set to a specific value. For the case corresponding to delamination 509, the diffuse external reflectivity at the interface between the top coat 503 and an air gap was defined. An expression was obtained by applying an integrated average of Fresnel equations to obtain a diffuse internal reflectivity $\rho_j$, at the interface between the top coat 503 and the air gap, which was used as a boundary condition for the model (FIG. 34F). It should be noted that the diffuse external reflectivity equation is similar to that of FIG. 13.

In the model calculations, $\rho_0$ was considered the diffuse external radiation at the interface between the top coat 503 and the air gap, and $\rho_{i,\ max}$ was the maximum diffuse internal reflectivity and $n=n_{YSZ}/n_{air}$ was the ratio of refractive indices, which complied with the condition $n \geq 1$. The refractive index of the EB-PVD YSZ is given in Table 3 below and by definition, $n_{air}=1$. The value of reflectivity obtained at 532 nm is 82%, and at 562 nm, it is 83%, for the case of a delamination 509 for which the air gap width was assumed to be larger than the signal radiation wavelength, which enabled maximum reflectivity and discarded frustrated reflectance. The formation of the thermally grown oxide at this location after aging of the thermal barrier coating may contribute substantially to a change of reflectivity, estimated to be approximately 39% at the interface top coat/TGO, with α-Al$_2$O$_3$ where $n_{TGO}=1.76$.

TABLE 3

Refractive Index of EB-PVD YSZ

| λ (nm) | n |
| --- | --- |
| 532 | 2.17 |
| 562 | 2.16 |

The reflectivity for the interface between the top coat 503 and the bond coat 502 was estimated using the model for the frustrated angle-averaged effectively for radiation with an angle of incidence greater than the critical angle $\theta_c$ of about 27 degrees (FIG. 34G). A variable d in the calculations was the air gap width formed through delamination and θ was the angle of incidence, φ was an azimuthal angle and α was given for a perpendicular polarization and for a parallel polarization β (FIG. 34H).

In further calculations, the $\lambda_0$ was the radiation wavelength and $n=n_{YSZ}/n_{air}$. The frustrated angle-averaged reflectivity for unpolarized radiation was found (FIG. 34I), and in the calculations, components were used for the frustrated angle-averaged reflectivities for perpendicular and parallel polarized radiation, respectively, and were calculated using $\alpha=\alpha_\perp$ and $\alpha=\alpha_\parallel$. The air gap width dependent diffuse internal reflectivity, which can be of particular interest, for example, for the examination of early stages of delamination, was obtained (FIG. 34J).

The numerical value of the reflectivity at the interface between the top coat 503 and the bond coat 502 was obtained, and taking the limit as d goes to 0, the reflectivity was found to be about 4% at 532 and 562 nm wavelengths.

Figure 35B:
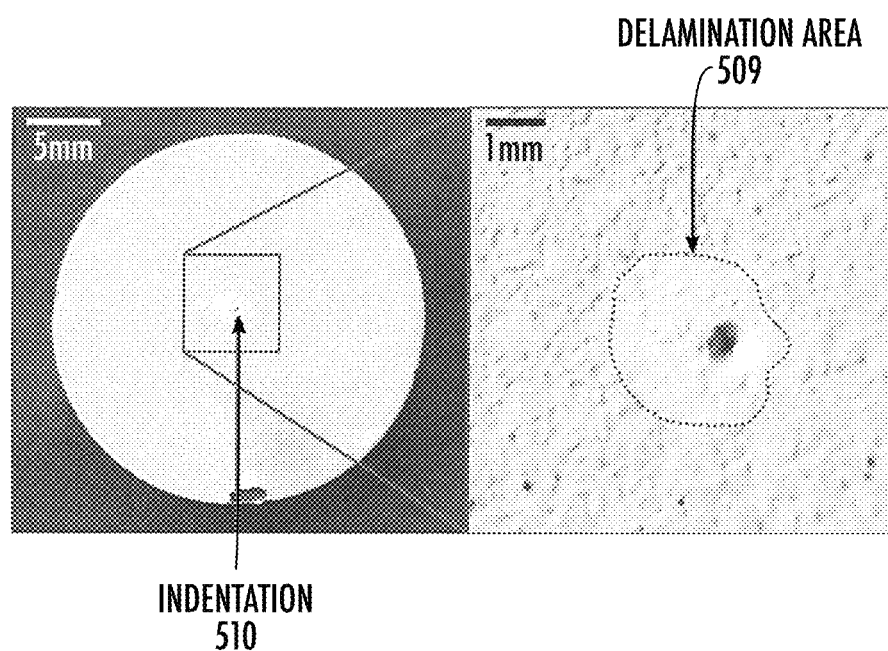
FIG. 35B is another photograph similar to that shown in FIG. 35A, but with the doped layer at the bottom of the top coat.

Experimental Measurements. Images of the coatings with Rockwell indentation-induced delamination or spallation areas for the doped layer 506 at the top surface (FIG. 32A) and doped layer at the bottom of the top coat 503 (FIG. 32B) are shown in FIGS. 35A and 35B. The indentation 510 and delamination 509 area for both are illustrated, and with a larger spallation area in FIG. 35A for the doped layer 506 at the top surface 503. In both samples, delamination areas were detected due to the larger and sharper increases in luminescence intensity than in the increase in reflectance observed by the naked eye. The thermal barrier coatings also showed some defects that could be detected with this process because the defects were associated with a luminescence intensity that was significantly lower than collected in an intact zone of the coating.

For the first sample (FIG. 32A) having the doped layer 506 at the top surface, distinct locations close to the indent area have top surface markings corresponding to contamination as shown in the image of FIG. 35A, causing a local reduction in the emission intensity. Spallation 530 also resulted in zero luminescence in those areas. Other factors that affected measurements include: (a) irregularities in the coating thickness, (b) the concentration variation and dispersion in-homogeneity of the luminescent ions in the material concentration, (c) curvature of the thermal barrier coating along the turbine blades, and (d) partial erosion, sand glazing or calcia-magnesia-alumina-silicate surface deposition. These factors contributed to luminescence intensity inconsistencies or surface coating opacity in localized areas.

In the first sample of FIG. 32A with the doped layer 506 as the top surface, although this doped layer as the sensing layer was not in direct contact with the bond coat 502, the increase of diffuse internal reflectivity at the bottom of the ceramic top coat 503 was associated with a debonding at the interface between the top coat and the bond coat 502 and produced a noticeable increase of luminescence intensity. For the second sample of FIG. 32B with the doped layer 506 as the bottom of the top coat 503, even though the indentation load was modestly lower than that of the first sample, smaller lateral delamination expansion was generated as shown in the image of FIG. 35B. A considerable contrast was observed, indicating the particular effectiveness of luminescence-based measurements for this layer configuration. These luminescence intensity contrasts were due to the increased reflection of the laser and luminescence lights at the interface between the top coat 503 and the bond coat 502 in presence of an air gap, providing more excitation to the sensing layer and more reflected luminescence to emerge out of the thermal barrier coating surface.

In both samples, the indentation location showed a reduced luminescence intensity resulting from the possible compaction of the doped coat 506 as the sensing layer. Moreover, for both first and second samples, there was enough luminescence intensity contrast for fast delamination detection, which is advantageous with multilayered configurations, such as shown in FIGS. 32A and 32B. For the application of this delamination measuring technique for delamination detection on curved surfaces, such as some turbine blades, luminescence intensity gradients may be expected and configurations similar to the second sample having the doped layer 506 at the bottom of the top coat 503 (FIG. 32B) with high luminescence intensity contrast may be preferred. It should be understood that the dopants, concentrations, ranges, thickness dimensions and other factors may be similar as to other examples described above relative to FIGS. 1-35A and 35B.

Figure 36:
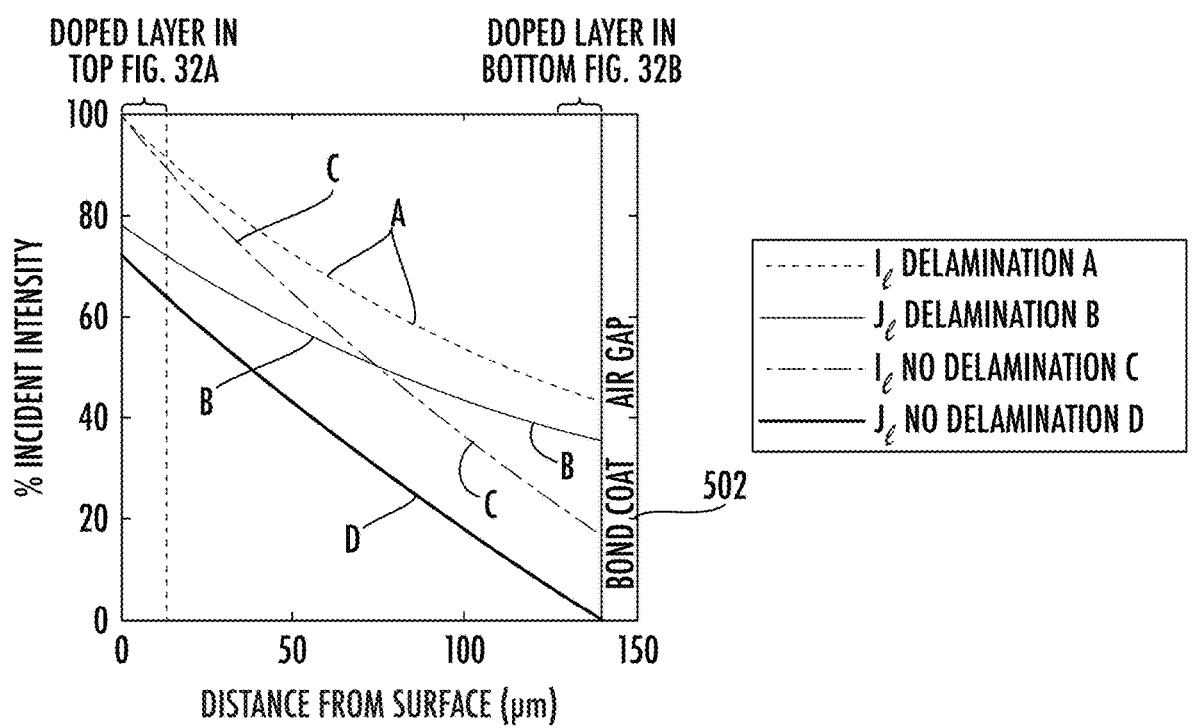
FIG. 36 is a graph showing the distribution of laser intensity in the two-layer model of FIG. 34A showing where there is delamination, higher intensities are scattered due to increased reflection and showing the location of the doped layers in the examples of FIGS. 32A and 32B.

Two-Layer Model. As noted before, a two-layer model was implemented and studied. The solution obtained by the modified Kubelka-Munk model for this first case study where two layers were considered, i.e., the sensing layer 506 and the other undoped layer 504 as shown in FIG. 34A, provided the distribution of light intensities. At any point in the coating, the respective intensities I and J for laser (l) and luminescence (L) were calculated based on absorption, scattering and the interface reflectivity using the modified Kubelka-Munk model. The results for the laser intensity are shown in the graph of FIG. 36, showing the distribution of laser intensity in the two-layer model (FIG. 34A). In the case where there is delamination, the higher intensities are scattered back due to increased reflectivity.

The location of the doped layer for the first and second samples (FIGS. 32A and 32B) are shown and labeled corresponding to the doped layer 506 at the top surface on the left side of the graph, and the doped layer at the bottom of the top coat 503 as noted on the right side of the graph. In the presence of delamination 509, there is a substantial difference in the intensity of light traveling back to the top surface ($J_l$). The additional excitation intensity in the doped layer 506, particularly enhanced in regions closer to the interface between the top coat 503 and the bond coat 502, contributed to the higher intensity of luminescence produced in the sensing layer 506. For the first sample having the doped layer 506 at the top surface (FIG. 32A), the increase of the intensity of the backscattered laser radiation $J_l$ contributed substantially to the gain in excitation intensity that was available for the production of luminescence, in the case of delamination.

Figure 37:
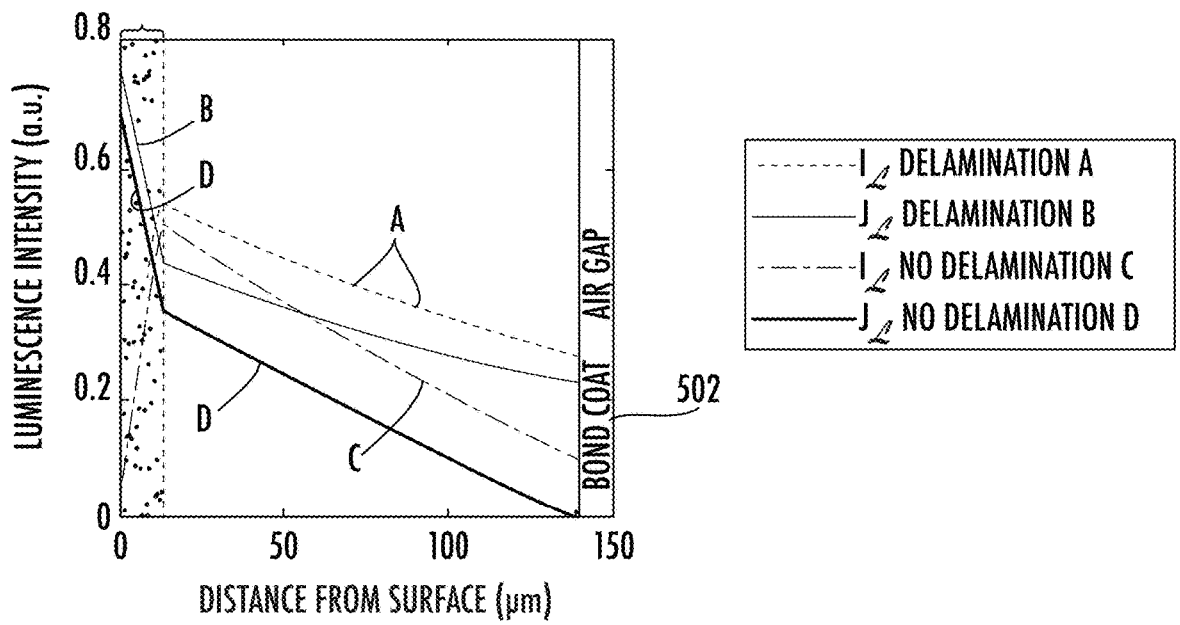
FIG. 37 is a graph showing the distribution of luminescence intensity in the two-layer model where the doped layer is on the top coat.
Figure 38:
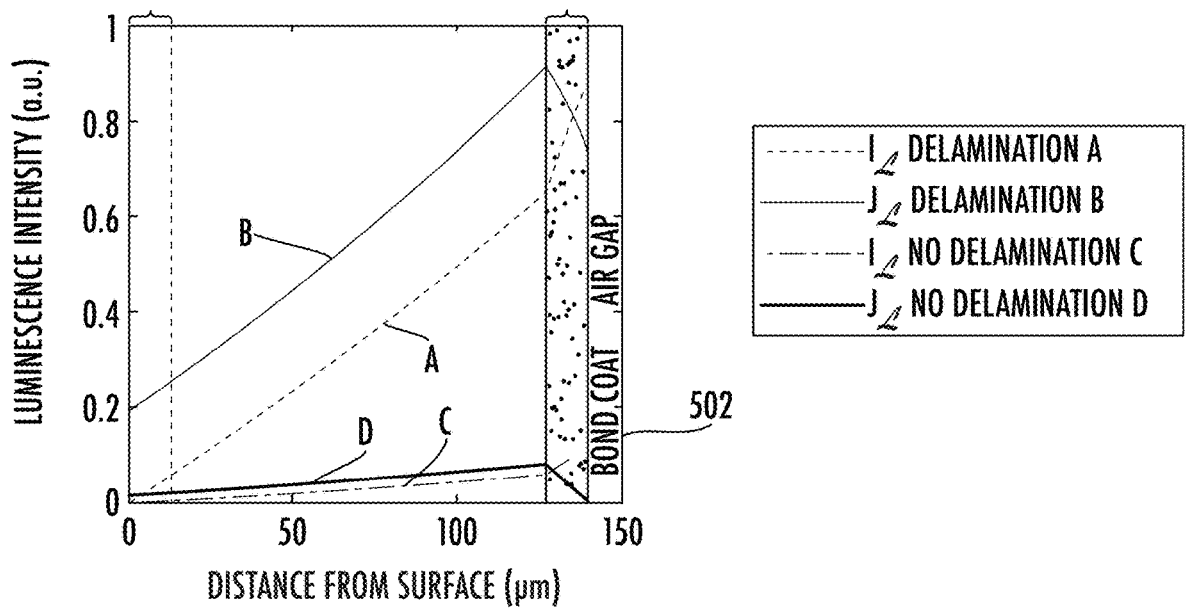
FIG. 38 is a graph showing the distribution of luminescence intensity in the two-layer model where the doped layer is at the bottom of the top coat.

For the second sample having the doped layer 506 at the bottom of the top coat 503 (FIG. 32B), the summation of the integrated intensities of the incoming laser radiation $I_l$ and the backscattered laser radiation $J_l$ was increased in the presence of a delamination, largely contributing to the higher intensity of luminescence. The results of the modified model for the luminescence intensities for the first and second samples corresponding to those illustrated in FIGS. 32A and 32B, i.e., either the doped layer 506 at the top surface or doped layer at the bottom of the top coat 503, are shown in the graphs of FIGS. 37 and 38, respectively, with doped layer to top shown at the left side of the graph in FIG. 37, and doped layer at the bottom of the top coat shown at the right side of the graph in FIG. 38. The dotted areas in each graph either on the left represent the location of these doped layers in those respective samples. There was an overall increase of luminescence intensity when a delamination was present due to both the higher amount of laser excitation energy available and the greater reflection of the luminescence radiation itself, at the bottom of the top coat 503.

Figure 39:
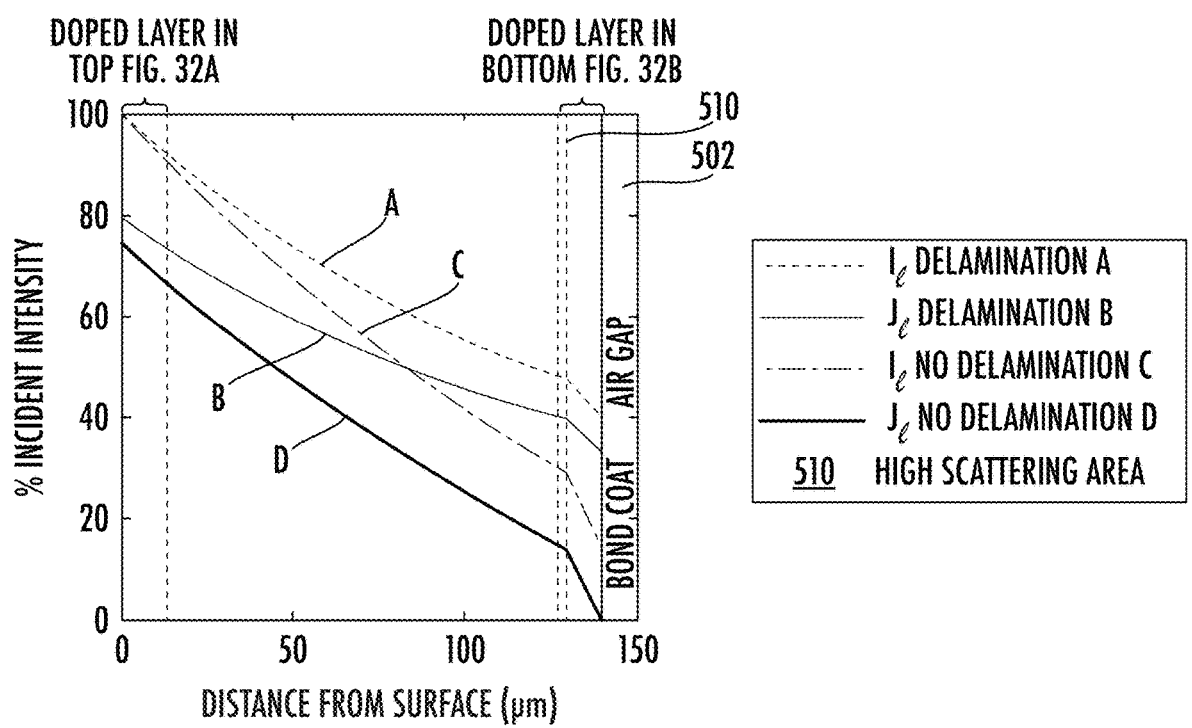
FIG. 39 is a graph showing the distribution of laser intensity in the three-layer model of FIG. 34B and where there is delamination, higher intensities are scattered back due to increased reflection.
Figure 40:
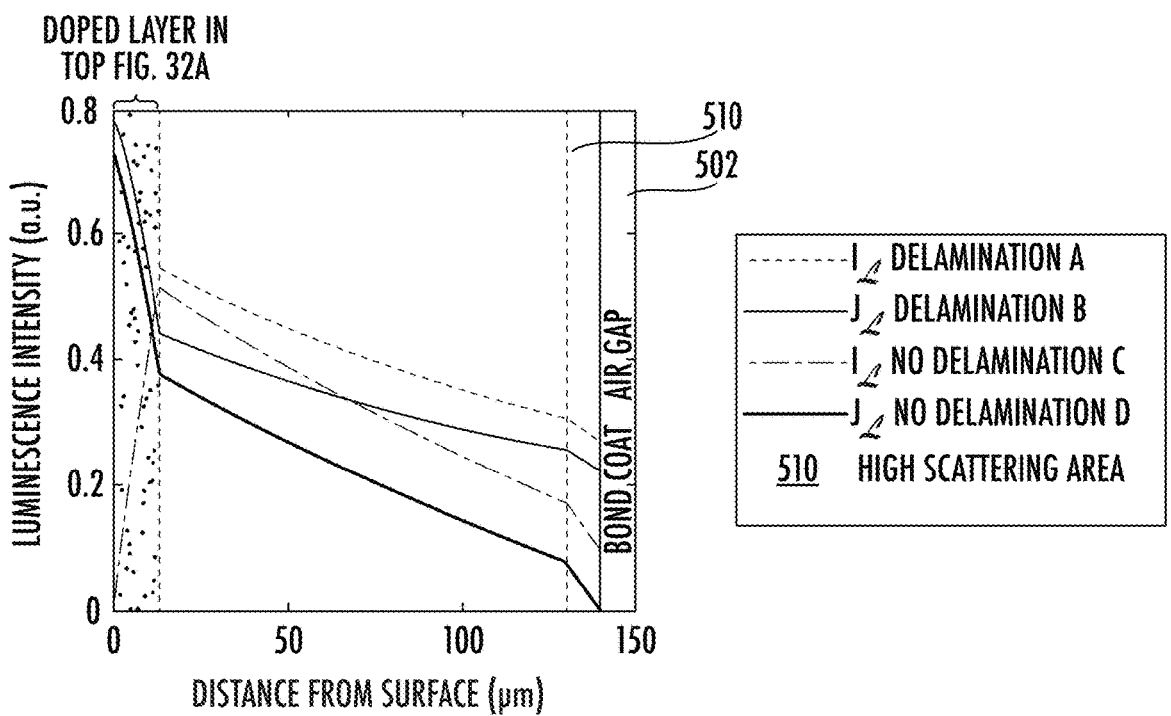
FIG. 40 is a graph showing the distribution of luminescence intensity in the three-layer model where the doped layer is on top.
Figure 41:
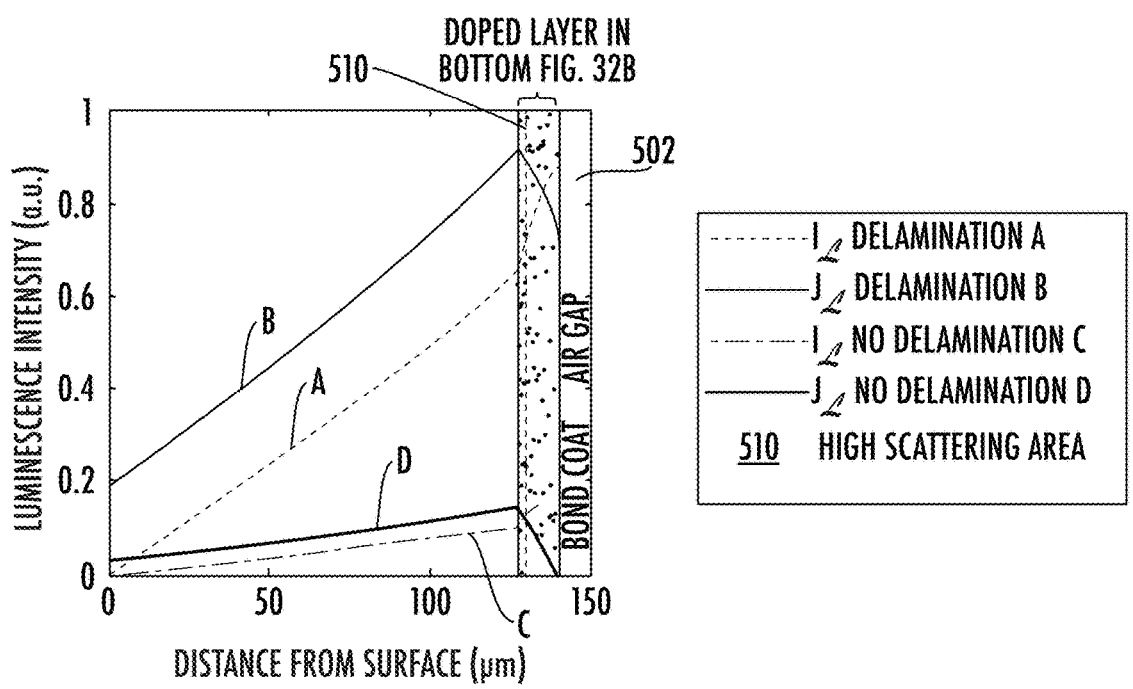
FIG. 41 is a graph showing the distribution of luminescence intensity in the three-layer model where the doped layer is at the bottom of the top coat.

Three-Layer Model. As noted before, a three-layer model was implemented as shown in FIG. 34B, which was an improvement over the two-layer model because it integrated a high scattering layer 510 located at the base of the top coat 503. This high scattering area 510 had distinct optical properties as observed on typical EB-PVD microstructures. This three-layer model (FIG. 34B) produced more accurate results in comparison with the two-layer model (FIG. 34A) because the three-layer model captured the differences in optical properties associated with the evolving microstructure of EB-PVD coatings with depth. The three-layer model provided a distribution of laser intensity as shown in the graph of FIG. 39, illustrating also the locations of respective samples as in FIGS. 32A and 32B and the high scattering area 510. The results for the luminescence intensities for the first and second samples are shown in the graph of FIGS. 40 and 41, respectively. In the case where there was delamination, the higher intensities were scattered back due to increased reflectivity.

The sensitivity to layer thickness variations that exists in practice was taken into account to calculate the standard deviation error results for the calculation of J (x=0), which represented the measurable luminescence intensity that emerged from the top surface and was collected at the detector. The numerical values found for J (x=0) are reported in Table 4. Generally, the EB-PVD fabrication technique leads to better control on the thickness of the deposited coatings, with a precision that can be as low as 1 μm. Assuming that the overall top coat thickness remained constant, e.g., about 137.5 μm, the model was solved for a sensing layer thickness of 12.5±1 μm.

TABLE 4

Results of the Kubelka-Munk Model for the Predicted Luminescence Intensity Emerging out at the Surface

| Intensity (a.u.) | Sample A | Sample B |
| --- | --- | --- |
| Two-layer model | | |
| J (x = 0) delamination | 0.764 ± 0.057 | 0.198 ± 0.017 |
| J (x = 0) no delamination | 0.683 ± 0.049 | 0.017 ± 0.003 |
| Three-layer model | | |
| J (x = 0) delamination | 0.768 ± 0.057 | 0.196 ± 0.019 |
| J (x = 0) no delamination | 0.703 ± 0.052 | 0.031 ± 0.005 |

TABLE 5

Modeling and Experimental Results for the Ratio of Delamination Over Intact Coating Luminescence Intensities

| Enhancement factor η | Sample A | Sample B |
| --- | --- | --- |
| Two-layer model | 1.12 ± 0.16 | 11.36 ± 2.98 |
| Three-layer model | 1.09 + 0.16 | 6.32 ± 1.63 |
| Experimental measurement | 1.17 ± 0.02 | 4.82 ± 0.47 |

Comparison of Results. Table 5 above compares the modeling and experimental results. The luminescence intensity contrast (or enhancement factor η) between a delamination area and an intact coating area was obtained in the models by juxtaposition of the two extreme cases of diffuse internal reflectivity, e.g., 4% for an intact coating and 82-83% in the presence of a delamination area. The error shown in the modified Kubelka-Munk models accounted for typical thickness variation. Experimentally, the enhancement factor η was obtained by dividing the average of 10 measurements in the delamination area 509 by the average of 10 measurements outside this area. The reported error corresponded to the standard deviation over these points.

This comparison indicated that, as expected, the three-layer model (FIG. 343) better correlated with experimental measurements. For the first sample having the doped layer 506 at the top surface (FIG. 32A), the enhancement factor η obtained from both modeling approaches was close to the experimental result. However, for the second sample having the doped layer 506 as the bottom of the top coat 503 (FIG. 32B), the two-layer model predicted an enhancement factor well above the actual experimental results, which indicated that the sensing layer 506 of this second sample presented a different and stronger scattering behavior when compared to the rest of the thermal barrier coating.

Because much of the contrast is produced by multiple scattering events, i.e., both laser and luminescence in the doped layer as the sensing layer 506, the larger mismatch with the prediction is expected for the second sample where the doped layer is at the bottom of the top coat 503 (FIG. 32B). The three-layer model as shown in FIG. 34B accounts for this high scattering at the base of the thermal barrier coating, and in this case, corresponds to the base of the doped layer as the sensing layer 506, and generated a more accurate estimation and validated this modeling approach for EB-PVD coatings. It was found that the three-layer model was appropriate for estimations on the thermal barrier coating layer configuration in the second sample where the doped layer 506 is at the bottom of the top coat 503 (FIG. 32B).

The modified Kubelka-Munk model helps characterize the progression of coating delamination. The coating health may be monitored by measuring luminescence intensity over extended areas, which is helpful for important commercial applications, including gas turbine blades. The locations where luminescence contrast exceeded the lower boundary of the enhancement factor predicted by the models indicated the delamination zones. Some of the assumptions and simplifications on the Kubelka-Munk models and the accuracy of the coefficients selected for the material may contribute to discrepancies between model estimations and what actually occurs. However, the system and method as described has obtained substantially accurate results in a reliable manner.

Figure 42:
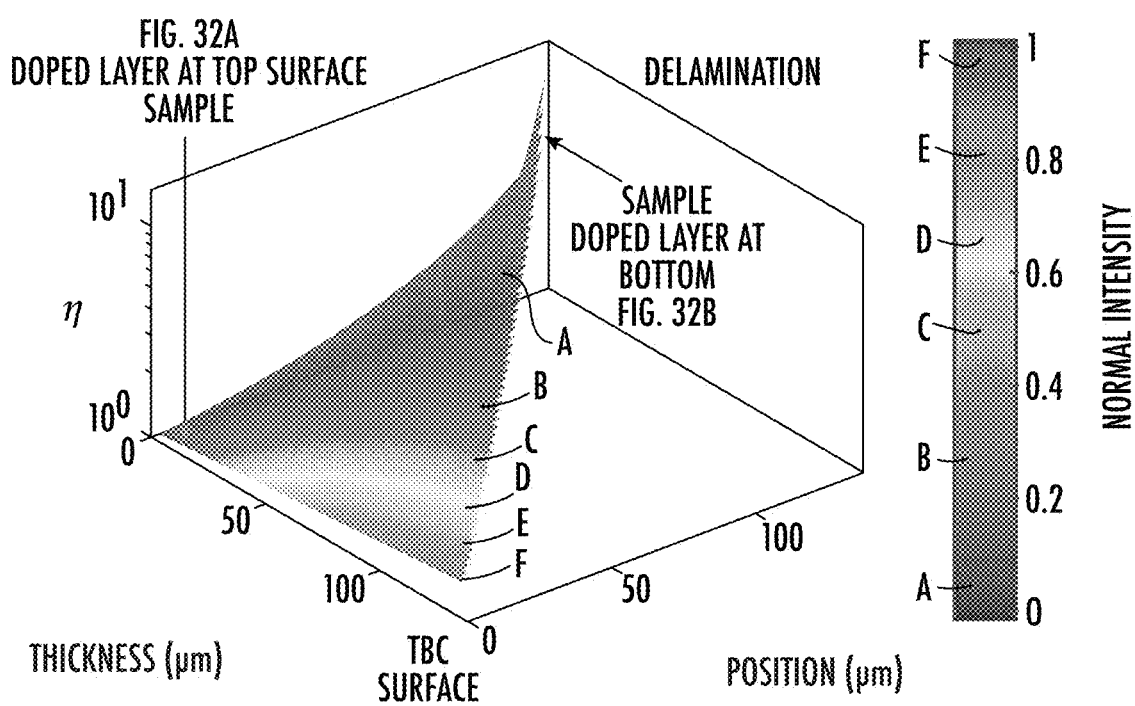
FIG. 42 is a graph showing modeled signal trade-off for an embedded sensing layer in an EB-PVD thermal barrier coating.

Delamination Model Capabilities and Extensions. The evaluation of the luminescence enhancement factor and the signal intensity trade-offs showed that having the sensor layer or doped layer 506 on the bottom of the thermal barrier coating (FIG. 32B) was preferable for delamination monitoring. This process may also be used for optimizing the thickness of the sensing layer 506 at the bottom of the top surface 503. The graph of FIG. 42 shows there are some signal trade-offs for an example 137.5 µm EB-PVD thermal barrier coating configuration containing a luminescent layer with varying topology. In the graph, the position axis indicates the location of the top of the sensing layer as the doped layer 506 embedded in the thermal barrier coating, while accounting for the high scattering zone at the base of the coating (10 µm), as given in the three-layer model.

The enhancement factor η corresponded to the achievable luminescence contrast generated in the presence of a delamination, and confirmed that very thin sensing layers as the doped layers 506 located at the bottom of the top coat 503 (FIG. 32B) were more ideal for maximum contrast in detection. Luminescence intensities were normalized to allow for direct intensity comparisons between distinct layer configurations, while avoiding inaccurate numerical estimations that may originate from the inherent uncertainty on quantum efficiency. A thicker sensing layer as the doped layer 506 provided more intensity, but with some contrast loss, e.g., less contrast from portions of the sensing layer that were distant from the interface. Additionally, although sample configurations with a sensing layer as the doped layer 506 at the top surface (FIG. 32A) provided high luminescence intensities, they were vulnerable to erosion since the sensing layer was exposed. However, as a benefit, for that reason, the system and process as described may be used to monitor erosion using the luminescence-based modeling methods as presented above.

A configuration that may be operable for multi-purpose detection capabilities may be a fully doped coating, with a higher luminescence intensity and higher contrast than the other configurations and with the sensing layer 506 placed on top of the regular EB-PVD YSZ coating (FIG. 32A). The effects of frustrated total internal reflectance that occurred for air gaps smaller than the radiation wavelength may be studied. The substantial variations of diffuse internal reflectivity may be used to characterize the early stages of delamination during formation of air gaps. Similarly, thermally grown oxide growth and location of delamination with respect to this oxide layer may be evaluated using the models explained above.

It is possible to evaluate the trade-offs between luminescence signal strength and the delamination contrast that can be used to optimize doped layer coating configurations, e.g., two-layer with the sensing layer or doped layer 506 and regular undoped layer 504, and three-layer with a high scattering area 510 integrated to the previous case. The models helped predict, for any thermal barrier coating configuration that embeds a luminescent layer, the luminescence intensity contrast that may be used to quantify and monitor delamination areas in these thermal barrier coatings.

Modeling results were compared to experimental values that were collected on two as-deposited EB-PVD thermal barrier coatings, which each contained an erbium-doped YSZ layer for delamination sensing. An artificial delamination zone created by Rockwell indentation was successfully quantified by measuring the intensity of the erbium emission at 562 nm over the surface of the coatings. The luminescence contrast predicted by the three-layer model was found to be in good accordance with experiments, emphasizing the importance of considering the microstructure anisotropy in EB-PVD thermal barrier coatings for accurate delamination characterization. This modeling approach may aid to help determine signal trade-offs for layer topology optimization. The system and process may be applied to different coating deposition methods to evaluate the early stages of delamination progression in thermal barrier coatings, and to assist coating health monitoring measurements and to facilitate safer thermal barrier coating operation and improved lifetime.

Revealing Temperature Gradient Across Thermal Barrier Coatings

The thermal barrier coatings as described may be used in combination with air cooling systems to protect metal substrates from extreme temperatures in high-pressure turbines as an example. Temperature ranges in high-pressure turbines may vary from 1300° C. to 1600° C. Air film cooling may provide a change in temperature from −100° C. to −400° C. At the thermal barrier coating, the change in temperature may range from −150° C. to −200° C. In major applications, such as jet turbine and power generation engines, this change may impact engine performance and maintenance schedules. For example, many components besides turbine blades in an aircraft engine include thermal barrier coatings. Typical components, for example, of a General Electric turbofan engine, such as the GE9X, include special alloys and ceramic matrix composites. The engine has a higher bypass ratio and compression ratio than many other engines to improve the fuel ratio. This type of engine includes improvements in the fan unit, low-pressure compressor, high-pressure compressor, combustor, low-pressure turbine, high-pressure turbine, and turbine blades. Many of these components are coated with a thermal barrier coating to protect them in extreme operating environments.

As noted before, state-of-the-art thermal barrier coatings have not been used to their highest potential because of uncertainties in the temperature measurements at high-temperature operation of the various thermal barrier coated components, such as turbine blades. Safety margins as high as 200° C. exist, and the ideal Brayton cycle efficiency is dependent upon the temperature ratio of the compressor exit and turbine inlet where these safety margins can be important. A 1% efficiency improvement can save millions of dollars in fuel over a combined-cycle plant life, and a 130° C. increase may lead to about a 4% increase in engine efficiency. Failure mechanisms are often driven by temperature conditions in the depth of the thermal barrier coating.

A more accurate determination of thermal gradients in thermal barrier coatings would allow a more safe and more efficient operation of various coated components, such as in gas turbine engines. Failure mechanisms of coated components may be thermally activated during engine operation, and the uncertainty in temperature measurements may contribute significantly to their lifetime uncertainty.

Thermal barrier coatings on many components, such as in gas turbine engines, operate in the presence of large thermal gradients that exist throughout their thickness. For example, a large temperature gradient may exist through the thickness of a thermal barrier coated turbine blade during high temperature, peak operation. The weaker portion of the thermal barrier coating may be located near the top coat and bond code interface, creating a weaker area that may affect component performance and longevity. The system as developed determines a more precise sub-surface location of phosphor thermometry measurement points and has been implemented to determine thermal gradient and temperatures at the interface and throughout the thickness of the component from the top coat of the thermal barrier coating through the bond coat and to the substrate.

Figure 43:
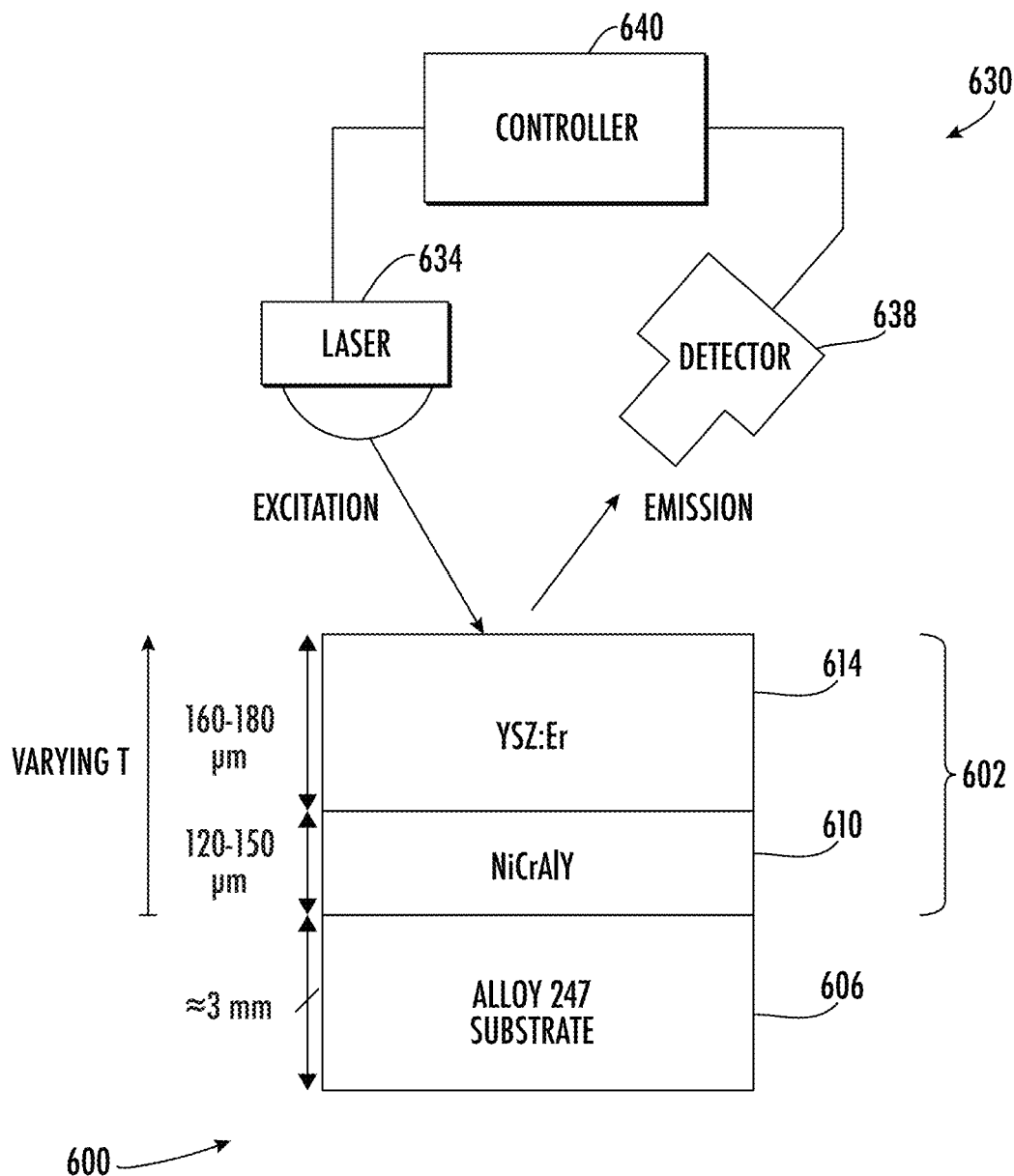
FIG. 43 is a schematic diagram of an example apparatus used to determine temperature gradients across a thermal barrier coating and showing the configuration of the thermal barrier coating.

Referring now to FIG. 43, an example component 600 having a thermal barrier coating 602 is illustrated on a substrate 606 formed from alloy 247, also referred to as AMR-N 247, which may be provided as a cast polycrystalline nickel-base superalloy developed by Martin Marietta Corporation, and often investment cast, but also useful with directional solidification techniques to improve the creep rupture strength. The NiCrAlY bond coat layer 610 may be formed over the substrate 606 and a ceramic top layer 614 as the YSZ:Er top coat layer applied on the bond coat layer and formed by techniques such as air plasma spraying. The ceramic top coat layer 614 in this example may include 1.5% erbium. In this example, it was annealed for 2 hours at 800° C. The substrate 606 is about 3 millimeters thick for experiment purposes, but can vary in thickness depending on end-use applications, such as when the substrate is a turbine blade. The bond coat 610 in this example is about 120 to about 150 micrometers thick, and the ceramic top layer 614 is about 160 to about 180 micrometers thick, and both may be applied by air plasma spraying or other techniques. The apparatus for measuring thermal gradients across the thermal barrier coating 602 is illustrated generally at 630 and includes a laser 634, detector 638, and a controller 640 operatively connected to the laser and to the detector for controlling their operation. The laser 634, detector 638, and controller 640 may be similar to other components described above in the description with FIGS. 1-42.

In accordance with a non-limiting example of the system and method, the thermal gradients shown by the varying T in FIG. 32 may be characterized through various translucent materials, including thermal barrier coatings for different end-use applications, such as gas turbine engines. The luminescence decay apparatus and methodology described above and associated with phosphor thermometry may improve gradient temperature monitoring through a thermal barrier coating and increase the operational lifetime of different substrate materials, such as a turbine blade, and increase overall efficiency of engines. The phosphor thermometry decay signal is analyzed to reveal thermal gradients in the depth of the thermal barrier coating or other translucent materials. Although the description will proceed relative to thermal barrier coatings, it is possible the system and described methodology may be used on many different translucent materials. The data collected at the detector 638 is analyzed and processed at the controller 640 and the thermal profile across the depth of the thermal barrier coating 602 is determined. As shown in FIG. 43, there is a varying temperature (T) across the thermal barrier coating 602 and to the substrate 606, and in the presence of a thermal gradient across the thermal barrier coating, the collected convoluted luminescence decay signal may be used to reconstitute and determine through-the-depth temperature points.

This data may be used for improved precision of temperature measurements in extreme temperature environments. The resulting decays may be computed at the controller 640 via a software module that converts decays to thermal gradients. The capability to obtain data to monitor the thermal gradients instead of only the surface temperature or point measurements provides a better insight for the operation of different components that have applied protective thermal barrier coatings, such as 602 in FIG. 43, to improve design options, which are supported by the more precise data regarding the measurement of temperature gradients across the thermal barrier coatings. Better control of remote temperature measurements in extreme operating environments may be applied to other materials, such as cryogenic materials, combustion components, and turbine engine components. Thus, not only may a single value for a temperature measurement be obtained for each probed location, but a temperature distribution extending through the material, such as the thermal barrier coating 602 applied on a substrate 606, throughout the depth of the probed point may be obtained. A three-dimensional (3D) temperature map may be obtained, such as by obtaining the two-dimensional surface temperature map, and another dimension through the depth of the material at each surface point.

Figure 44:
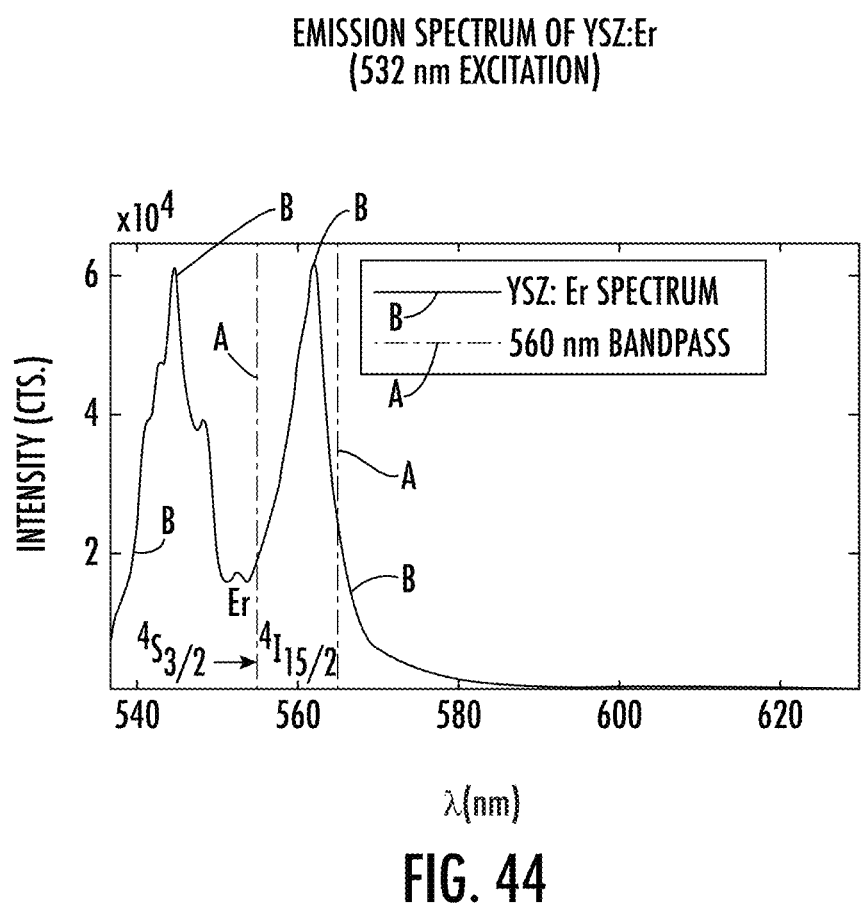
FIG. 44 is a graph showing the emission spectrum of YSZ:Er and applicable for determining example temperature determinants.

Referring now to FIG. 44, a graph of the emission spectrum for the top coat 614, as an example YSZ:Er top coat as doped with erbium and at 532 nanometer (nm) excitation is illustrated, showing the 560 nm bandpass with the dashed lines indicated by "A" and YSZ:Er spectrum and the double peak indicated by solid lines at "B."

Figure 45:
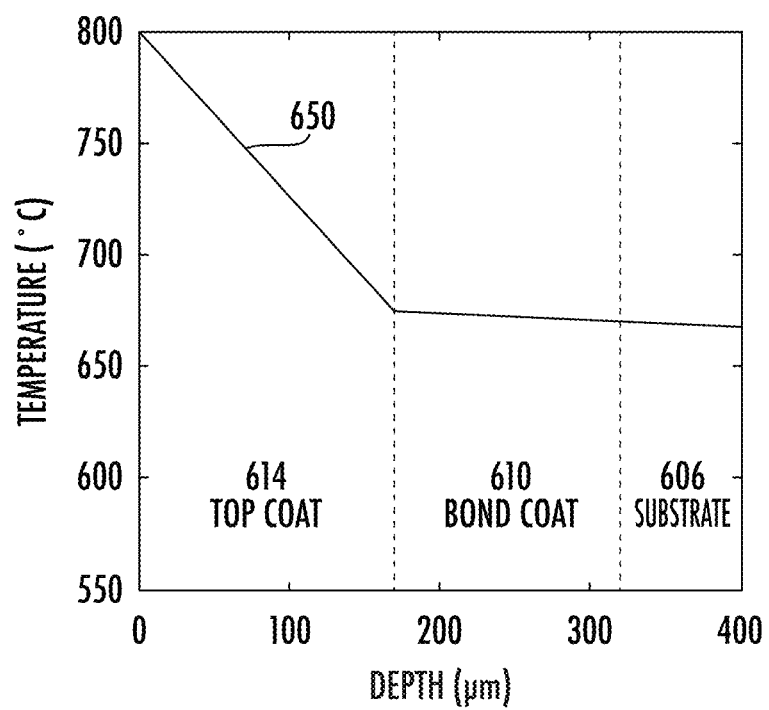
FIG. 45 is a composite graph and equation showing the gradient of temperature relative to depth in a thermal barrier coating and the summation of the thermal gradients.

Referring now to FIG. 45, there is illustrated a graph with corresponding equations illustrating how the gradient of temperature may be calculated using the thermal conductivities, where the summed R for the thermal top coat 614, thermal bond coat 610, and thermal substrata 606 are added for the total gradient of temperature. The temperature gradient from the top surface of the top coat 614 down the bond coat 610 to the substrate 606 is shown by the line indicated generally at 650.

The YSZ top coat 614 in this example includes the rare-earth doped material, such as erbium, that exhibits multi-exponential decays and includes distinct crystallographic sites resulting in multiple decay time constants. To measure the thermal gradient in the thermal barrier coating 602, cross-relaxation and laser pulse power may impart greater importance and the impurities and dopant agglomeration may add to a delayed starting, fitting window to reduce the effect of fast-decaying components. In system operation, a constant time window may be used for measurements that are independent of the settings of a data acquisition system, such as observation length and sample rate. The YSZ:Er material was chosen for its decay because it was close to an ideal single-exponential decay with one dominant crystallographic site. In the absence of a thermal gradient, the start and end times of the fitting window do not affect the lifetime decay measurement in this type of thermal barrier coating configuration. When there is a thermal gradient, the start and end times of the fitting window may become more applicable.

In operating conditions, a temperature gradient exists in thermal barrier coatings, such as used on turbine blades. The emerging luminescence as described above is a convoluted signal coming from all the locations in the doped layer. Varying the fitting window size of the acquired signal will allow multiple temperature measurements to be acquired throughout the depth of the thermal barrier coating 602 to the substrate 606.

Figure 46:
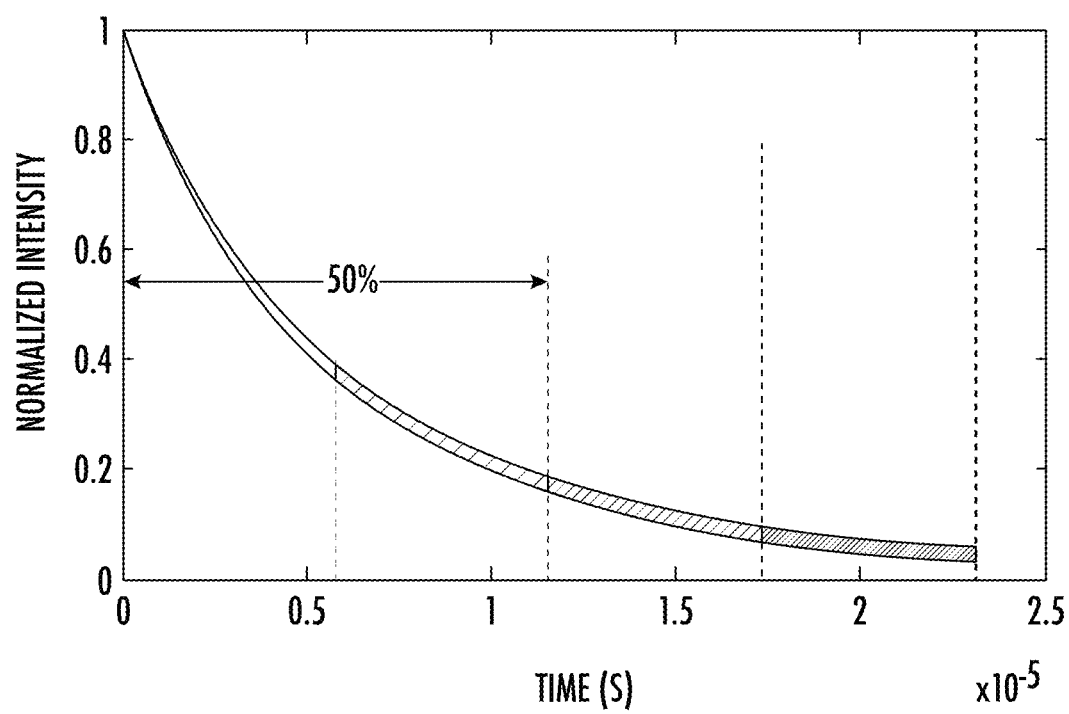
FIG. 46 is a graph showing the normalized intensity versus time when the fitting window size of the acquired signal is varied.

Referring now to the graph in FIG. 46, there is illustrated the normalized intensity versus the time, where a short fitting window contributes a greater amount to the intense, fast decay from dopants that are exposed to the higher temperature on top surface locations. The longer fitting window contributes a greater amount to the low intensity, long decay from further inside dopants that are exposed to lower temperatures. This contrast is illustrated on the decreasing decay line relative to increased time along the horizontal axis in the graph of FIG. 46.

It should be understood that the location that is measured using phosphor thermometry is reported for different temperature gradients and surface temperatures ($T_0$). It is possible to predict the sub-surface location of the temperature point as the YSZ:Er decay has little sensitivity to thermal parameters.

Figure 47:
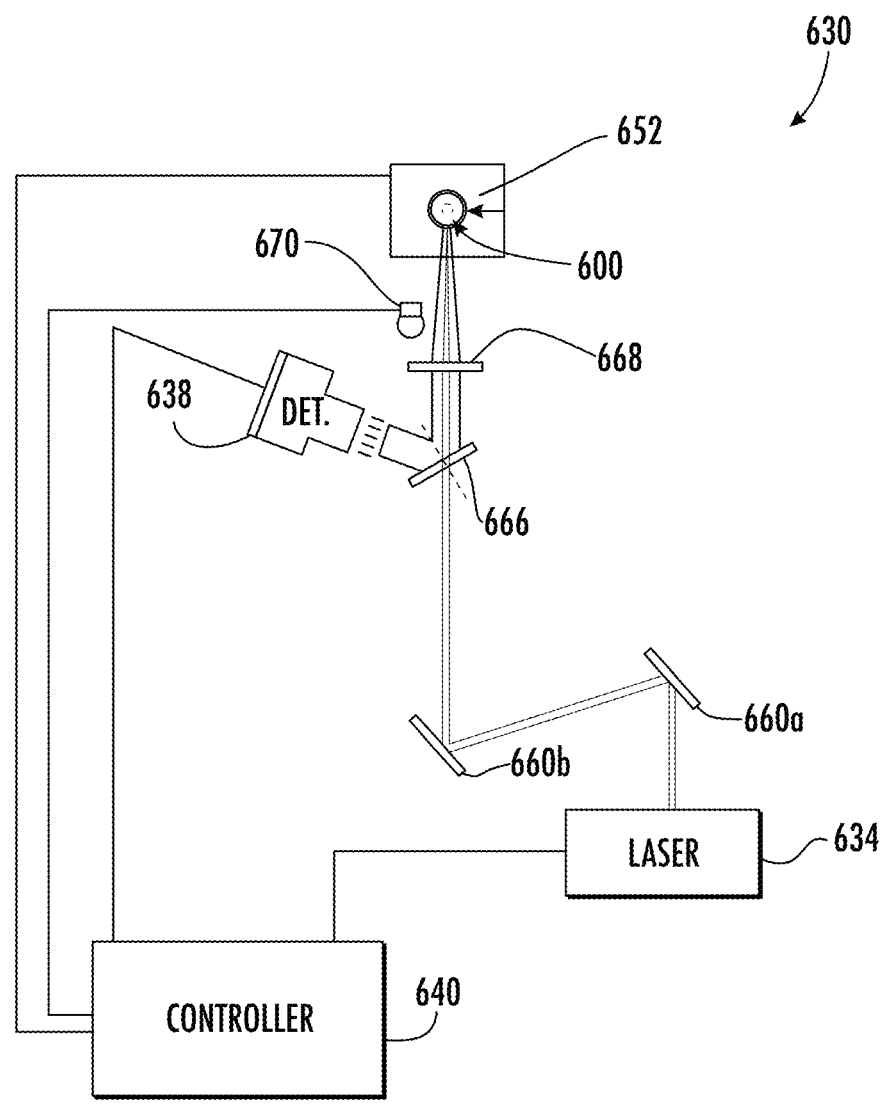
FIG. 47 is a more detailed schematic diagram of the example apparatus such as shown in FIG. 43 for measuring the temperature gradients across a sample of the thermal barrier coating.

Referring now to FIG. 47, there is illustrated another more detailed schematic of the apparatus 630 that may be used for the determination of reference decays and showing a muffle furnace 652 and the sample 600 within the furnace in an isothermal case. The apparatus 630 includes the controller 640 that operates with a laser 634, such as a pulsed 532 nanometer (nm) laser source, and a detector 638 as a photomultiplier tube in this example that includes a 560 nanometer bandpass filter. The laser 634 generates the laser pulse onto a 532 nanometer laser mirror system having two laser mirrors 660a, 660b as illustrated and into a dichroic filter 664, and in this example, a cyan dichroic filter 666 with a 30° AOI and through a convex lens 668 into the sample 600, which in this isothermal case is contained within the muffle furnace 652 to isolate the sample from fuel and all products of combustion, including gases and flying ash. The muffle furnace 652 may be electrically powered.

The sensor as detector 638 response may be calibrated in association with the furnace 652, which in an example test included through holes for a thermocouple and for taking luminescence measurements. As to the "fit," the temperature-dependent multi-phonon relaxation model for the transition may be combined with a model to account for the other thermally populated levels. It is possible that the muffle furnace 652 is not used, and instead, employ a burner rig nozzle 670 that creates a gas plume onto the sample 600 for a thermal gradient case experiment.

Figure 48:
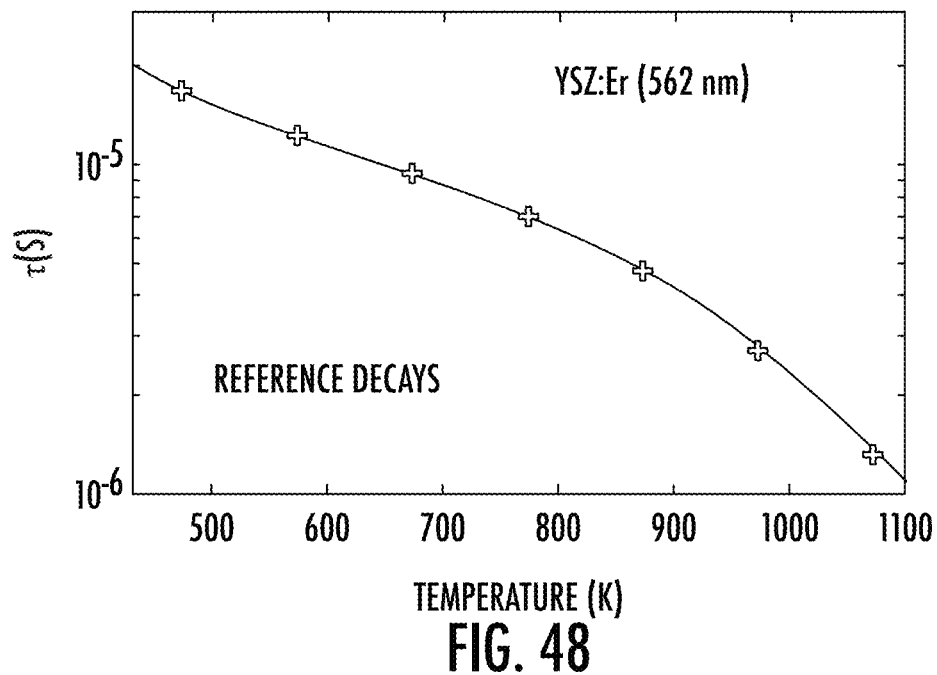
FIG. 48 is a graph showing a determination of reference decay in an isothermal case.

Referring now to the graph of FIG. 48, there is illustrated a graph of the reference decays at 562 nanometers for the YSZ:Er coating. The laser source 634 includes Nd:YAG 532 nm laser operating at a 0.5 mJ pulse energy and at 10 Hz. The time is shown on the vertical axis and temperature on the horizontal axis.

It is possible to measure decay in a thermal gradient case by including a burner rig nozzle 670 as illustrated and having no muffle furnace 652. The burner rig nozzle 670 imparts a gas plume onto the sample 600. Again the laser 634 may be a Nd:YAG laser using a neodymium-doped yttrium aluminum garnet as a crystal for the laser medium. In another example, the dopant may be a triply ionized neodymium that replaces a small fraction, e.g., about 1% of the yttrium atoms in the host crystal structure of the yttrium aluminum garnet (YAG) since the two ions are of similar size. The system may include an infrared camera and a thermocouple that are not illustrated in detail and operative for surface and opposite side temperature measurements.

Figure 49:
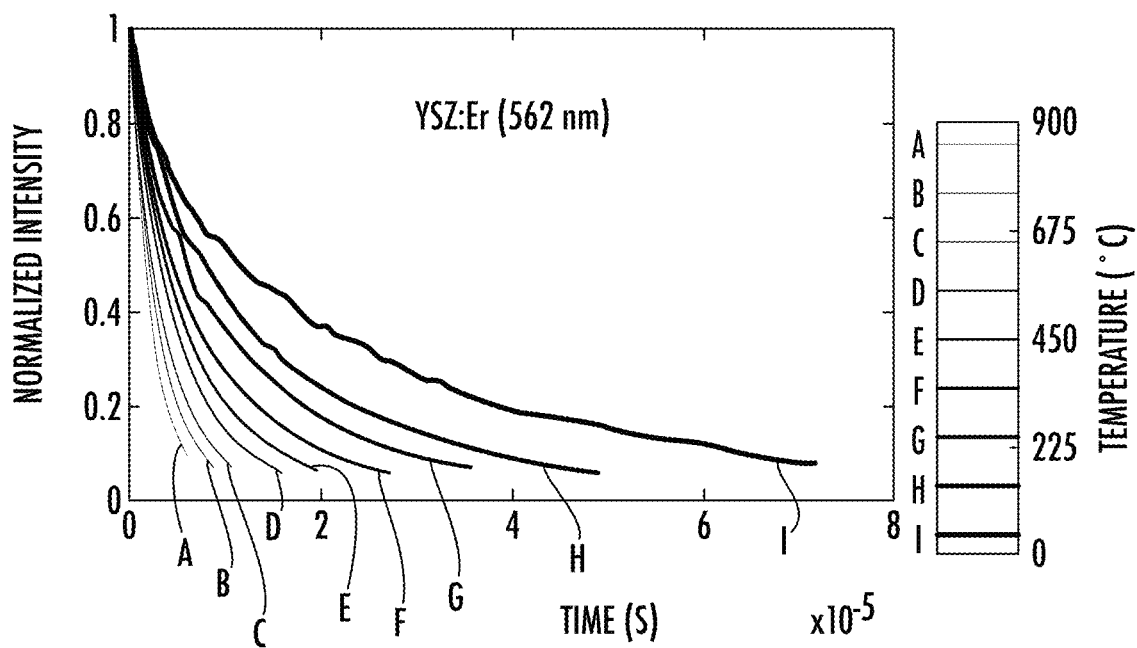
FIG. 49 is a graph showing the decay measurements in a thermal gradient case.

Referring now to the graph of FIG. 49, there is illustrated the normalized intensity versus time for the YSZ:Er at 560 nanometers and showing time on the horizontal axis versus normalized intensity on the vertical axis and the graph lines labeled A-I and the corresponding temperature.

Figure 50:
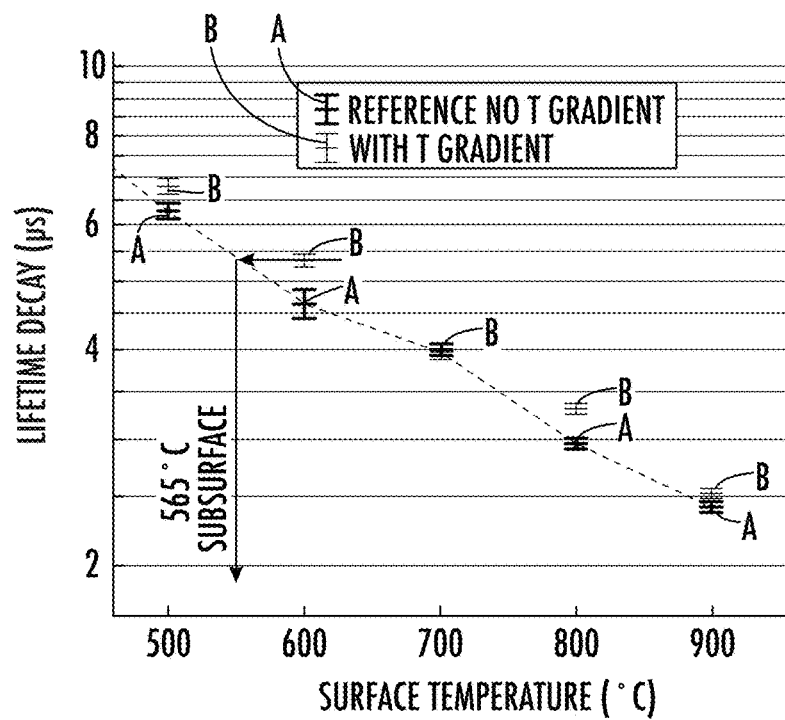
FIG. 50 is a graph showing the results for phosphor thermometry, sub-surface measurements with lifetime decay in microseconds on the vertical axis versus surface temperature.
Figure 51:
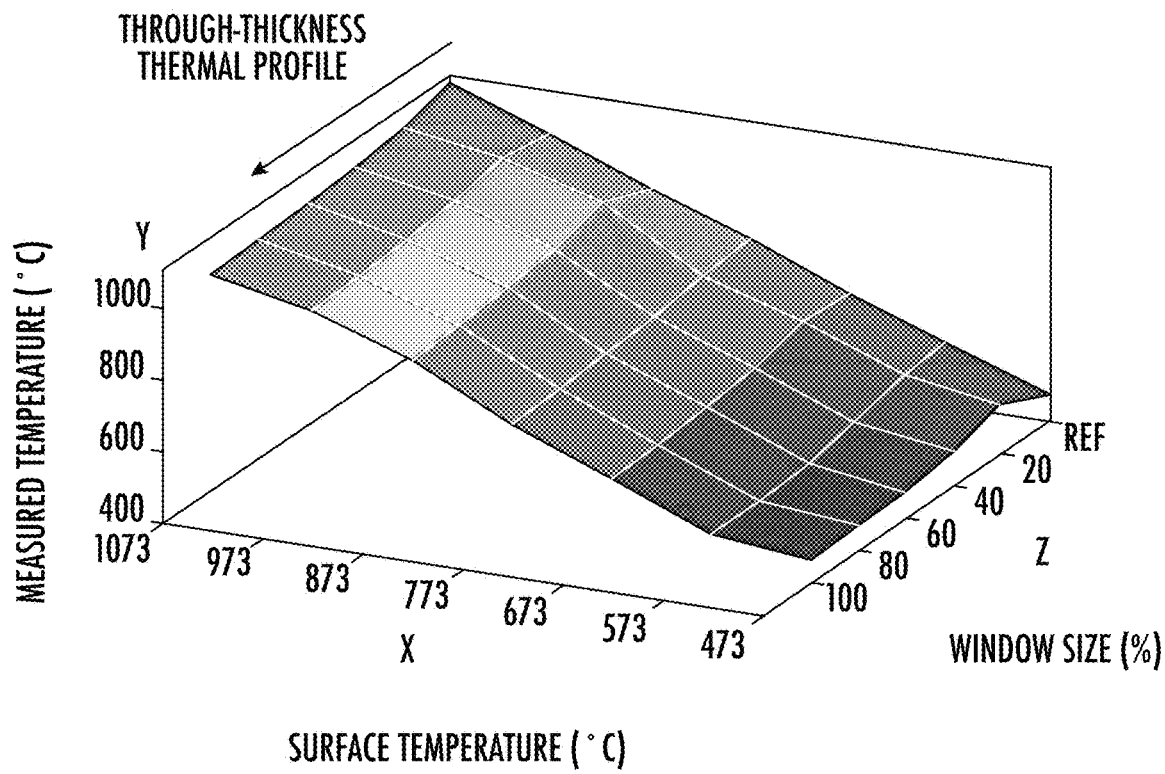
FIG. 51 is a graph showing the through-thickness thermal profile and measured temperature, surface temperature, and window size.

Referring now to FIGS. 50 and 51, there are illustrated graphs showing the results for the phosphor thermometry sub-surface measurements. A single-shot laser pulse and associated measurement may be used in this example at a given surface temperature. The fitting window was varied and the thermal gradient was revealed across the thermal barrier coating thickness. The sub-surface location measured by phosphor thermometry may be verified using an infrared and thermocouple measurement.

As shown in FIG. 50, the reference is shown with no temperature gradient and labeled "A" and the measurements with the temperature gradient are illustrated at "B." The graph shows the variation. The lifetime decay in microseconds is shown along the vertical axis and the surface temperature along the horizontal axis. The sub-surface at 565° C. is illustrated and its point along the graph shown.

Referring now to FIG. 51, there is illustrated the through-thickness thermal profile with the measured temperature in Centigrade and the surface temperature and the window size in percent relative to the reference. The window size percentage corresponds approximately to the sub-surface measurements from 0 to 70 micrometers using the Kubelka-Munk modeling.

A precise determination of temperature in the thermal barrier coatings 602 may result in large benefits, such as with gas turbine engines, for fuel savings, reduced emissions, and better lifetime monitoring of the thermal barrier coating. A single-exponential decay fit may be used as approximations for practical temperature measurements using phosphor thermometry on luminescence lifetime decay of the YSZ:Er. Variation in the fitting window size results in successful attainment of sub-surface temperatures in the doped thermal barrier coating. The phosphor thermometry measurements in the presence of a thermal gradients show promising results to reveal sub-surface temperatures and obtain three-dimensional temperature profiles of the thermal barrier coatings.

Figure 52:
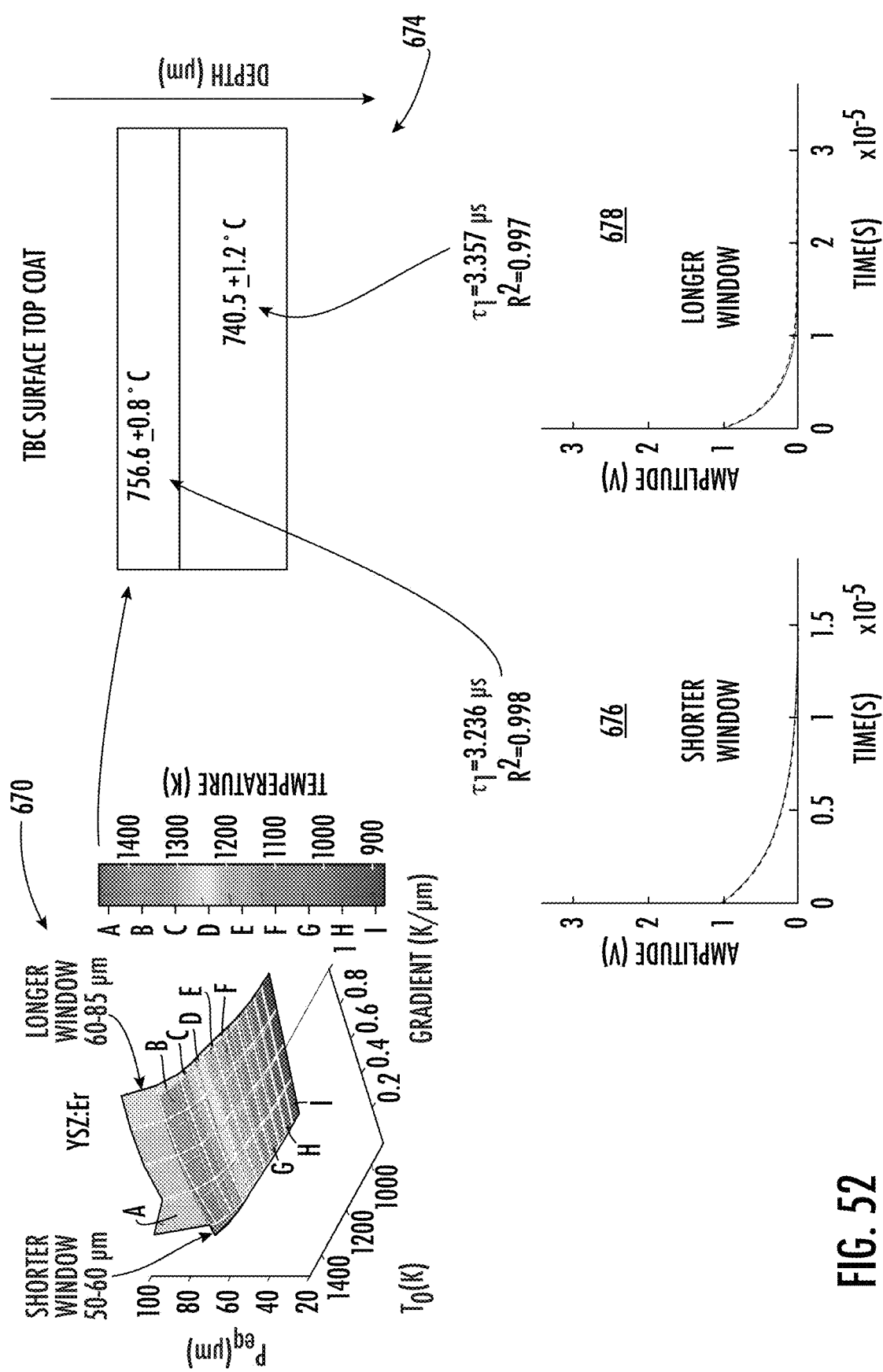
FIG. 52 are composite graphs and a schematic diagram of a thermal barrier configuration showing how the acquisition window changes to retrace the temperature gradient into the into the thermal barrier coating.

Referring now to FIG. 52, there is illustrated a composite drawing of temperature profile at 670, schematic thermal barrier coating at 674, and shorter window and longer window graphs at 676, 678. The drawing shows how the acquisition window changes to retrace temperature gradients into the thermal barrier coating. The model provides two temperature measurement locations as illustrated with the thermal barrier coating surface configuration at 674 showing the depth in micrometers and the temperature differential at those two points. The temperature profile shows the shorter window time period of 50-60 micro minutes and the longer window of 60-85 micro minutes, and the associated gradient and temperature. Two temperature values are provided and the experiment is accomplished with YSZ:Er and the unknown temperature gradient. The graphs 676, 678 at the bottom of FIG. 52 show the respective shorter window in an example of 3.236 microseconds, and the longer window in an example of 3.357 microseconds and the time period in microseconds. The error values shown are based on a 95% confidence boundaries for the data fit. Additional error may be carried by the reference fit.

In a method aspect, the acquisition signal for one laser shot may be decomposed for the different window periods and the software at the controller analyzes the temperature values. It is also possible to use multiple laser shots with each laser shot having a different window for acquisition and measurements.

This application is related to copending patent applications entitled, "RARE-EARTH DOPED THERMAL BARRIER COATING BOND COAT FOR THERMALLY GROWN OXIDE LUMINESCENCE SENSING," and "SYSTEM AND METHOD TO REVEAL TEMPERATURE GRADIENTS ACROSS THERMAL BARRIER COATINGS USING PHOSPHOR THERMOMETRY," which are filed on the same date and by the same Assignee and inventors, the disclosures which are hereby incorporated by reference.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A phosphor thermometry device, comprising:
    a laser that generates a laser pulse onto a thermal barrier coating (TBC) applied onto a substrate, the thermal barrier coating including a metallic bond coat layer on the substrate, and a ceramic top coat layer on the bond coat layer, the ceramic top coat layer including an undoped layer and a doped sensing layer having co-doped first and second rare-earth luminescent dopants that emit respective first and second different emission wavelengths upon excitation by the laser pulse;
    a detector that receives convoluted luminescence signals from the TBC generated from the laser excitation of the first and second rare-earth luminescent dopants in the doped sensing layer, said detector including first and second photomultiplier devices configured to detect respective first and second different emission wavelengths of the convoluted luminescence signals and generate first and second output signals indicative of the respective first and second different emission wavelengths of the convoluted luminescence signals; and
    a controller connected to the detector and configured to receive and process the first and second output signals generated from respective first and second photomultiplier devices, determine from the first and second output signals a luminescence lifetime decay and intensity variations for each of the respective first and second rare-earth luminescent dopants, and correlate the determined luminescence lifetime decay and intensity variations for each of the respective first and second rare-earth luminescent dopants to a temperature value for temperature monitoring of the TBC.

2. The phosphor thermometry device of claim 1, wherein the doped sensing layer of the ceramic top coat layer is formed over the undoped layer of the ceramic top coat layer and comprises an Erbium-Europium, co-doped, Yttria-stabilized Zirconia (YSZ), wherein the Erbium concentration in the YSZ is about 1.25 to 1.75 weight percent and the Europium concentration in the YSZ is about 2.5 to 3.5 weight percent.

3. The phosphor thermometry device of claim 2, wherein the doped sensing layer of the ceramic top coat layer is about 70 to 90 micrometers and the undoped layer of the ceramic top coat layer is about 230 to 270 micrometers.

4. The phosphor thermometry device of claim 2, wherein the first photomultiplier device is configured to detect Erbium spectral lines at about 545 nm and 562 nm and the second photomultiplier device is configured to detect Europium spectral lines at about 590 nm and 606 nm.

5. The phosphor thermometry device of claim 1, comprising a first dichroic filter configured to transmit the laser pulse onto the TBC and reflect the convoluted luminescence signals from the TBC to the detector.

6. The phosphor thermometry device of claim 5, wherein said first dichroic filter comprises a cyan dichroic filter.

7. The phosphor thermometry device of claim 5, comprising a second dichroic filter positioned to receive the convoluted luminescence signals from the first dichroic filter and split the convoluted luminescence signals into two spectral bands corresponding to the respective emission wavelengths of the respective first and second rare-earth luminescent dopants.

8. The phosphor thermometry device of claim 7, wherein said second dichroic filter comprises a magenta dichroic filter.

9. A phosphor thermometry device for temperature monitoring of turbine components, comprising:
    a laser that generates a laser pulse onto a thermal barrier coating (TBC) applied onto a superalloy turbine component substrate, the thermal barrier coating including a metallic bond coat layer on the superalloy turbine component substrate, and a ceramic top coat layer on the bond coat layer, the ceramic top coat layer including an undoped layer and a doped sensing layer having co-doped first and second rare-earth luminescent dopants that emit respective first and second different emission wavelengths upon excitation by the laser pulse;
    a first dichroic filter configured to transmit the laser pulse onto the TBC and reflect convoluted luminescence signals from the TBC generated from the laser excitation of the first and second rare-earth luminescent dopants in the doped sensing layer;
    a second dichroic filter positioned to receive the convoluted luminescence signals from the first dichroic filter and split the convoluted luminescence signals into two spectral bands corresponding to the respective emission wavelengths of the respective first and second rare-earth luminescent dopants;
    a detector that receives the convoluted luminescence signals from the second dichroic filter, said detector including first and second photomultiplier devices configured to detect respective first and second different emission wavelengths of the convoluted luminescence signals from the second dichroic filter and generate first and second output signals indicative of the respective first and second different emission wavelengths of the convoluted luminescence signals; and a controller connected to the detector and configured to receive and process first and second output signals generated from respective first and second photomultiplier devices, determine from the first and second output signals a luminescence lifetime decay and intensity variations for each of the respective first and second rare-earth luminescent dopants, and correlate the determined luminescence lifetime decay and intensity variations for each of the respective first and second rare-earth luminescent dopants to a temperature value for temperature monitoring of the turbine component.

10. The phosphor thermometry device of claim 9, wherein said first dichroic filter comprises a cyan dichroic filter.

11. The phosphor thermometry device of claim 9, wherein said second dichroic filter comprises a magenta dichroic filter.

12. The phosphor thermometry device of claim 9, wherein the doped sensing layer of the ceramic top layer is formed over the undoped layer of the ceramic top coat layer and comprises an Erbium-Europium, co-doped, Yttria-stabilized Zirconia (YSZ), wherein the Erbium concentration in the YSZ is about 1.25 to 1.75 weight percent and the Europium concentration in the YSZ is about 2.5 to 3.5 weight percent.

13. The phosphor thermometry device of claim 12, wherein the doped sensing layer of the ceramic top coat layer is about 70 to 90 micrometers and the undoped layer of the ceramic top coat layer is about 230 to 270 micrometers.

14. The phosphor thermometry device of claim 12, wherein the first photomultiplier device is configured to detect Erbium spectral lines at about 545 nm and 562 nm and the second photomultiplier device is configured to detect Europium spectral lines at about 590 nm and 606 nm.

15. A method of operating a phosphor thermometry device for monitoring a temperature of thermal barrier coatings (TBC), comprising:

generating, from a laser, a laser pulse onto a TBC applied onto a substrate, the thermal barrier coating including a metallic bond coat layer on the substrate, a ceramic top coat layer on the bond coat layer, the ceramic top coat layer including an undoped layer and a doped sensing layer having co-doped first and second rare-earth luminescent dopants that emit respective first and second different emission wavelengths upon excitation by the laser pulse;

receiving, at a detector convoluted luminescence signals from the TBC as generated from the laser excitation of the first and second rare-earth luminescent dopants in the doped sensing layer, the detector including first and second photomultiplier devices configured to detect respective first and second different emission wavelengths of the convoluted luminescence signals and generate first and second output signals indicative of the respective first and second different emission wavelengths of the convoluted luminescence signals;

receiving, at a controller connected to the detector, the first and second output signals generated from the respective first and second photomultiplier devices, processing the first and second output signals to determine a luminescence lifetime decay and intensity variations for each of the respective first and second rare-earth luminescent dopants and correlating the determined luminescence lifetime decay and intensity variations for each of the respective first and second rare-earth luminescent dopants to a temperature value for temperature monitoring of the TBC.

16. The method of claim 15, comprising a first cyan dichroic filter configured to transmit the laser pulse onto the TBC and reflect the convoluted luminescence signals from the TBC to the detector.

17. The method of claim 15, comprising a second magenta dichroic filter positioned to receive the convoluted luminescence signals from the first dichroic filter and split the convoluted luminescence signals into two spectral bands corresponding to the respective emission wavelengths of the respective first and second rare-earth luminescent dopants.

18. The method of claim 15, wherein the doped sensing layer of the ceramic top coat layer is formed over the undoped layer of the ceramic top coat layer and comprises an Erbium-Europium, co-doped, Yttria-stabilized Zirconia (YSZ), wherein the Erbium concentration in the YSZ is about 1.25 to 1.75 weight percent and the Europium concentration in the YSZ is about 2.5 to 3.5 weight percent.

19. The method of claim 18, wherein the doped sensing layer of the ceramic top coat layer is about 70 to 90 micrometers and the undoped layer of the ceramic top coat layer is about 230 to 270 micrometers.

20. The method of claim 18, wherein the first photomultiplier device is configured to detect Erbium spectral lines at about 545 nm and 562 nm and the second photomultiplier device is configured to detect Europium spectral lines at about 590 nm and 606 nm.

\* \* \* \* \*